(12) United States Patent
Tanaka et al.

(10) Patent No.: US 6,480,262 B1
(45) Date of Patent: **\*Nov. 12, 2002**

(54) ILLUMINATION OPTICAL APPARATUS FOR ILLUMINATING A MASK, METHOD OF MANUFACTURING AND USING SAME, AND FIELD STOP USED THEREIN

(75) Inventors: Masashi Tanaka; Kinya Kato; Masaki Kato, all of Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/722,278

(22) Filed: Nov. 28, 2000

Related U.S. Application Data

(62) Division of application No. 09/173,530, filed on Oct. 15, 1998, now Pat. No. 6,351,305, which is a continuation of application No. 08/991,923, filed on Dec. 16, 1997, now abandoned, which is a continuation of application No. 08/453,538, filed on May 30, 1995, now Pat. No. 5,729,331, which is a continuation-in-part of application No. 08/391,944, filed on Feb. 21, 1995, now abandoned, which is a continuation of application No. 08/259,771, filed on Jun. 14, 1994, now abandoned.

(30) Foreign Application Priority Data

| Jun. 30, 1993 | (JP) | ............................................. | 5-161588 |
| Dec. 22, 1993 | (JP) | ............................................. | 5-345619 |
| May 30, 1994 | (JP) | ............................................. | 6-116800 |
| Jun. 6, 1994 | (JP) | ............................................. | 6-123762 |
| Jun. 23, 1994 | (JP) | ............................................. | 6-141326 |
| Jul. 29, 1994 | (JP) | ............................................. | 6-177898 |
| Aug. 25, 1994 | (JP) | ............................................. | 6-200494 |

(51) Int. Cl.$^7$ .................. G03B 27/54; G03B 27/42; G03B 27/32
(52) U.S. Cl. .................. 355/67; 355/53; 355/77; 355/46; 355/54
(58) Field of Search .................. 355/53, 55, 67, 355/77, 71, 46, 54; 356/399, 400, 401; 250/559.3, 548

(56) References Cited

U.S. PATENT DOCUMENTS 2,742,817 A    4/1956   Feldman et al. ............ 359/727

(List continued on next page.)

FOREIGN PATENT DOCUMENTS

EP    2050590    4/1972

(List continued on next page.)

OTHER PUBLICATIONS

Microcircuit Engineering 83, "Fully Automated Alignment for NMOS Device Processing on the M500 Full Field Projection System", F. Zernike et al., pp. 225–234.
SPIE vol. 922 Optical/Laser Microlithography (1988), "The Paths to Subhalf–Micrometer Optical Lithography", Burn J. Lin, pp. 256–269.
U.S. Patent Application No. 08/255,997 filed Jun., 1994, 63 pages specification, 13 sheets of drawings (Figs. 1–15B).

*Primary Examiner*—Russell Adams
*Assistant Examiner*—R. E Fuller
(74) *Attorney, Agent, or Firm*—Oliff & Berridge, PLC

(57) ABSTRACT

An illumination optical apparatus and method forms a plurality of illumination regions on a first object, and positional relationships between the plurality of illumination regions can be adjusted. An exposure apparatus that includes the illumination optical apparatus can, while moving the first object and a second object in a certain moving direction, effect projection exposure of an image of the first object onto the second object. The plurality of illumination regions can have polygon shapes. A field stop used in the illumination optical apparatus can have an aperture portion with first and second regions, the second region corresponding to an overlap region on the first object, wherein a transmittancy of the second region is smaller than a transmittancy of the first region.

67 Claims, 57 Drawing Sheets

U.S. PATENT DOCUMENTS

| | | | |
|---|---|---|---|
| 3,563,648 A | 2/1971 | Baggaley et al. | 355/46 |
| 3,704,945 A | 12/1972 | Denis et al. | 355/40 |
| 3,722,996 A | 3/1973 | Fox | 355/53 |
| 3,796,497 A | 3/1974 | Mathisen et al. | 356/139.07 |
| 3,819,265 A | 6/1974 | Feldman et al. | 355/51 |
| 3,910,684 A | 10/1975 | Glatzel | 359/727 |
| 4,068,947 A | 1/1978 | Buckley et al. | 355/72 |
| 4,103,989 A | 8/1978 | Rosin | 359/730 |
| 4,190,347 A | 2/1980 | Siegmund | 355/1 |
| 4,391,494 A | 7/1983 | Hershel | 359/727 |
| 4,425,037 A | 1/1984 | Hershel et al. | 355/43 |
| 4,469,414 A | 9/1984 | Shafer | 359/365 |
| 4,512,641 A | 4/1985 | Mochizuki et al. | 359/362 |
| 4,653,903 A | 3/1987 | Torigoe et al. | 355/53 |
| 4,681,414 A | 7/1987 | Hershel | 353/102 |
| 4,696,889 A | 9/1987 | Yevick | 430/311 |
| 4,701,608 A | 10/1987 | Morita et al. | 250/205 |
| 4,769,680 A | 9/1988 | Resor, III et al. | 355/43 |
| 4,776,683 A | 10/1988 | Maeda et al. | 359/503 |
| 4,780,606 A | 10/1988 | Morita et al. | 250/205 |
| 4,814,830 A | 3/1989 | Isohata et al. | 355/54 |
| 4,822,975 A | 4/1989 | Torigoe | 219/121.85 |
| 4,844,568 A | 7/1989 | Suzuki et al. | 359/210 |
| 4,924,257 A | 5/1990 | Jain | 355/53 |
| RE33,836 E | 3/1992 | Resor, III et al. | 355/43 |
| 5,159,172 A | 10/1992 | Goodman et al. | 219/121.68 |
| 5,194,893 A | 3/1993 | Nishi | 355/53 |
| 5,285,236 A | 2/1994 | Jain | 355/53 |
| 5,291,240 A | 3/1994 | Jain | 355/53 |
| 5,298,939 A | 3/1994 | Swanson et al. | 355/53 |
| 5,302,999 A | 4/1994 | Oshida et al. | 355/1 |
| 5,401,934 A | 3/1995 | Ainsworth, Jr. et al. | 219/121.8 |
| 5,406,351 A | 4/1995 | Sardella et al. | 355/53 |
| 5,486,896 A | 1/1996 | Hazama et al. | 355/71 |
| 5,579,147 A | 11/1996 | Mori et al. | 359/204 |
| 5,581,075 A | 12/1996 | Naraki et al. | 250/205 |
| 5,602,620 A | 2/1997 | Miyazaki et al. | 355/53 |
| 5,608,575 A | 3/1997 | Suzuki | 359/558 |
| 5,614,988 A | 3/1997 | Kato et al. | 355/46 |
| 5,617,181 A | 4/1997 | Yanagihara et al. | 355/46 |
| 5,617,211 A | 4/1997 | Nara et al. | 356/401 |
| 5,623,343 A | 4/1997 | Nara et al. | 356/399 |
| 5,625,436 A | 4/1997 | Yanagihara et al. | 355/53 |
| 5,640,284 A | 6/1997 | Tanitsu et al. | 359/869 |
| 5,661,837 A | 8/1997 | Yamamoto et al. | 385/115 |
| 5,668,624 A | 9/1997 | Naraki et a. | 355/53 |
| 5,757,470 A | 5/1998 | Dewa et al. | 355/67 |
| 2001/0012101 A1 | 8/2001 | Mulkens | 355/67 |

FOREIGN PATENT DOCUMENTS

| | | |
|---|---|---|
| JP | 49-35453 | 9/1974 |
| JP | 57-154218 A | 9/1982 |
| JP | 57-154219 A | 9/1982 |
| JP | A-59-923 | 1/1984 |
| JP | 60-78454 | 5/1985 |
| JP | A-60-109228 | 6/1985 |
| JP | A-4-204946 | 7/1992 |
| JP | 4-250455 | 9/1992 |
| JP | 4-251812 | 9/1992 |
| JP | 5-249379 | 9/1993 |
| JP | 6-29189 A | 2/1994 |
| JP | 6-29190 A | 2/1994 |
| JP | 6-53113 | 2/1994 |
| JP | 6-118341 | 4/1994 |
| JP | 6-331932 | 12/1994 |

Fig.19
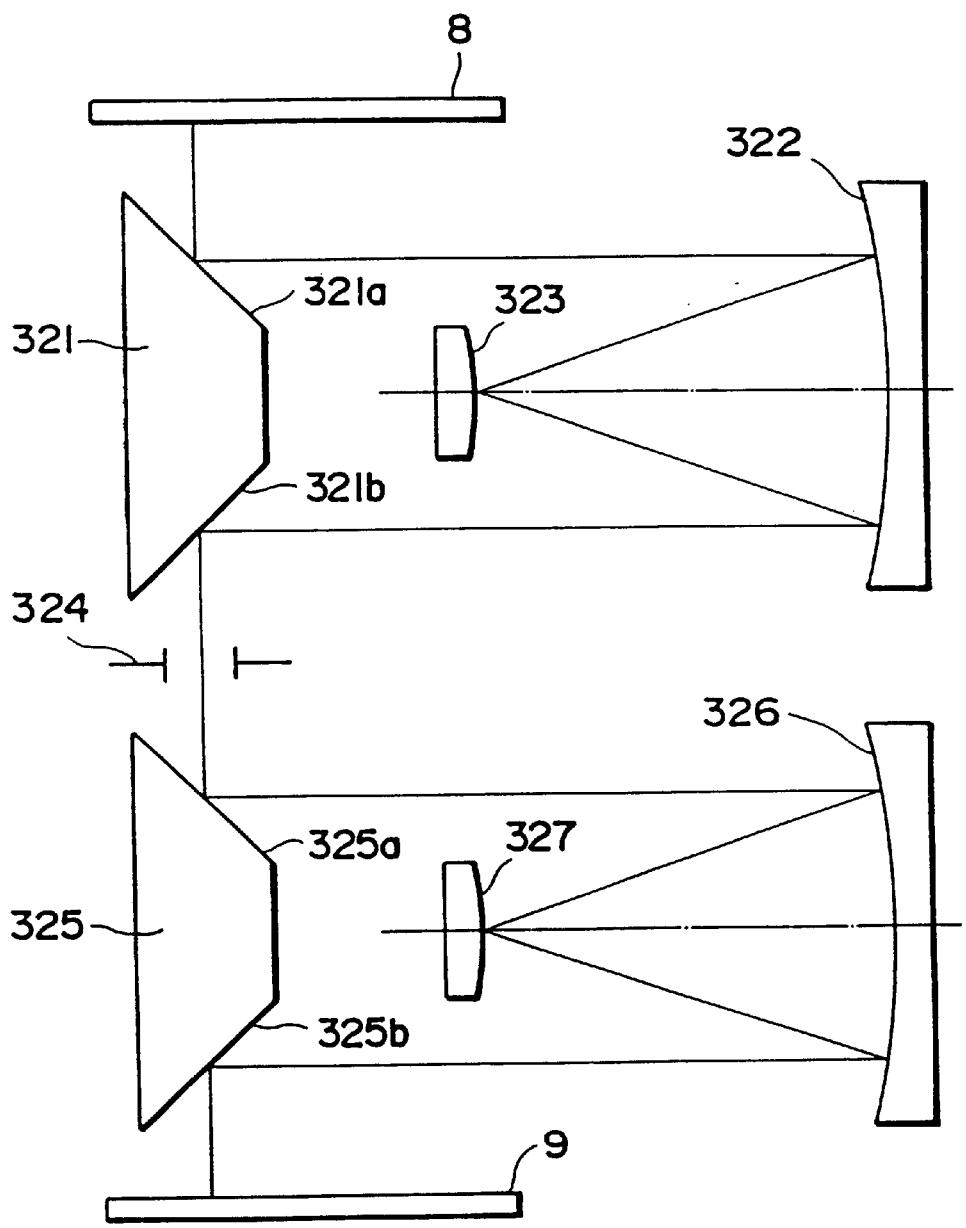
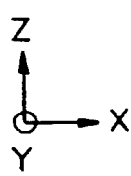

Fig. 31
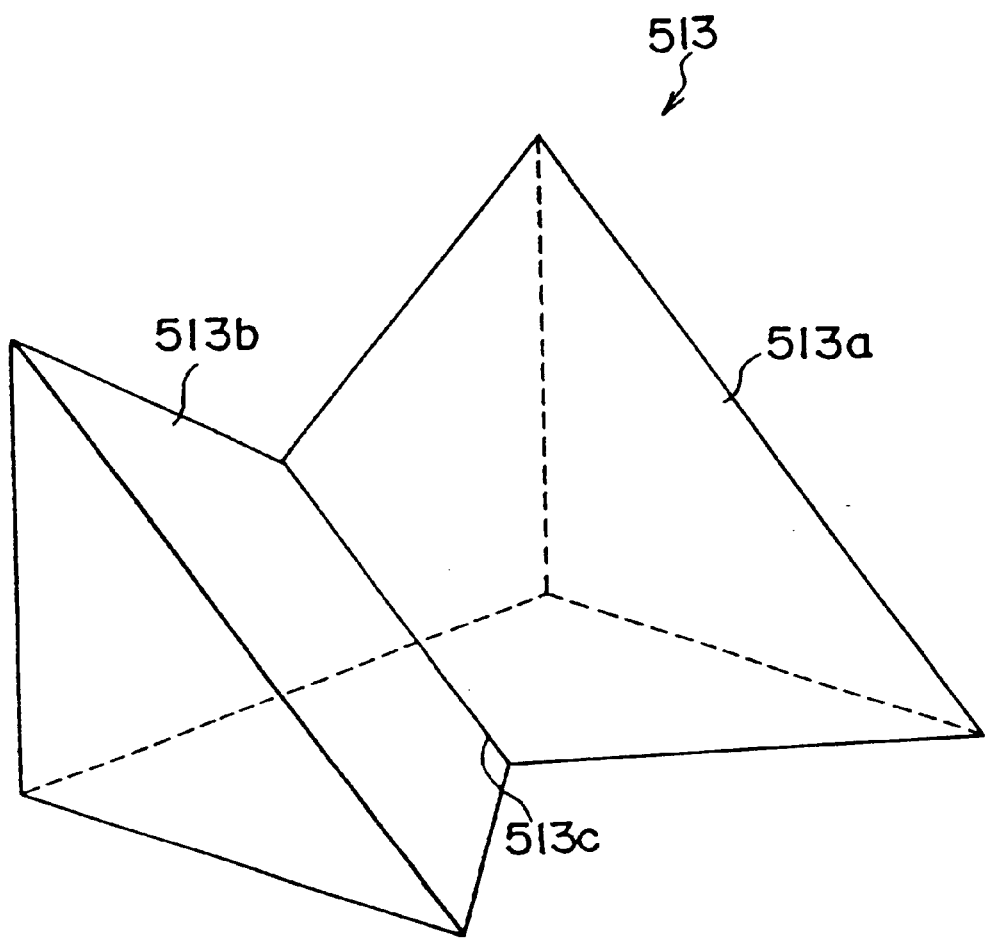
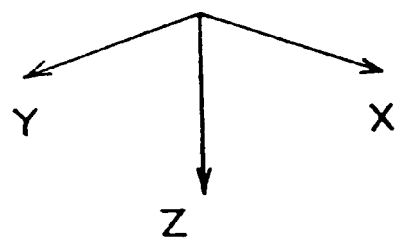

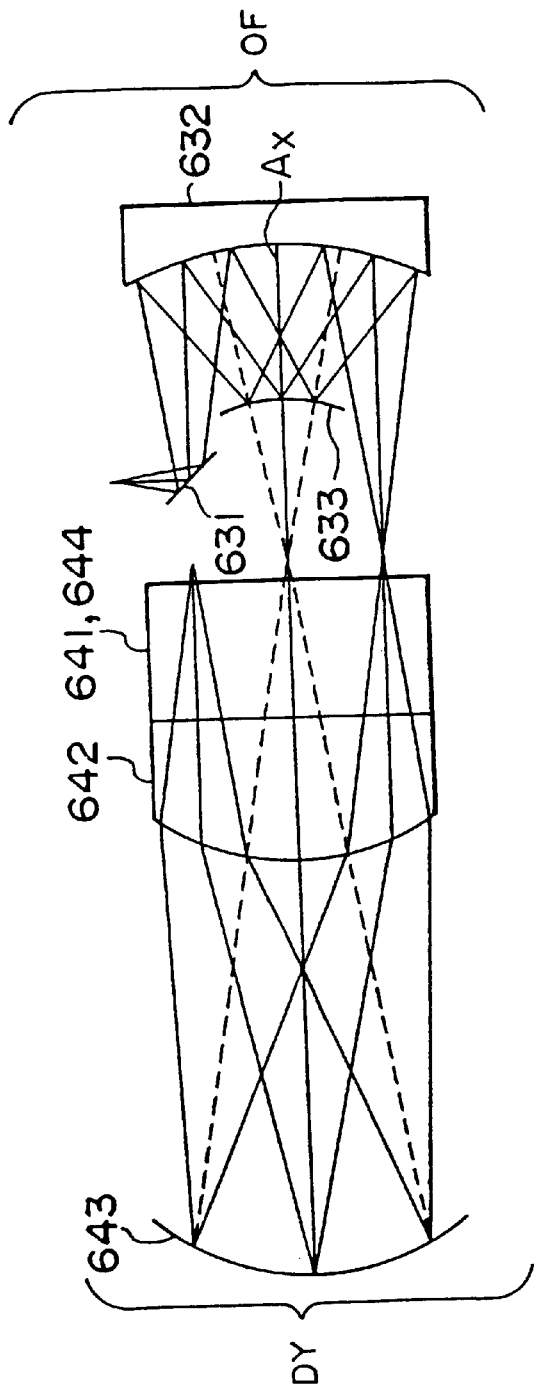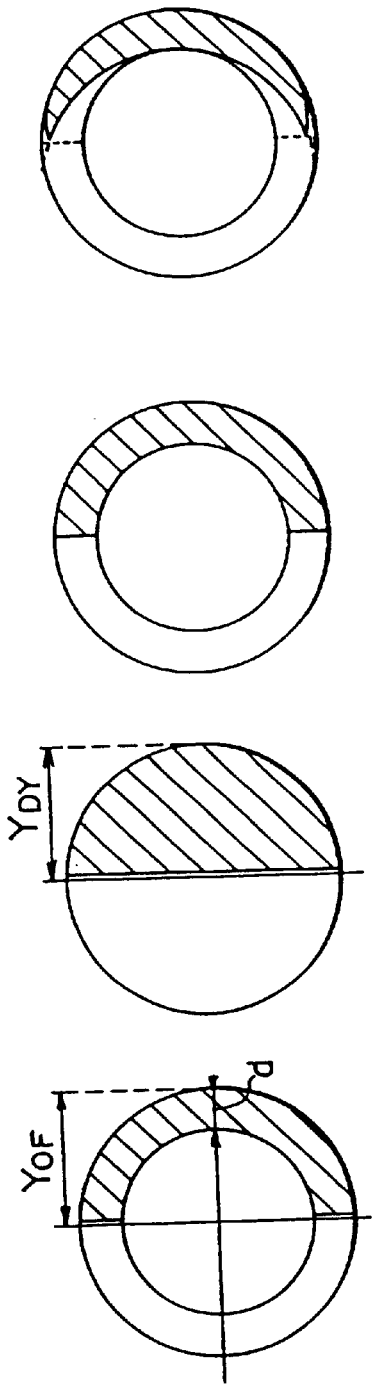

Fig. 36
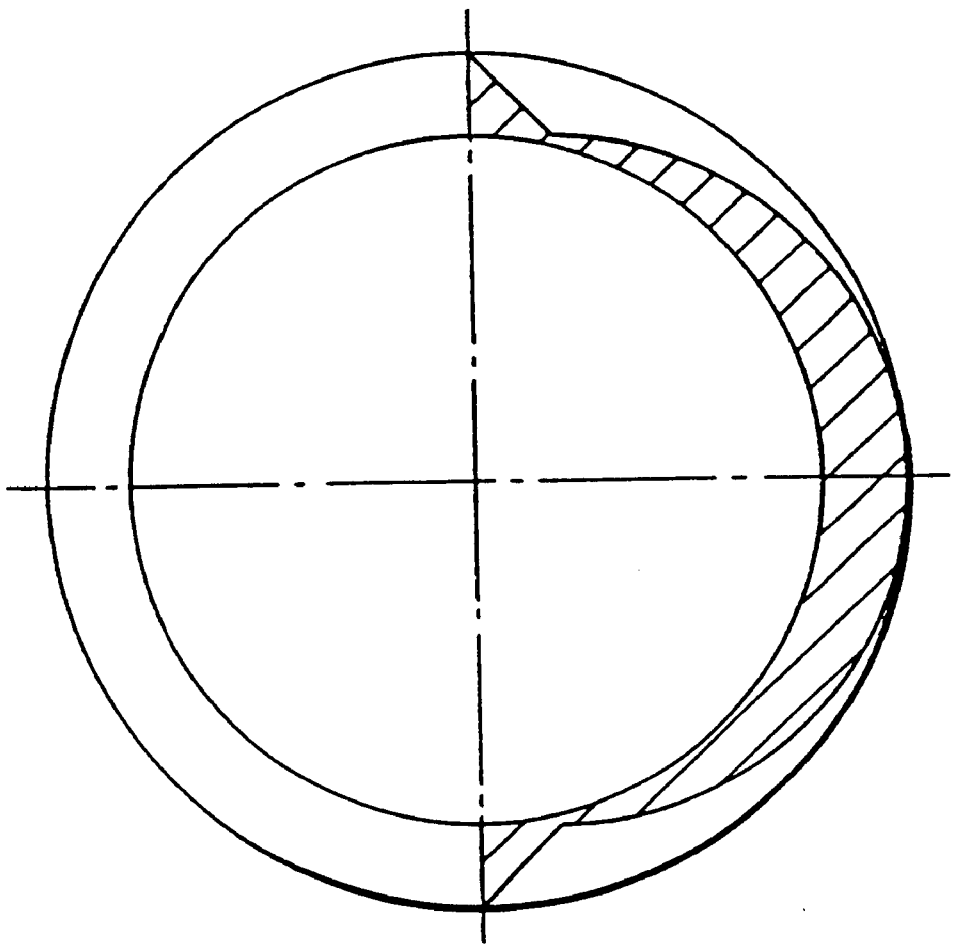
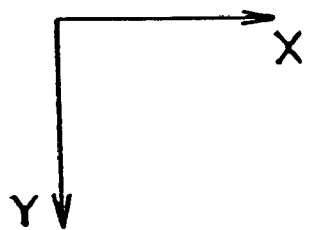

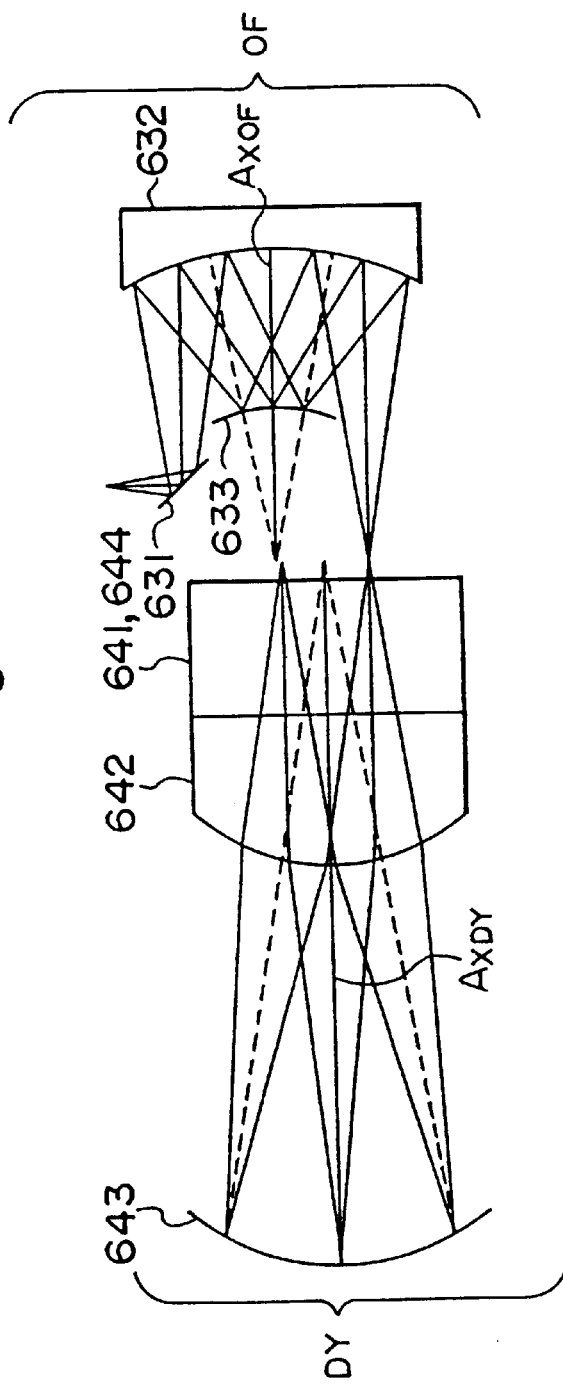
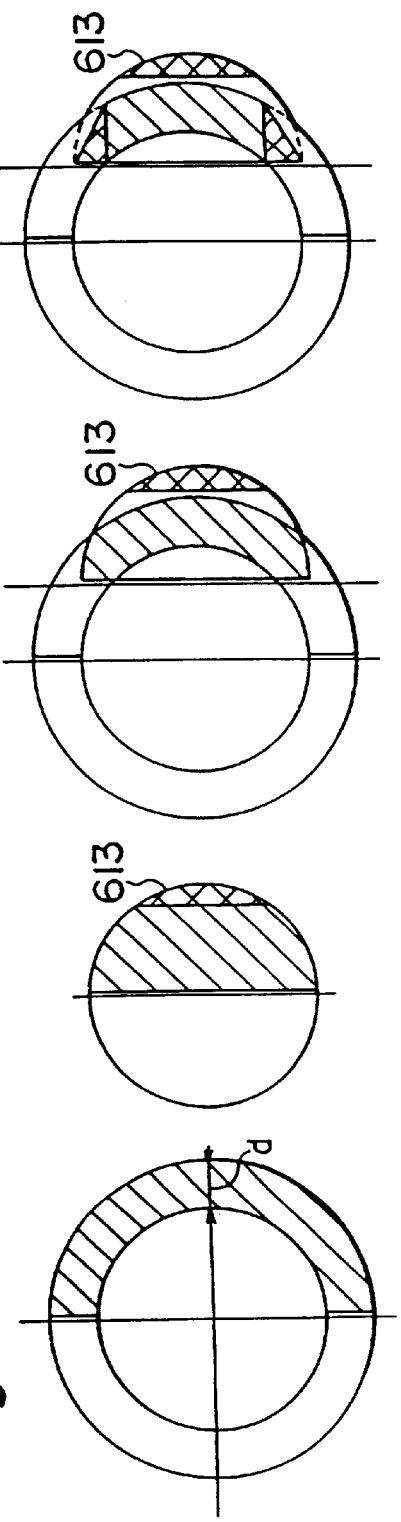

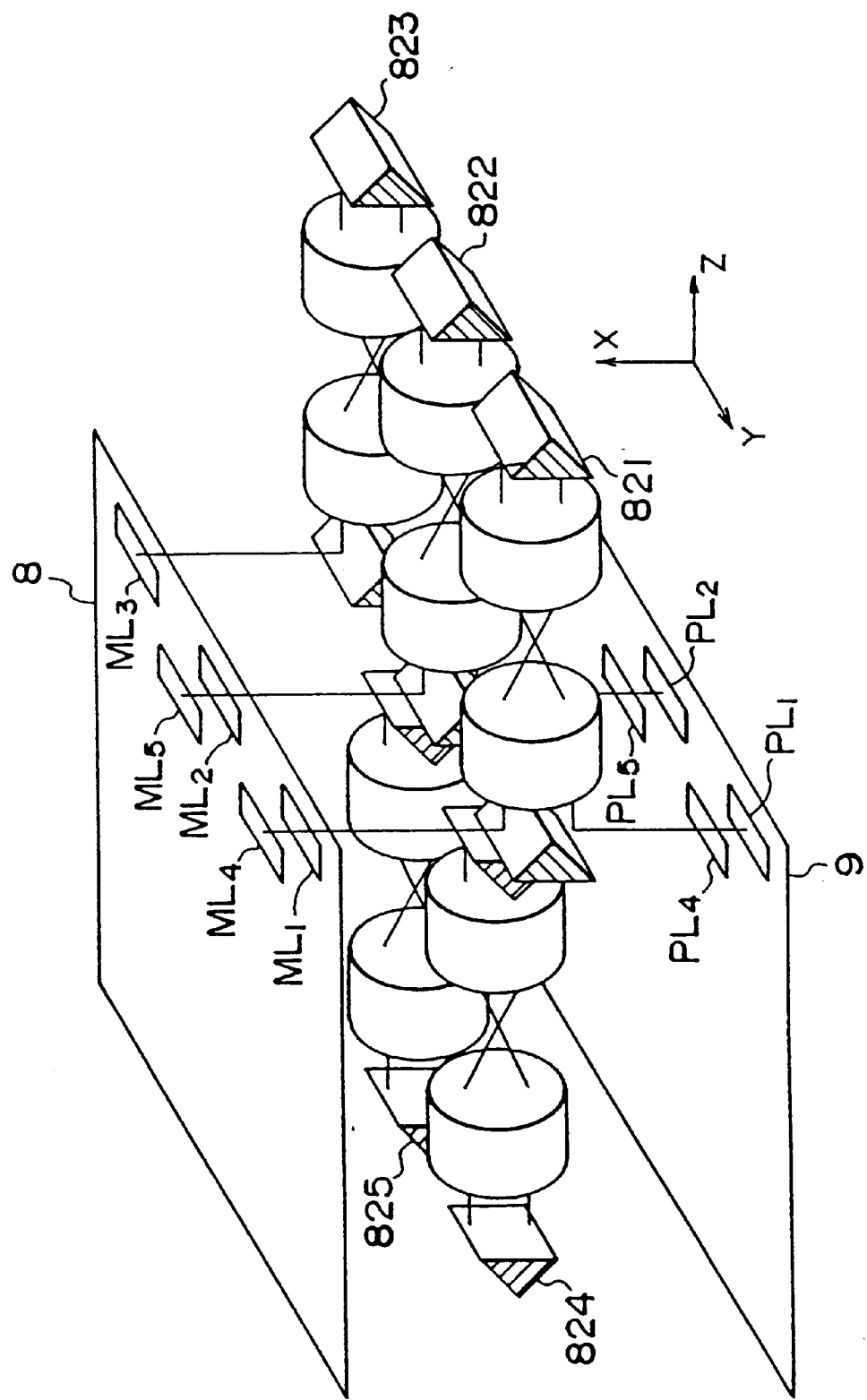

ILLUMINATION OPTICAL APPARATUS FOR ILLUMINATING A MASK, METHOD OF MANUFACTURING AND USING SAME, AND FIELD STOP USED THEREIN

RELATED APPLICATIONS

This is a Division of Application Ser. No. 09/173,530 filed Oct. 15, 1998, now U.S. Pat. No. 6,351,305, which in turn is a Cotinuation of Application Ser. No. 08/991,923 filed Dec. 16, 1997, now abandoned, which in turn is a Continuation of Application Ser. No. 08/453,538 filed May 30, 1995 (now U.S. Pat. No. 5,729,331), which in turn is a Continuation-in-Part of Application Ser. No. 08/391,944 filed Feb. 21, 1995, now abandoned, which in turn is a Continuation of Application Ser. No. 08/259,771 filed Jun. 14, 1994, now abandoned. The entire disclosure of the prior application(s) is hereby incorporated by reference herein in its entirety.

BACKGROUND OF THE INVENTION

1. Field of the Invention

The present invention relates to an exposure apparatus, and more particularly to a scanning projection exposure apparatus which performs exposure while moving a first object and a second object.

2. Related Background Art

Liquid crystal display panels are frequently used these days as a display device for word processors, personal computers, televisions, etc. A liquid crystal display panel is fabricated by patterning of transparent thin-film electrodes in a desired shape on a glass substrate by the photolithography technique. As an apparatus for the lithography a mirror projection type aligner is used for exposure-printing an original pattern formed on a mask onto a photoresist layer on a glass substrate through a projection optical system.

FIG. 1 and FIG. 2 are drawings to show the structure of a conventional mirror projection type aligner. FIG. 1 is a perspective view to show the overall structure of the aligner and FIG. 2 is a lens cross-sectional view to show the structure of a projection optical system in the aligner.

In FIG. 1, an illumination optical system not shown illuminates a mask 71c in an arcuate illumination field 72a. An optical path of light from the illumination field 72a is deflected 90° by a first reflecting surface 73a of a trapezoid mirror 73, as shown in FIG. 2, and the thus deflected light advances via a concave mirror 74 and a convex mirror 75 and then is reflected again by the concave mirror 74. The optical oath of the light reflected by the concave mirror 74 is deflected 90° by a second reflecting surface 73b of the trapezoid mirror. Then an image of the mask 71c or an image 72b of the illumination field 72a is formed on a plate 76.

The aligner as shown performs the so-called scanning exposure while moving the plate 76 and the mask 71c in the X direction in the drawings, whereby a circuit pattern on the mask 71c is transferred onto a selected region on the plate 76.

There is a recent demand to increase the size of liquid crystal display panels. With such a demand to increase the size, the above-described aligner is also desired to enlarge the exposure area.

In order to meet the demand to enlarge the exposure area, the conventional exposure apparatus as described above employed a method of exposure with exposure area as divided into pieces. Specifically, as shown in FIG. 1, an exposure area on the plate 76 is divided into four regions of 76a to 76d, and with scanning exposure of mask 71a and region 76a a circuit pattern of mask 71a is transferred onto the region 76a. In the next place, the mask 71a is exchanged for another mask 71b and the plate 76 is moved stepwise in the XY plane in FIG. 1 before a region 76b comes to coincide with the exposure area of the projection optical system. With scanning exposure of mask 71b and region 76b, a circuit pattern of mask 71b is then transferred onto the region 76b. After that, the same step is repeated for masks 71c and 71d and regions 76c and 76d, whereby circuit patterns of masks 71c and 71d are transferred onto corresponding regions 76c and 76d.

In such exposure with divided exposure area, the multiple scanning exposure steps must be taken for a single exposure area, which decreases the throughput (an exposed substrate amount per unit time). Further, in case of the partition exposure, there are seams or stitches between two adjacent exposure regions and, therefore, the stitching accuracy must be enhanced. Because of this requirement, the method had such disadvantages that the magnification error of projection optical system must be decreased as close to 0 as possible, that the alignment accuracy must be greatly improved, and that the production cost of the apparatus is increased.

On the other hand, it can be conceivable that the scale of projection optical system is increased for full scanning exposure of a single large exposure area instead of the partition exposure. In order to increase the scale of projection optical system, however, large-scale optical elements must be produced with very high accuracy, which results in increasing the production cost and the size of apparatus. Also, there was a disadvantage that the size increase of projection optical system caused an increase in aberrations or a decrease in imaging performance.

SUMMARY OF THE INVENTION

The present invention has been accomplished taking the above problems into consideration and an object of the present invention is to provide an exposure apparatus which can realize full scanning exposure of a large exposure area with excellent imaging performance and without lowering the throughput.

The above object and other objects will be further apparent form the following description.

Provided according to the present invention is an exposure apparatus for, while moving a first object and a second object in a certain moving direction, effecting projection exposure or an image of said first object onto said second object, comprising a first projection optical system for forming a real-size erect image of said first object on said second object, which is telecentric at least on an image side, a second projection optical system for forming a real-size erect image of said first object on said second object, which is telecentric at least on the image side and which is disposed next to said first projection optical system, a first field stop for limiting an exposure region to be formed on said second object by said first projection optical system, within a certain shape, and a second field stop for limiting an exposure region to be formed on said second object by said second projection optical system, within a certain shape, wherein a sum of a length along said moving direction, of the first exposure region limited by said first field stop and a length along said moving direction, of the second exposure region limited by said second field stop is constant over a direction perpendicular to said moving direction.

In the present invention, a scanning exposure apparatus performs such projection exposure that a real-size erect image (which is an image with positive horizontal and vertical lateral magnifications) of a circuit pattern formed on a mask as a first object is transferred through a plurality of projection optical systems onto a plate as a second object. A plurality of exposure regions formed on the plate through the respective projection optical systems are so arranged that a sum of lengths along the scanning direction is constant over the direction perpendicular to the scanning direction, that is, that an amount of exposure light becomes constant over the entire surface of plate.

Since the plurality of projection optical systems are so arranged that the sum of widths of exposure regions along the scanning direction is constant over the direction perpendicular to the scanning direction, single scan exposure can achieve a large exposure area on the whole even with compact projection optical systems and small exposure regions formed thereby.

Also, since each projection optical system is compact, scanning exposure can be made while minimizing occurrence of aberrations and keeping excellent imaging performance.

In case that each projection optical system is composed of two partial optical systems and that each exposure region formed on the plate is defined by the shape of an aperture in a field stop located at a position where an intermediate image of mask pattern is formed through a first partial optical system, a preferable arrangement is such that edges of the aperture are triangular and overlap with triangular edges of adjacent apertures in the scanning direction.

In case that the partial optical systems are Dyson optical systems, the center portion of each aperture excluding the both edges thereof is preferably defined by two straight lines. In case that the partial optical systems are Offner optical systems, the center portion is preferably defined by two arcs or by two polygonal lines.

It is further object of the present invention to provide an exposure apparatus for, while moving a first object and a second object in a certain moving direction, effecting projection exposure of an image of the first object onto the second object, comprising:

a first projection optical system for forming a real-size erect image of the first object on the second object, which is both-side telecentric; and a second projection optical system for forming a real-size erect image of the first object on the second object, which is both-side telecentric and which is disposed next to the first projection optical system;

wherein each of the first and second projection optical systems has a refractive optical system of a positive refractive power and a plane reflective surface for reflecting light from the refractive optical system back to the refractive optical system.

It is further object of the present invention to provide an exposure apparatus for, while moving a first object and a second object in a certain moving direction, effecting projection exposure of an image of the first object onto the second object, comprising:

a first projection optical system for forming an erect image of the first object on the second object; and a second projection optical system for forming an erect image of the first object on the second object, which is disposed next to the first projection optical system;

wherein each of the first and second projection optical systems has:

a first image-forming optical system arranged so that one of two conjugate points is located on the first object; and a second image-forming optical system arranged so that one of two conjugate points is coincident with the other conjugate point of the first image-forming optical system and so that the other of the two conjugate points is located on the second object;

wherein either one of the first image-forming optical system and second image-forming optical system is an Offner optical system having a concave reflective mirror and a convex reflective mirror and arranged to guide light from one conjugate point to the other conjugate point while reflecting the light by the concave reflective mirror, the convex reflective mirror, and the concave reflective mirror in the named order; and wherein the other of the first and second image-forming optical systems is a Dyson optical system having first and second reflective prisms, a lens group of a positive refractive power, and a concave reflective mirror with a concave surface to the lens group and arranged to guide light from one conjugate point to the other conjugate point via the first reflective prism, the lens group, the concave reflective mirror, the lens group, and the second reflective prism in the named order.

It is further object of the present invention to provide a projection optical system for forming an image of a first object on a second object, a projection optical apparatus comprising:

an optical system having an optical axis and at least one reflective surface coaxial with the optical axis;

first light splitting means disposed in an optical path between the optical system and the first object; and second light splitting means disposed in an optical path between the optical system and the second object;

wherein a light beam passing the second light splitting means is transferred along a direction traversing the optical axis to be guided to the first light splitting means.

It is further object of the present invention to provide an exposure apparatus for, while moving a first object and a second object in a certain moving direction, effecting projection exposure of an image of the first object onto the second object, comprising:

a first reflective surface for deflecting light coming from the first object;

an image-forming optical system for forming an intermediate image of the first object, based on light coming from the first reflective surface;

a beam transferring member for transferring the light of from the first reflective surface and then through the image-forming optical system, along a direction traversing an optical axis of the image-forming optical system to guide the thus transferred light again to the image-forming optical system; and a second reflective surface for deflecting the light of from the beam transferring member and then through the image-forming optical system, to the second object.

It is further object of the present invention to provide an exposure apparatus for, while moving a first object and a second object in a certain moving direction, effecting projection exposure of an image of the first object onto the second object, comprising:

a first projection optical system for forming an erect image of the first object on the second object; and a second projection optical system for forming an erect image of the first object on the second object, which is disposed next to the first projection optical system;

wherein each of the first and second projection optical systems comprises:
- a first reflective surface for deflecting light from the first object;
- an image-forming optical system having an optical axis and two conjugate points, the image-forming optical system being disposed so that the first reflective surface is positioned on a side of one conjugate point out of the two conjugate points, and the image-forming optical system being for forming an intermediate image of the first object, based on light coming from the first reflective surface;
- a beam transferring member for transferring the light of from the first reflective surface and then through the image-forming optical system, along a direction traversing the optical axis of the image-forming optical system to guide the thus transferred light again to the image-forming optical system; and
- a second reflective surface for deflecting the light of from the beam transferring member and then through the image-forming optical system, to the second object.

It is further object of the present invention to provide a projection optical apparatus comprising:
- an image-forming optical system having an optical axis and two conjugate points;
- a field splitting member disposed on a side of one conjugate point of the projection optical system, for splitting a field of the projection optical system; and
- a beam transferring member disposed on a side of the other conjugate point of the projection optical system, for transferring light passing via the field splitting member and the projection optical system in the named order, along a direction traversing the optical axis of the projection optical system.

It is further object of the present invention to provide an exposure apparatus for, while moving a first object and a second object in a certain moving direction, illuminating the first object by an illumination optical system and effecting projection exposure of an image of the first object onto the second object by a projection optical system a position of which is fixed relative to the illumination optical system:
wherein the illumination optical system comprises:
- a first illumination optical system for forming a first illumination region on the first object; and
- a second illumination optical system for forming a second illumination region different from the first illumination region on the first object;

wherein the projection optical system comprises:
- a first projection optical system for forming an erect image of the first object illuminated by the first illumination optical system on the second object; and
- a second projection optical system for forming an erect image of the first object illuminated by the second illumination optical system on the second object;
- wherein the first illumination optical system comprises first illumination region moving means for moving the first illumination region on the first object relative to the first projection optical system; and
- wherein the second illumination optical system comprises second illumination region moving means for moving the second illumination region on the first object relative to the second projection optical system.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 19 is a side partial cross-sectional view of a projection optical system applied to the exposure apparatus in the second embodiment of FIG. 18;

FIG. 31 is a pespective view of a reflective member 513 used in the fifth embodiment of the projection optical system;

FIGS. 35A to 35E are drawings for explanation of a field of the sixth embodiment of the projection optical system;

FIG. 36 is a drawing to show the planar positional relationship between the exposure regions and fields in the sixth embodiment of the projection optical system;

FIGS. 38A to 38E are drawings for explanation of the field in the sixth embodiment and the modification thereof the projection optical system;

FIG. 44 is a side cross-sectional view to show the structure of the fourth modification of the seventh embodiment of the projection optical systema;a;

FIG. 45 is a side cross-sectional view to show the structure of the fifth modification of the seventh embodiment of the projection optical systema;a;

FIG. 51 is a perspective view to show an another exposure apparatus in which the projection optical system of the eighth embodiment is incorporated;

DESCRIPTION OF THE PREFERRED EMBODIMENTS

Figure 1:
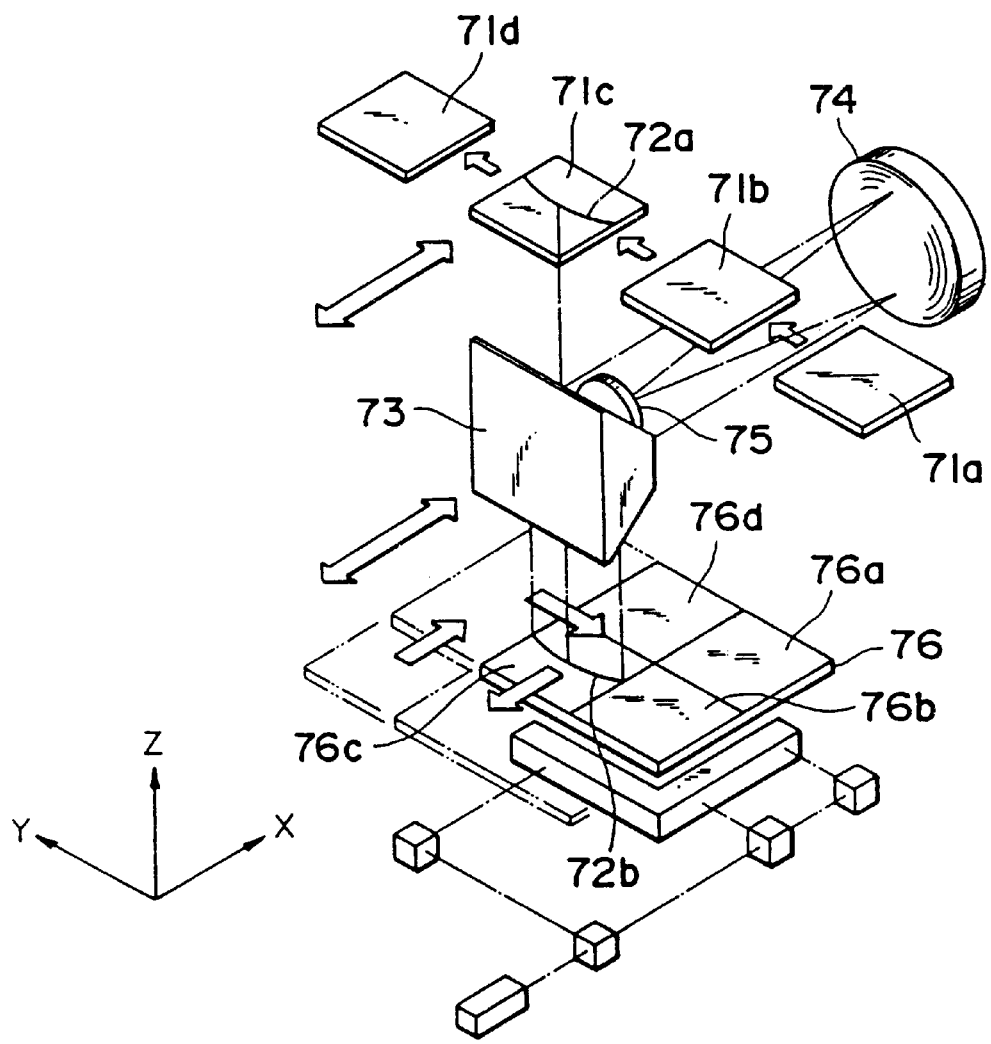
FIG. 1 is a perspective view to show the overall structure of a conventional mirror projection type. aligner.
Figure 2:
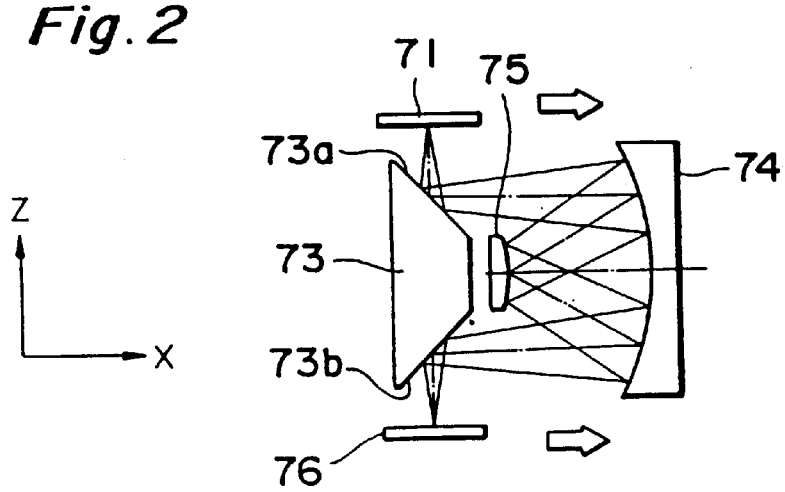
FIG. 2 is a side view to show the structure of a projection optical system in the conventional mirror projection type aligner.
Figure 3:
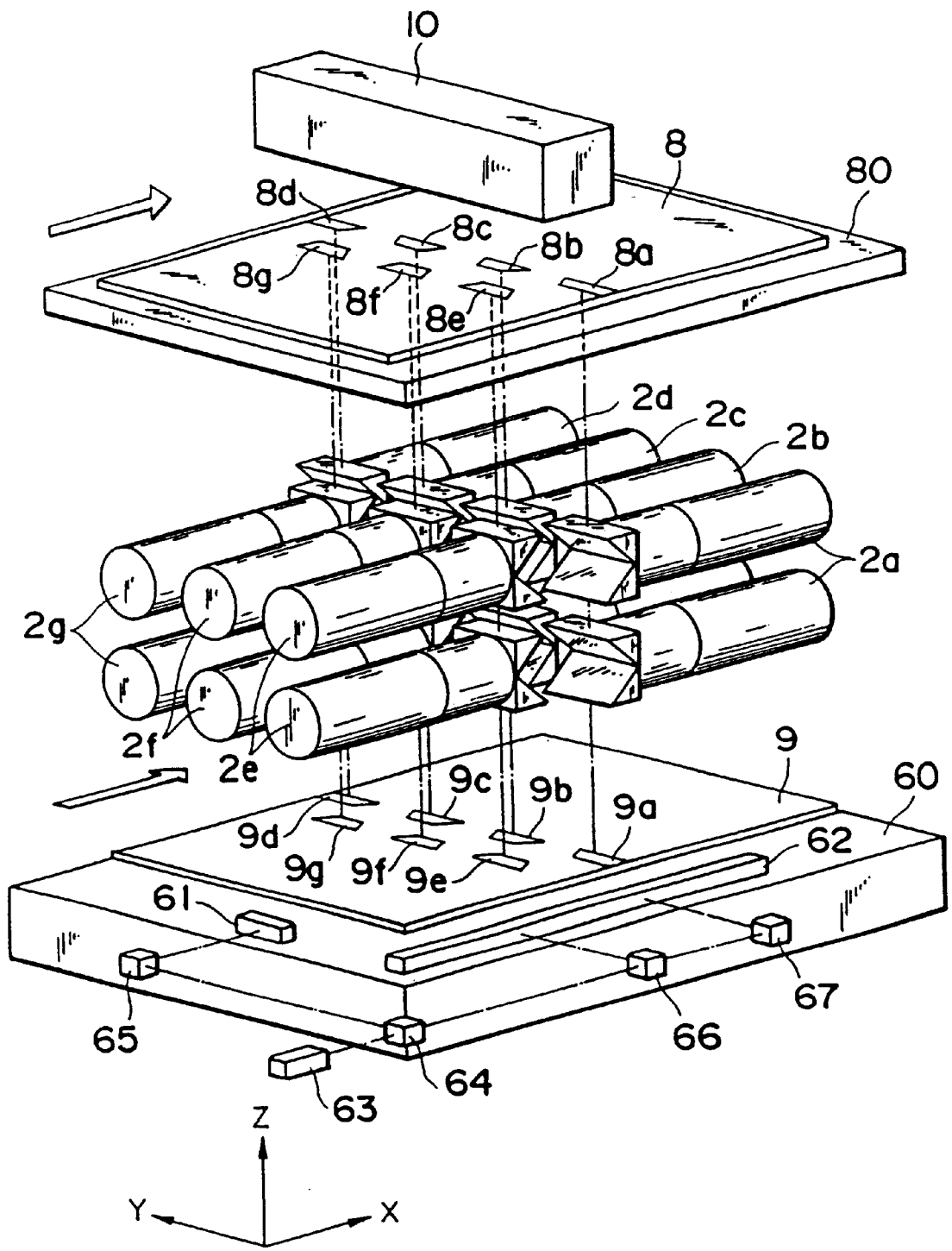
FIG. 3 is a perspective view to show the overall structure of an exposure apparatus in an embodiment of the present invention.

Embodiments according to the present invention will be described with reference to the drawings. FIG. 3 is a perspective view of an exposure apparatus according to the present invention. FIG. 3 employs a coordinate system in which the X axis is taken in the direction (scanning direction) of conveyance of a mask 8 which is provided with a predetermined circuit pattern and a plate 9 in which a coating of resist is given on a glass substrate, the Y axis in the direction perpendicular to the X direction in a plane of mask 8, and the Z axis in the direction normal to the mask 8.

Figure 4:
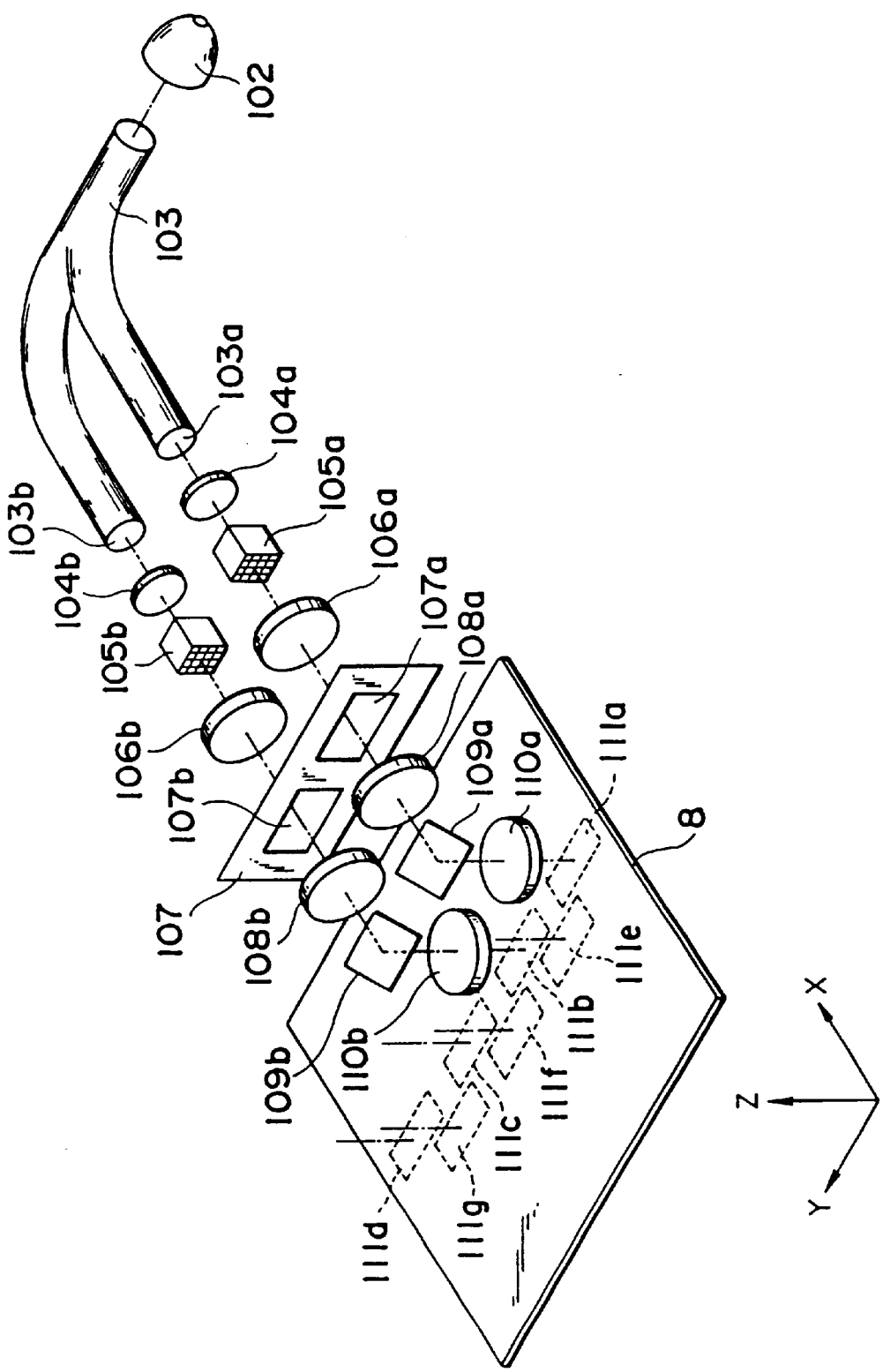
FIG. 4 is a perspective view to show an example of an illumination optical system applied to the exposure apparatus of the present invention.

In FIG. 3, exposure light from an illumination optical system 10 uniformly illuminates the mask 8 in the XY plane in the drawing. A suitable illumination optical system 10 is for example one having the structure as shown in FIG. 4. FIG. 4 is a drawing to show an example of specific structure of illumination optical system 10 shown in FIG. 3. In FIG. 4, there is a light source, for example a mercury lamp supplying exposure light of the q line (435 nm) or the i line (365 nm), inside an elliptic mirror 102, and exposure light from the light source is collected by the elliptic mirror 102 to form an image of the light source on an entrance end of light guide 103. The light guide 103 forms secondary light source planes with uniform optical intensity distribution at its exit ends 103a, 103b. The uniform optical intensity distribution can be obtained by constructing the light guide 103 of optical fibers as bundled at random.

Beams outgoing from the light guide 103 pass through respective relay lenses 104a, 104b to reach fly's eye lenses 105a, 105b. A plurality of secondary light sources are formed on the exit planes of fly's eye lenses 105a, 105b. Light from the plural secondary light sources passes through condenser lenses 106a, 106b with the front focus thereof located at the secondary-light-sources-formed position then to uniformly illuminate a field stop 107 having rectangular apertures 107a, 107b. The exposure light beams passing through the field stop 107 pass through respective lenses 108a, 108b and then are deflected 90° in optical path thereof by mirrors 109a, 109b to reach lenses 110a, 110b. Here, the lenses 108a, 110a and the lenses 108b, 110b are a relay optical system for making the field stop 107 conjugate with the mask 8, so that the exposure light passing through the lenses 110a, 110b forms illumination regions 111a, 111b as images of the apertures 107a, 107b in the field stop 107.

It should be noted that the shape of the apertures 107a, 107b in the field stop 107 is not limited to the rectangle. It is preferred that the shape of the illumination regions is as similar to the shape of field of projection optical systems as possible.

FIG. 4 shows only optical axes of illumination optical systems for forming illumination regions 111c–111g for brevity of illustration. Although not shown in FIG. 4, exit ends of light guide 103 are set corresponding to the number of illumination regions and exposure light from the exit ends of unrepresented light guides 103 is supplied to these illumination regions 111c–111g.

Figure 5:
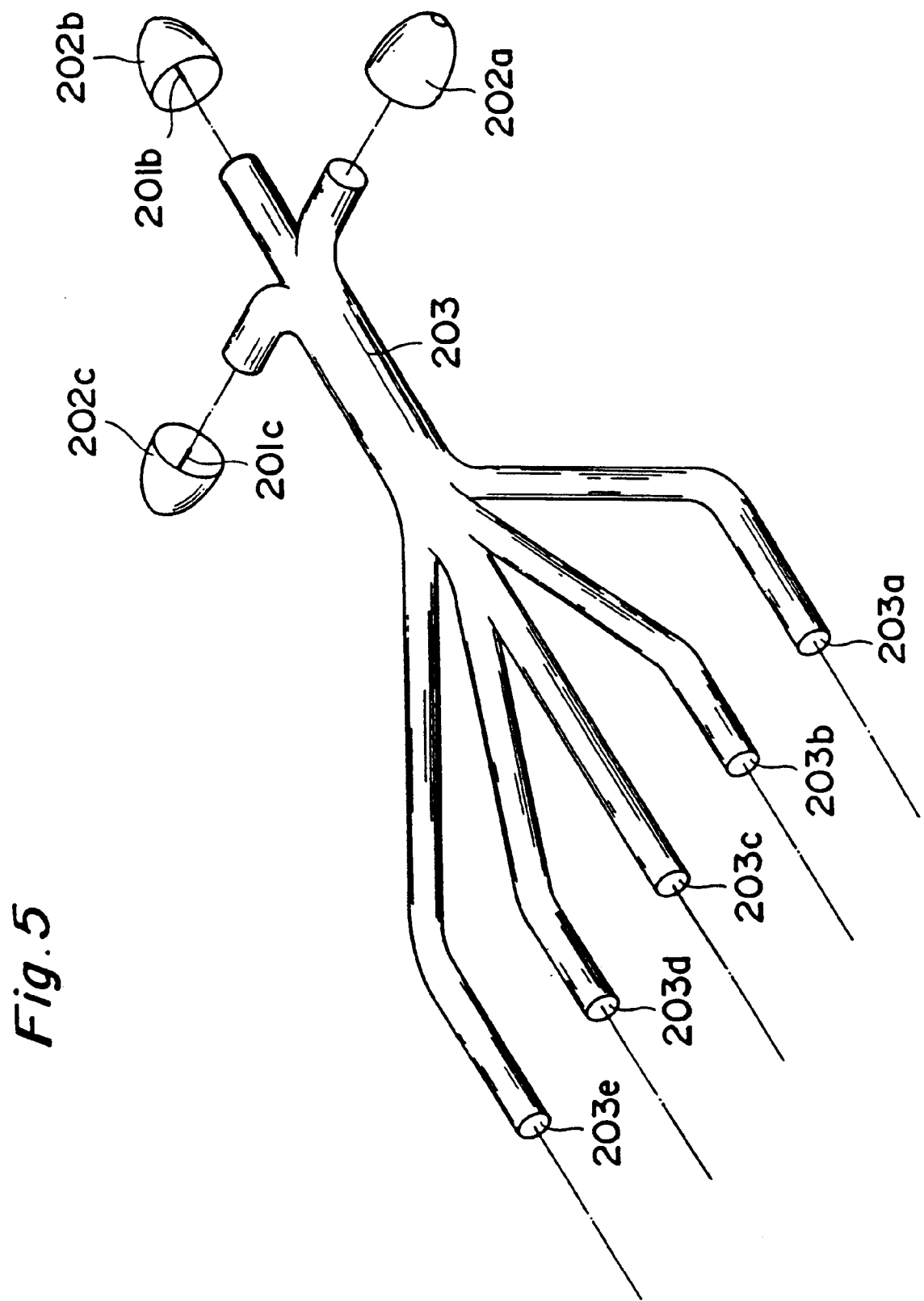
FIG. 5 is a perspective view to schematically show another example of illumination optical system.

If a light source is insufficient in respect of a light quantity in the case as shown in FIG. 4, the arrangement as shown in FIG. 5 may be applied. FIG. 5 is a drawing to diagrammatically show the main part of a modification of illumination optical system, in which exposure light from light sources 201a–201c such as mercury lamps is collected-by elliptic mirrors 202a–202c to form light source images. A light guide 203 is located with its entrance ends at the light-sources-image-formed positions, and exposure light passing through the light guide 203 forms secondary light source surfaces with a uniform optical intensity distribution at a plurality of exit ends 203a–203e. This light guide 203 is also constructed of optical fibers as bundled at random, similarly as the light guide 103 in FIG. 4. The optical paths ranging from the exit ends 203a–203e to the mask 8 are the same as those in the illumination optical system shown in FIG. 4, and therefore are omitted to explain herein. The above arrangement obtains a necessary light quantity by adding light from low-power light sources 201a–201c, necessitating no use of high-power light sources complex in control and allowing the illumination system to be simply assembled.

Instead of the plurality of illumination optical systems forming the plurality of illumination regions 111a–111g as described above, another illumination optical system may employ such an arrangement that the mask 8 is illuminated in a rectangular region extending in the scanning direction (the X direction) and the direction perpendicular thereto (the Y direction). An example of such optical system is a rod light source extending in the Y direction.

Now, there are a plurality of projection optical systems 2a–2g below the mask 8. The projection optical systems 2a–2g are described below referring to FIG. 6. Since the projection optical systems 2a–2g have the same structure, only a projection optical system 2a is described for brevity of description.

Figure 6:
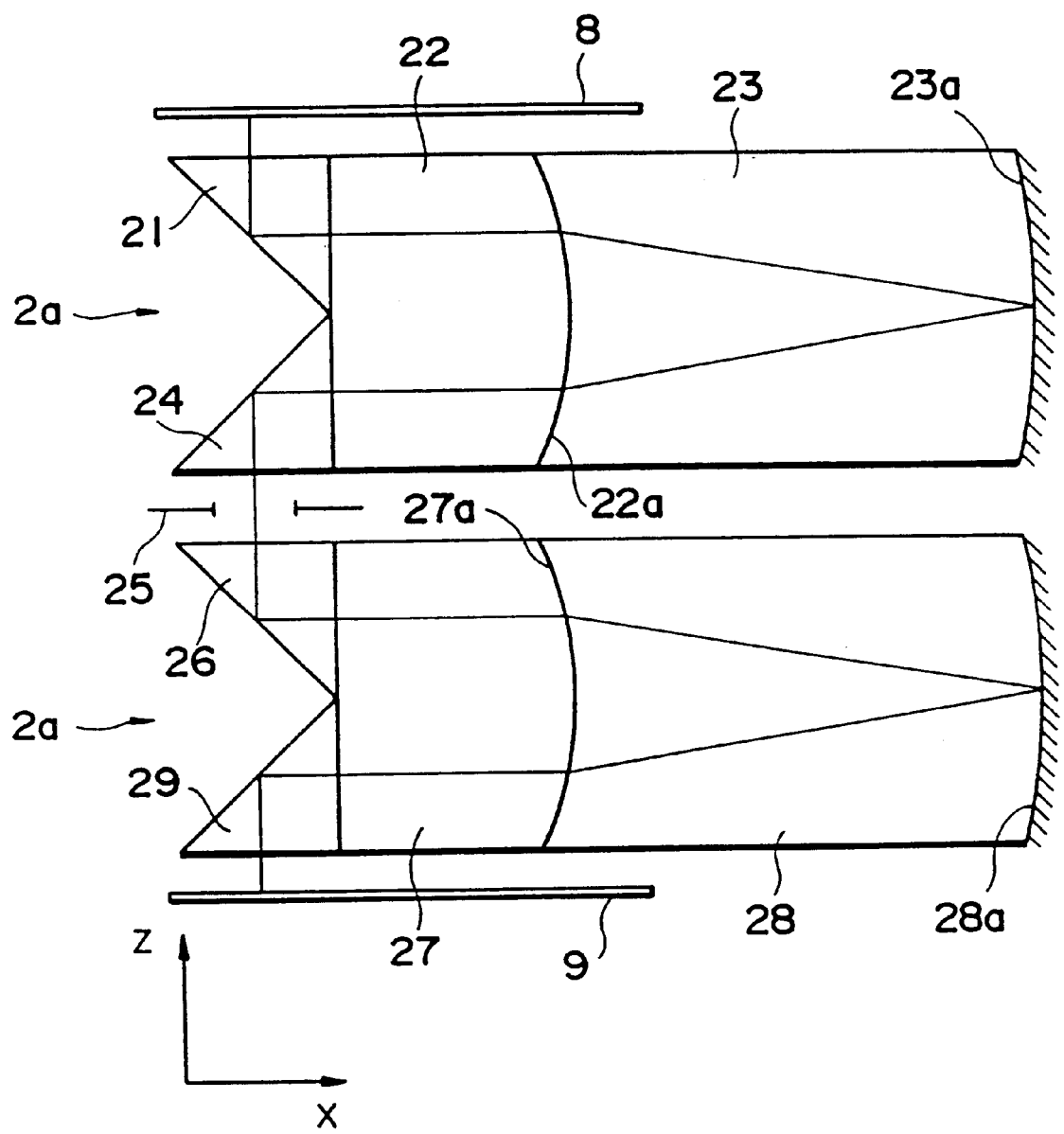
FIG. 6 is a side cross section of a projection optical system applied to the exposure apparatus in the embodiment of the present invention.

FIG. 6 is a lens structural drawing of the projection optical system 2a, where the projection optical system 2a has the structure of a combination of two Dyson optical systems. In FIG. 6, the projection optical system 2a is composed of a first partial optical system 21–24, a field stop 25 and a second partial optical system 26–29, and these first and second partial optical systems are modified Dyson optical systems.

The first partial optical system has a right-angle prism 21 having a reflective surface inclined at 45° relative to the surface of mask 8, a plano-convex lens component 22 with the optical axis along an in-plane direction of mask 8 and the convex surface directed toward the opposite side of the right-angle prism 21, a lens component 23 having a meniscus shape on the whole with a reflective surface of the concave surface directed toward the plano-convex lens component 22, and a right-angle prism 24 having a reflective surface perpendicular to the reflective surface of the right-angle prism 21 and inclined at 45° relative to the surface of mask 8.

The light from the illumination optical system through the mask 8 is deflected 90° in optical path by the right-angle prism 21 to enter the plano-convex lens component 22 bonded to the right-angle prism 21. Bonded to this lens component 22 is the lens component 23 made of a glass material different from that of the plano-convex lens component 22, so that the light from the right-angle prism 21 is refracted by a joint surface 22a between the lens components 22, 23 to reach the reflective surface 23a with a vapor-deposited reflecting film. The light reflected by the reflective surface 23a is refracted by the joint surface 22a then to reach the right-angle prism 24 bonded to the lens component 22. The light from the lens component 22 is deflected 90° in optical path by the right-angle prism 24 to form a primary image of mask 8 on the exit plane side of the right-angle prism 24. Here, the primary image of mask 8 formed by the first partial optical system 21–24 is a real-size image for which the lateral magnification is positive in the X direction and negative in the Y direction in FIG. 6.

The light from the primary image passes through the second partial optical system 26–29 to form a secondary image of mask 8 on the plate 9. The structure of the second partial optical system is the same as that of the first partial optical system and therefore is omitted to explain. The second partial optical system 26–29 forms a real-size image for which the lateral magnification is positive in the X direction and negative in the Y direction, as the first partial optical system does. Therefore, the secondary image formed on the plate 9 is a real-size erect image of mask 8 (an image positive in vertical and horizontal lateral magnifications).

Preferably, the exposure apparatus is an optical system telecentric at least on the image side. This is because no dimension error of actually exposed pattern on the wafer is caused even if the wafer for an image to be formed is moved vertically (or if in multiple printing the wafer is vertically shifted from the position upon first exposure) or even if there is a large step between circuit patterns formed on the wafer.

In steppers of full exposure type the mask position is always kept unchanged, because a mask-mounting table is fixed to the main body of exposure apparatus. Accordingly, no dimensional error of pattern is caused even though the exposure apparatus is not telecentric on the mask side (object side).

In case of a scanning exposure apparatus, both the mask and the wafer are arranged to move upon exposure, which could cause a shift of positional relation in the vertical direction between the mask and the wafer. Unless the exposure apparatus is constructed as a both side telecentric optical system, there is the possibility of change in dimensions of circuit pattern image formed on the wafer. Here, the "both side" means image side and object side. Accordingly, a both side telecentric optical system is preferable for the scanning exposure apparatus in the present invention, and therefore the first and second partial optical systems in the projection optical system 2a are both side telecentric optical systems.

The above-described first and second partial optical systems are so arranged that the reflective surfaces 23a, 28a are directed in a same direction. This can decrease the size of the entire projection optical system.

The first and second partial optical systems in the present embodiment are constructed such that a glass material fills the optical path between the plano-convex lens components 22, 27 and the reflective surfaces 23a, 28a. This is advantageous in causing no offset between the plano-convex lens components 22, 27 and the reflective surfaces 23a, 28a.

Figure 7:
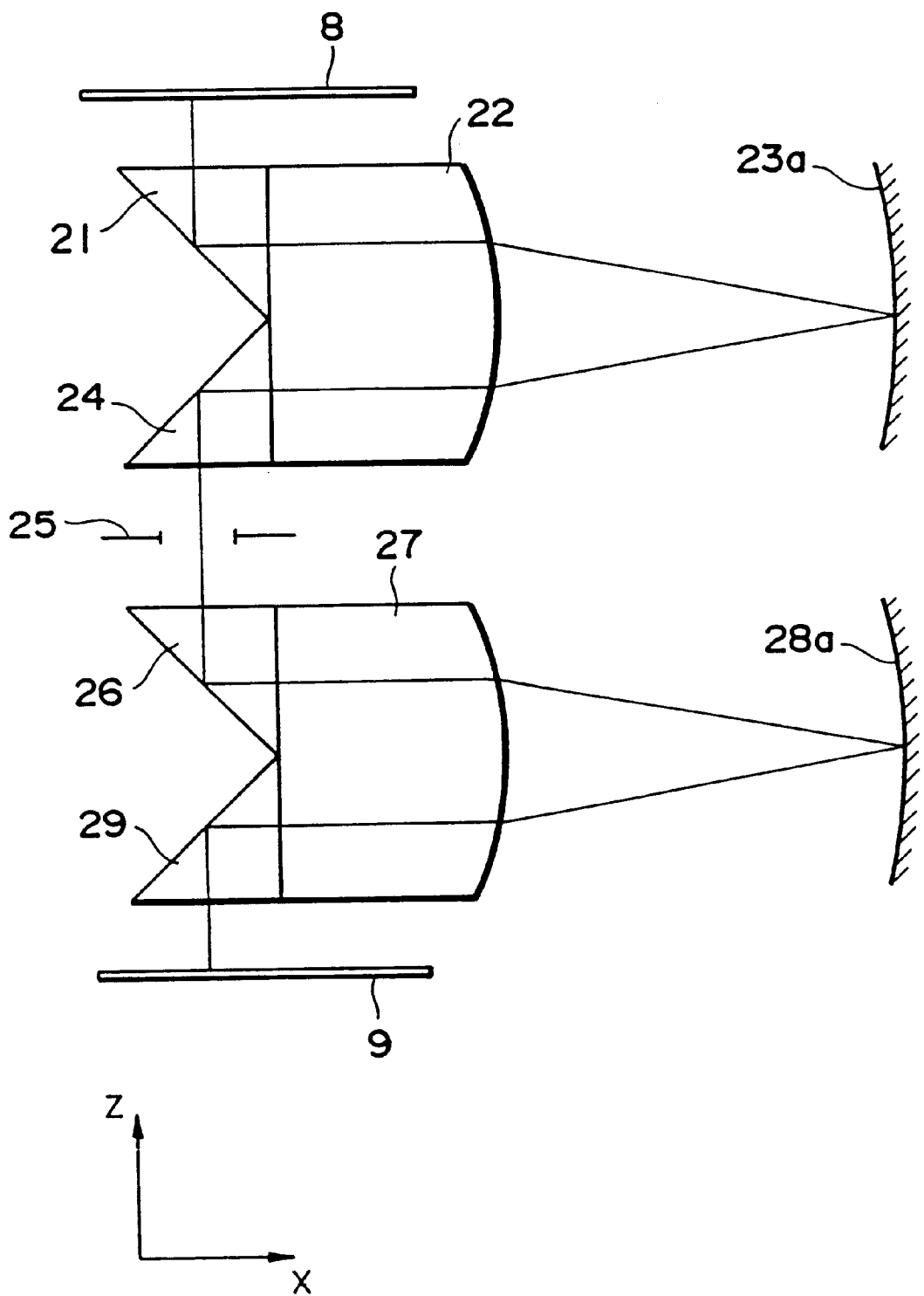
FIG. 7 is a side cross-sectional view to show another example of projection optical system.

Also, the first and second partial optical systems each may be constructed as a so-called Dyson optical system itself in which air fills a space between the plano-convex lens components 22, 27 and the reflective surfaces 23a, 28a, as shown in FIG. 7. Such a Dyson optical system is described in detail on P713–P716 in J. O. S. A. vol. 49 (published 1959).

Figure 8:
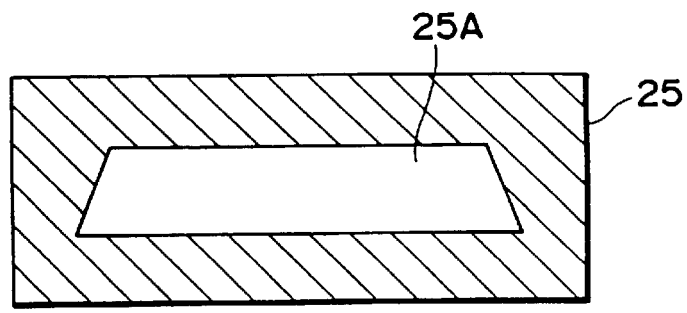
FIG. 8 is a plan view to show a field stop having a trapezoid aperture.
Figure 9:
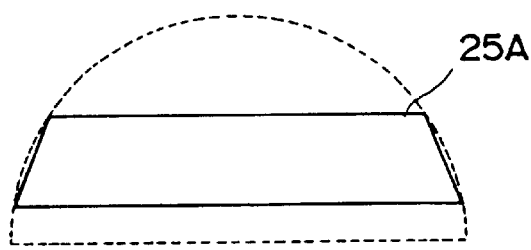
FIG. 9 is a drawing to show a planar positional relation between the trapezoid aperture and a maximum field region by a Dyson optical system.

In the present embodiment the field stop 25 is located at the position of primary image formed by the first partial optical system. The field stop 25 has an aperture 25A for example of trapezoid as shown in FIG. 8. The field stop 25 defines a trapezoid exposure area on the plate 9. Since in the Dyson optical system in the present embodiment a cross-sectional profile (in the YZ plane) of lens components 22, 23, 27, 28 is circular, a possible maximum field region is semi-circular as shown in FIG. 9. In this case a preferable arrangement is that the trapezoid field region 8a (see FIG. 3) defined by the field stop 25 is formed with a shorter side out of a pair of parallel sides being on the arc side of the semi-circular region (the maximum field region). This arrangement permits the width of field region in the scanning direction (X direction) to be maximized with respect to the possible maximum field region of the Dyson optical system, which can increase the scanning speed.

Figure 10:
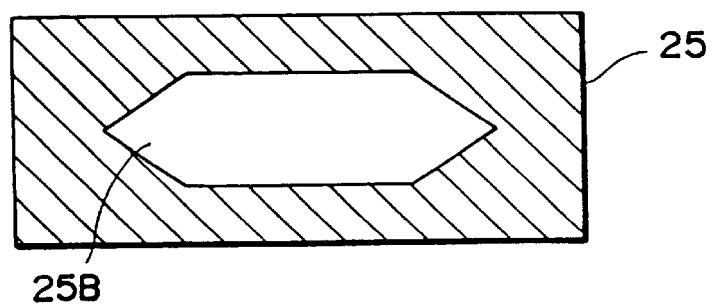
FIG. 10 is a plan view to show a field stop having a hexagonal aperture.
Figure 11:
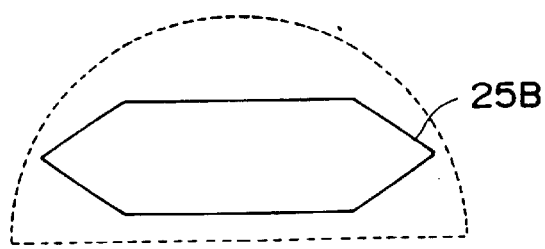
FIG. 11 is a drawing to show a planar positional relation between the hexagonal aperture and a maximum field region by a Dyson optical system.

Also, the field stop 25 may be arranged to have a hexagonal aperture 25b as shown in FIG. 10. In this case the dimensions of the hexagonal aperture 25B drop in the range of maximum field region as represented by the dashed line in the drawing, as shown in FIG. 11. Here, the maximum field region shown by the dashed line in FIG. 9 or in FIG. 11 is a region surrounded by points where rays passing through the outermost region pass on the mask 8 out of off-axial rays passing without eclipse through the first and second partial optical systems.

Returning to FIG. 3, the layout of the projection optical systems 2a–2g is described below. In FIG. 3, the projection optical systems 2a–2g have field regions 8a–8g defined by field stops in the projection optical systems. Images of these field regions 8a–8g are formed as real-size erect images on the exposure regions 9a–9g on the plate. Only when the real-size erect images are thus obtained, the exposure regions 9a–9g are perfectly linked.

Here, the projection optical systems 2a–2g are so arranged that the field regions 8a–8d are aligned in the Y direction in the drawing. Also, the projection optical systems 2e–2g are so arranged that the field regions 8e–8g are aligned along the Y. direction at positions different from those of the field regions 8a–8d in the X direction in the drawing. The projection optical systems 2e–2g are interposed between the projection optical systems 2a–2d in the Y direction. Namely, the projection optical systems are arranged in the order of 2a, 2e, 2b, 2f, 2c, 2g, 2d along the Y direction. In this case, the projection optical systems 2a–2d and the projection optical systems 2e–2g are so arranged that the right-angle prisms in the projection optical systems are located very close to each other. The projection optical systems 2a–2g may be set such that the spacing is enlarged between the field regions 8a–8d and the field regions 8e–8g in the X direction, but such an arrangement increases -a scanning amount for scanning exposure (an amount of movement of the mask 8 and the plate 9) so as to cause a decrease in throughput, which is not preferable.

On the plate 9, the projection optical systems 2a–2d form exposure regions 9a–9d aligned along the Y direction in the drawing, while the projection optical systems 2e–2g form exposure regions 9e–9g also aligned along the Y direction but at positions different in the Y direction from those of the exposure regions 9a–9d. These exposure regions 9a–9g are real-size erect images of the field regions 8a–8g.

In this arrangement, the mask 8 is mounted on a mask stage 80 and the plate 9 is mounted on a plate stage 60. Here, the mask stage and plate stage move in synchronization in the X direction in the drawing. By this, an image of mask 8 illuminated by the illumination optical system 10 is successively transferred onto the plate 9, effecting so-called scanning exposure. After completion of scan of the entire surface of mask 8 by the field regions 8a–8g with movement of the mask 8, the image of mask 8 is transferred over the entire surface on the plate 9.

There are provided on the plate stage 60 a reflecting member 61 having a reflective surface along the Y axis and a reflecting member 62 having a reflective surface along the X axis. An interferometer is set on the main body of exposure apparatus. The interferometer includes a laser beam source 63 for supplying a laser beam for example of He—Ne (633 nm), a beam splitter 64 for splitting the laser beam from the laser beam source 63 into a laser beam for X-directional measurement and a laser beam for Y-directional measurement, a prism 65 for projecting the laser beam from the beam splitter 64 onto the reflecting member 61, and prisms 66, 67 for projecting the laser beam from the beam splitter 64 onto two points on the reflecting member 62. This arrangement permits detection of X-directional position, Y-directional position and rotation in the XY plane of the stage. In FIG. 3, illustration is omitted for a detection system for detecting interference fringes between the laser beam and the reference laser beam reflected by the reflecting members 61, 62.

Figure 12:
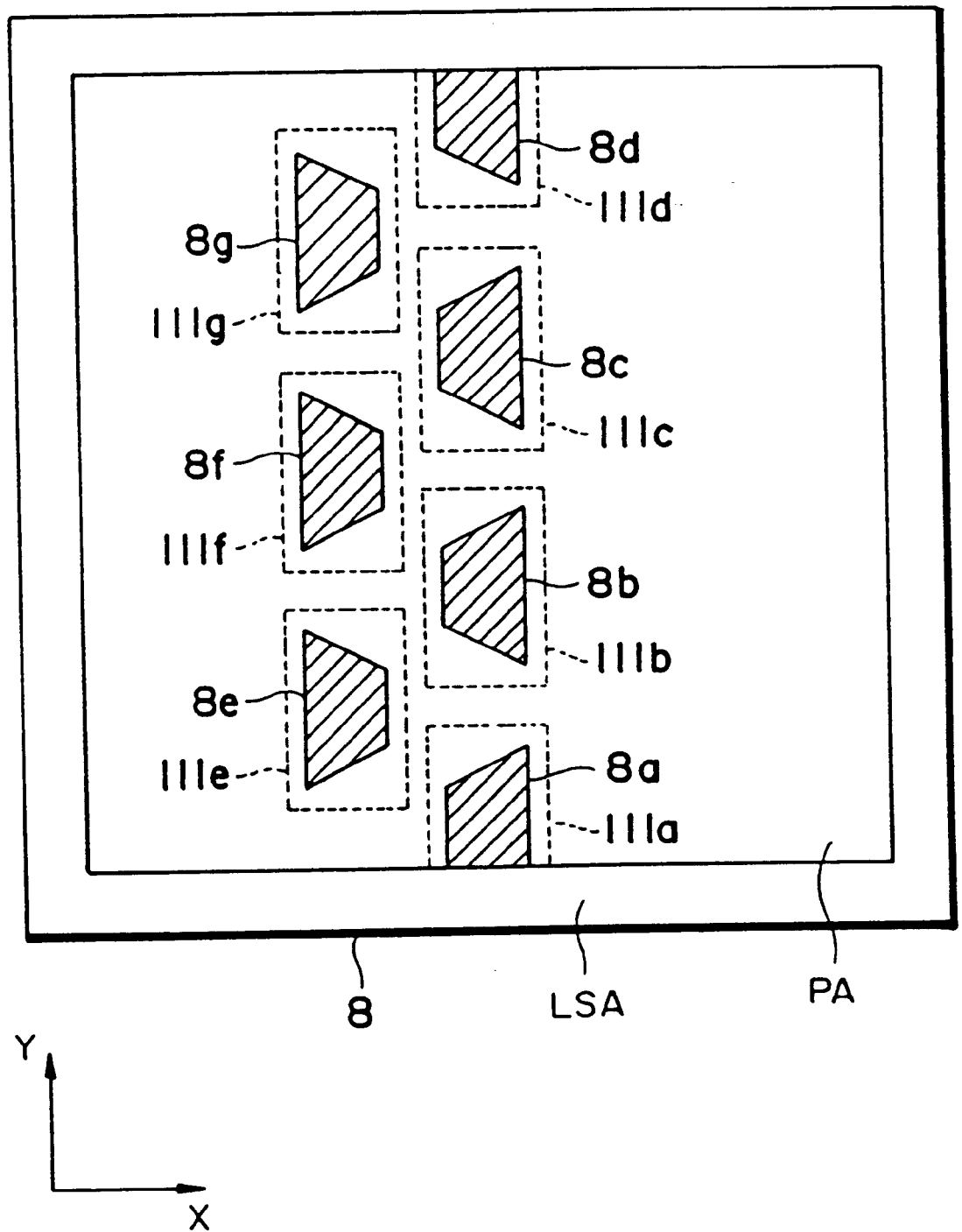
FIG. 12 is a drawing to show a planar positional relation between field regions by projection optical systems and a mask.

The layout of the field regions in the present embodiment is next described referring to FIG. 12. FIG. 12 is a drawing to show a planar positional relation between the field regions 8a–8g by the projection optical systems 2a–2g, and the mask 8. In FIG. 12, a circuit pattern PA is formed on the mask 8 and a light-shielding portion LSA is provided to surround the region of the circuit pattern PA. The illumination optical system shown in FIG. 4 uniformly illuminates the illumination regions 111a–111g surrounded by dashed lines in the drawing. The above-described field regions 8a–8g are located in the illumination regions 111a–111g. These field regions 8a–8g each are shaped substantially in a trapezoid profile by the field stops in the projection optical systems 2a–2g. Here, the upper edges of field regions 8a–8d (shorter sides out of parallel side pairs) are arranged to be opposed to the upper edges of field regions 8e–8g (shorter sides out of parallel side pairs). The shape of field regions 8a and 8d besides the light-shielding portion LSA is so defined that the sides on the light-shielding portion LSA side (edges other than the parallel side pairs) coincide with the edge of region of the circuit pattern PA. The field regions 8a and 8d may be formed in a profile overlapping with the light-shielding portion LSA of mask 8.

Since in the present embodiment the projection optical systems 2a–2g are both side telecentric optical systems, areas occupied by the projection optical systems 2a–2g are greater than those occupied by the corresponding field regions 8a–8g on the XY plane. Accordingly, the layout of field regions 8a–8d must be determined with spacings between the respective regions 8a–8d. In this case, scanning exposure only with the field regions 8a–8d would result in failing to projection-transfer the regions among the field regions 8a–8d on the mask 8 onto the plate 9. Thus, the present embodiment is so arranged that in order to effect scanning exposure for the regions among the field regions 8a–8d as well, the field regions 8e–8g are formed by the projection optical systems 2e–2g.

It is preferred that a sum of widths of the field regions 8a–8g (or the exposure regions 9a–9g) along the scanning direction (X direction) is always constant at any location in the Y direction. This is described below referring to FIG. 13.

Figure 13:
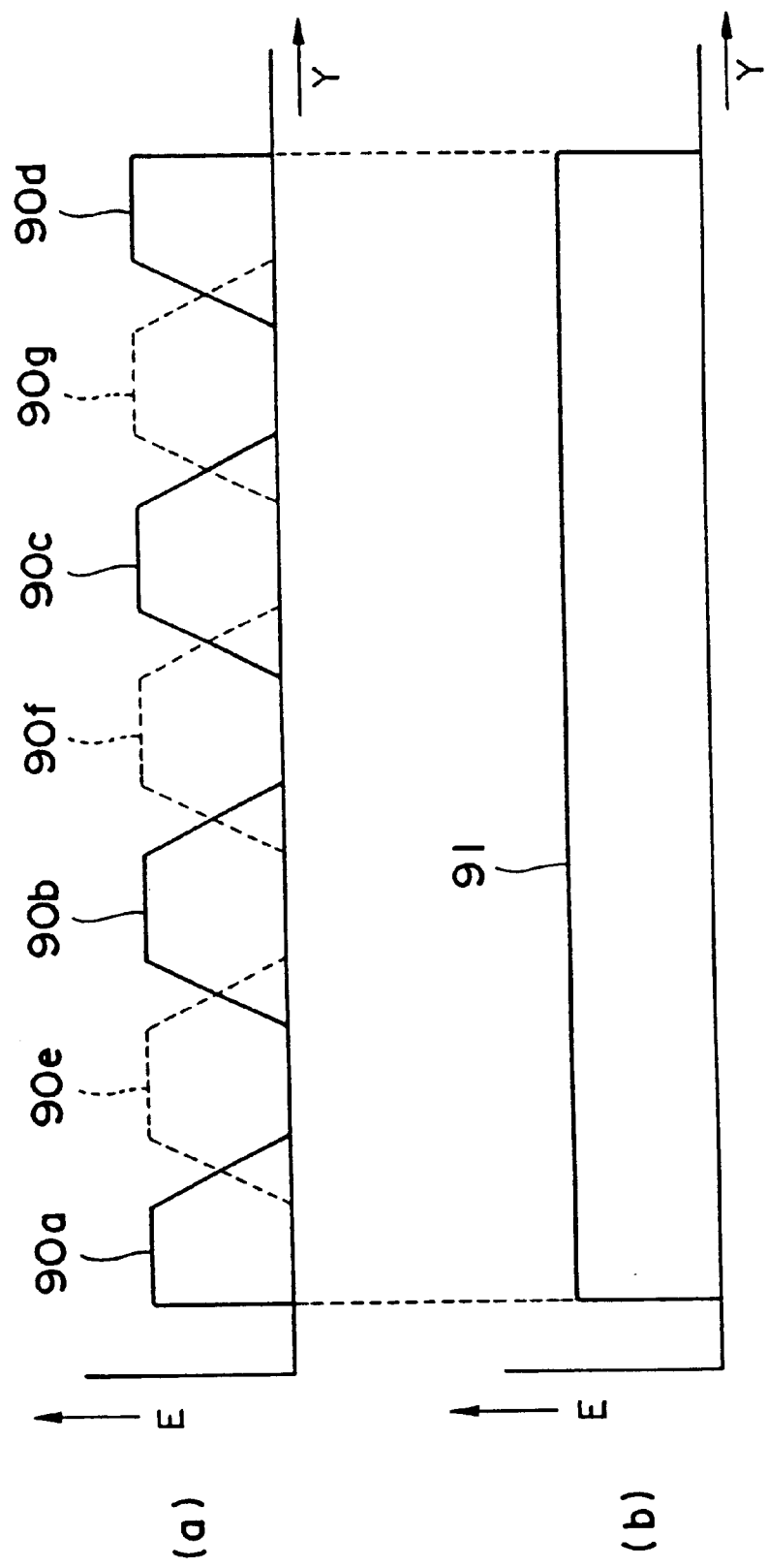
FIG. 13 is a drawing to show distributions of exposure for the Y direction on a plate.

FIG. 13 includes (a) and (b) to show distributions of X-directional exposure on the plate 9, in which the vertical axis represents exposure E and the horizontal axis the Y-directional position on the plate 9. In (a) of FIG. 13, exposure distributions 90a–90g corresponding to the respective trapezoid exposure regions 9a–9g are obtained on the plate 9. Since in scanning exposure the exposure regions are determined such that the sum of X-directional widths of exposure regions 9a–9g is constant, the exposure is always constant for the superimposed regions among the exposure regions 9a–9g. For example, as for a superimposed region between an exposure distribution 90a corresponding to the exposure region 9a and an exposure distribution 90e corresponding to the exposure region 9e, a sum of X-directional width of exposure region 9a and X-directional width of exposure region 9e is constant, so that the sum of exposures in the superimposed region becomes equal to an exposure in a non-superimposed region. Accordingly, a uniform exposure distribution 91 is obtained over the entire surface on the plate 9, as shown in (b) of FIG. 13. Although the above description concerned the case of trapezoid exposure regions, the combination of exposure regions for obtaining a uniform exposure distribution is not limited to such trapezoids. For example, in case a plurality of hexagonal exposure regions are formed by the field stops 25 as shown in FIG. 10, the exposure regions are so defined that the scanning-direction width of the exposure regions becomes always constant. By this, a-uniform exposure distribution can be obtained over the entire surface on the plate 9.

The field regions and the exposure regions corresponding to the respective projection optical systems may be defined such that a uniform exposure distribution can be obtained over the entire exposed surface by the field stops 25 in the projection optical systems. As a result, the optical system for precisely defining the field regions may be obviated in the illumination optical system 10. In other words, the field regions 8a–8g on the mask 8 are defined by the apertures of field stops in the associated projection optical systems 2a–2g, and therefore the illumination optical system 10 necessitates no optical system for precisely defining the field regions 8a–8g.

Figure 14:
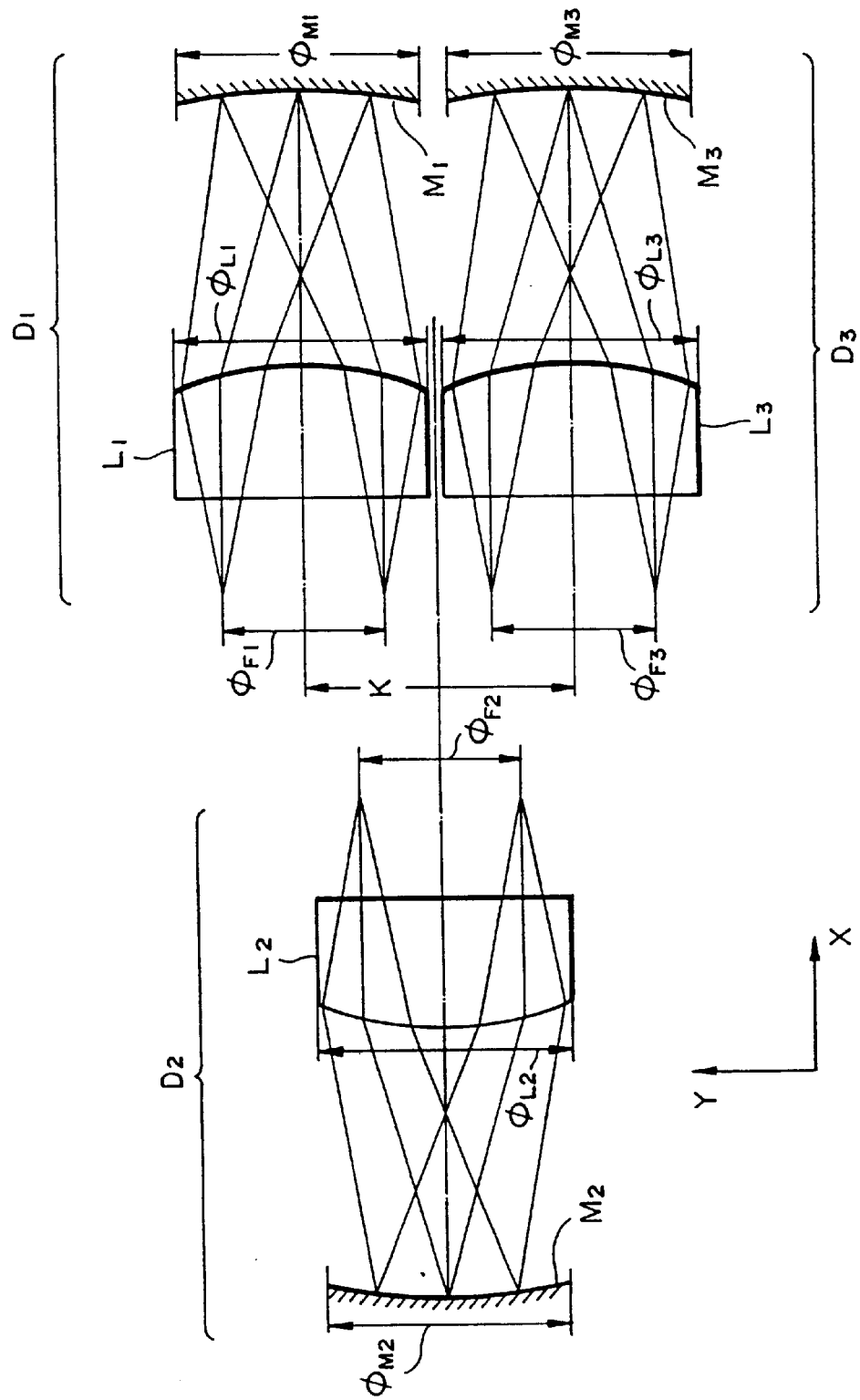
FIG. 14 is a plan view to illustrate a layout of a plurality of Dyson projection optical systems.

A preferable layout of the projection optical systems in the present embodiment is next described referring to FIG. 14. FIG. 14 is a plan view to illustrate an arrangement of the projection optical systems, which shows projection optical systems $D_1$, $D_2$, $D_3$ as seen from the mask 8 side (object side). In FIG. 14, the projection optical system $D_1$ is composed of a plano-convex lens component $L_1$ and a concave mirror $M_1$, the projection optical system $D_2$ is of a plano-convex lens component $L_2$ and a concave mirror $M_2$, and the projection optical system $D_3$ is of a plano-convex lens component $L_3$ and a concave mirror $M_3$. Here, the projection optical systems $D_1$, $D_2$, $D_3$ have the same structure. For brevity of illustration, FIG. 14 is drawn such that the optical paths of the projection optical systems $D_1$, $D_2$, $D_3$ include only optical paths from the object to the concave mirrors (reflecting mirrors) $M_1$, $M_2$, $M_3$ but exclude right-angle prisms for deflecting the optical paths in the Z direction.

Now, let $\Phi_{F1}$ be the Y-directional width of a possible maximum field region of the projection optical system $D_1$, $\Phi_{F2}$ be the Y-directional width of a possible maximum field region of the projection optical system $D_2$, and $\Phi_{F3}$ be the Y-directional width or a possible maximum field region of the projection optical system $D_3$. These Y-directional widths $\Phi_{F1}$–$\Phi_{F3}$ of the field regions correspond to the radial length of the maximum field region as shown by the dashed straight line in FIG. 9 or FIG. 11.

Then, letting K be a distance between optical axes of the projection optical systems $D_1$, $D_3$ arranged next to each other in the Y direction, it is preferable that the following relation is satisfied:

$$\Phi_{F1}/2+\Phi_{F2}+\Phi_{F3}/2>K \tag{1}$$

Here, substituting $\Phi_{F1}=\Phi_{F2}=\Phi_{F3}=\Phi_F$ (where $\Phi_F$ is the Y-directional width of a possible maximum field region of the projection optical systems), the above formula (1) can be rewritten as follows.

$$2\Phi_F > K \tag{2}$$

This means that the Y-directional width $\Phi_F$ of the possible maximum field region of the projection optical systems is preferably a half or more of the distance between the optical axes of projection optical systems in the Y direction. If the layout of the projection optical systems is out of the range of the above formula (1) or formula (2), there could occur an unpreferable case that the field regions fail to overlap with each other in the Y direction.

Also, let $\Phi_{L1}$–$\Phi_{L3}$ be diameters (Y-directional lengths) of the plano-convex lens components $L_1$–$L_3$, $\Phi_{M1}$–$\Phi_{M3}$ be diameters (Y-directional lengths) of the concave mirrors $M_1$–$M_3$, and $\Phi_{D1}$–$\Phi_{D3}$ larger diameters among them (i.e., maximum values of outer diameters of the projection optical systems $D_1$, $D_2$, $D_3$).

Since the projection optical systems $D_1$, $D_2$, $D_3$ have the same structure, the following relations hold:

$$\Phi_{L1}=\Phi_{L2}=\Phi_{L3}; \ \Phi_{M1}=\Phi_{M2}=\Phi_{M3}; \ \Phi_{D1}=\Phi_{D2}=\Phi_{D3} \tag{3}$$

Letting $\Phi_F$ be the Y-directional width of the possible maximum field region of the projection optical systems, the following relation is preferably to be satisfied:

$$\Phi_F > \Phi_D/2 \tag{4}$$

If the projection optical systems $D_1$–$D_3$ do not satisfy the above formula (4), that is, if the Y-directional width $\Phi_F$ of the possible maximum field region of the projection optical systems is not greater than a half of the maximum value $\Phi_D$ of outer diameter of the projection optical systems, there could occur an unpreferable case that two projection optical systems $D_1$, $D_3$ disposed adjacent to each other in the Y direction interfere with each other. In case the maximum value of outer diameter of projection optical systems is determined by the right-angle prisms for deflecting the optical paths by 90°, the maximum value $\Phi_D$ of outer diameter is to be determined as the Y-directional length of right-angle prisms. The above relations of formula (1) to formula (4) are not limited to the Dyson optical system but can be applied to an Offner optical system as described later.

Figure 15:
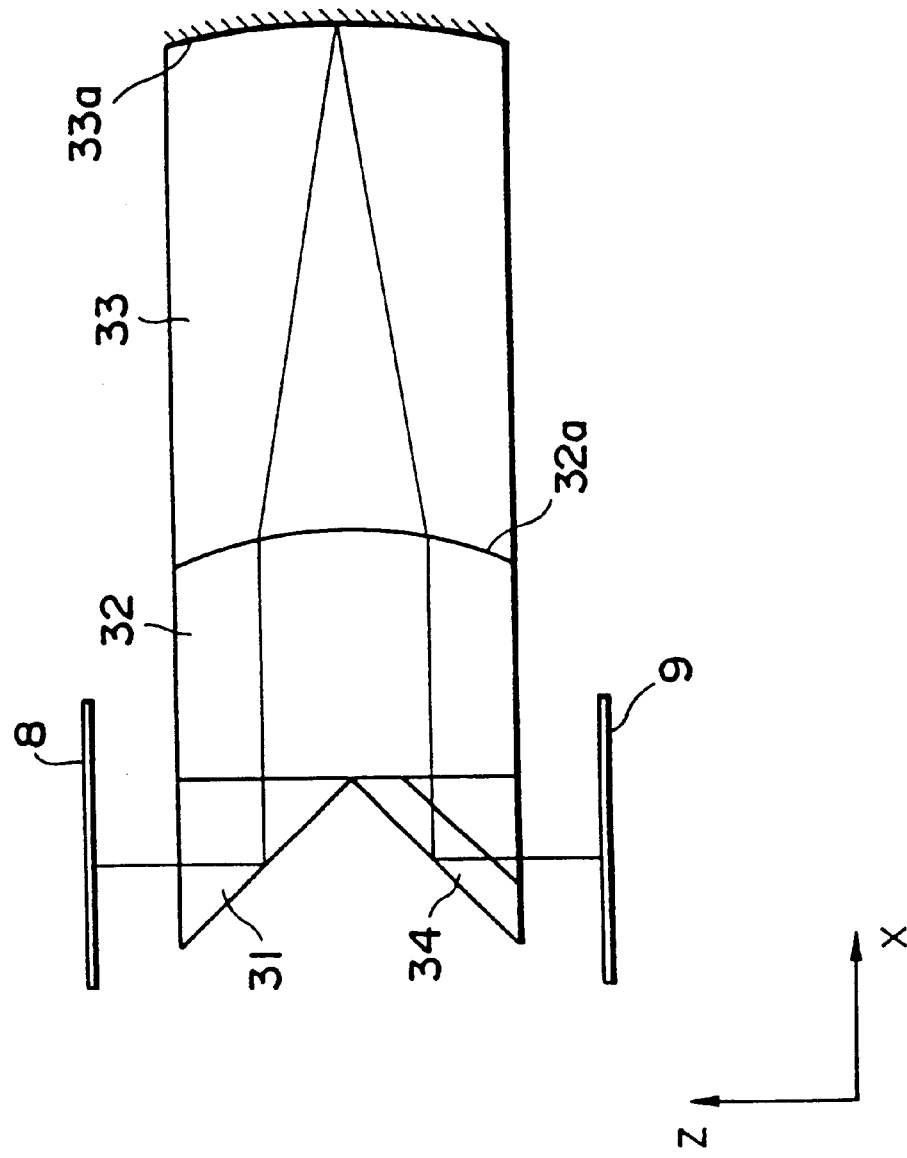
FIG. 15, FIG. 16 and FIG. 17 are lens constitutional drawings to show another example of Dyson projection optical system.
Figure 16:
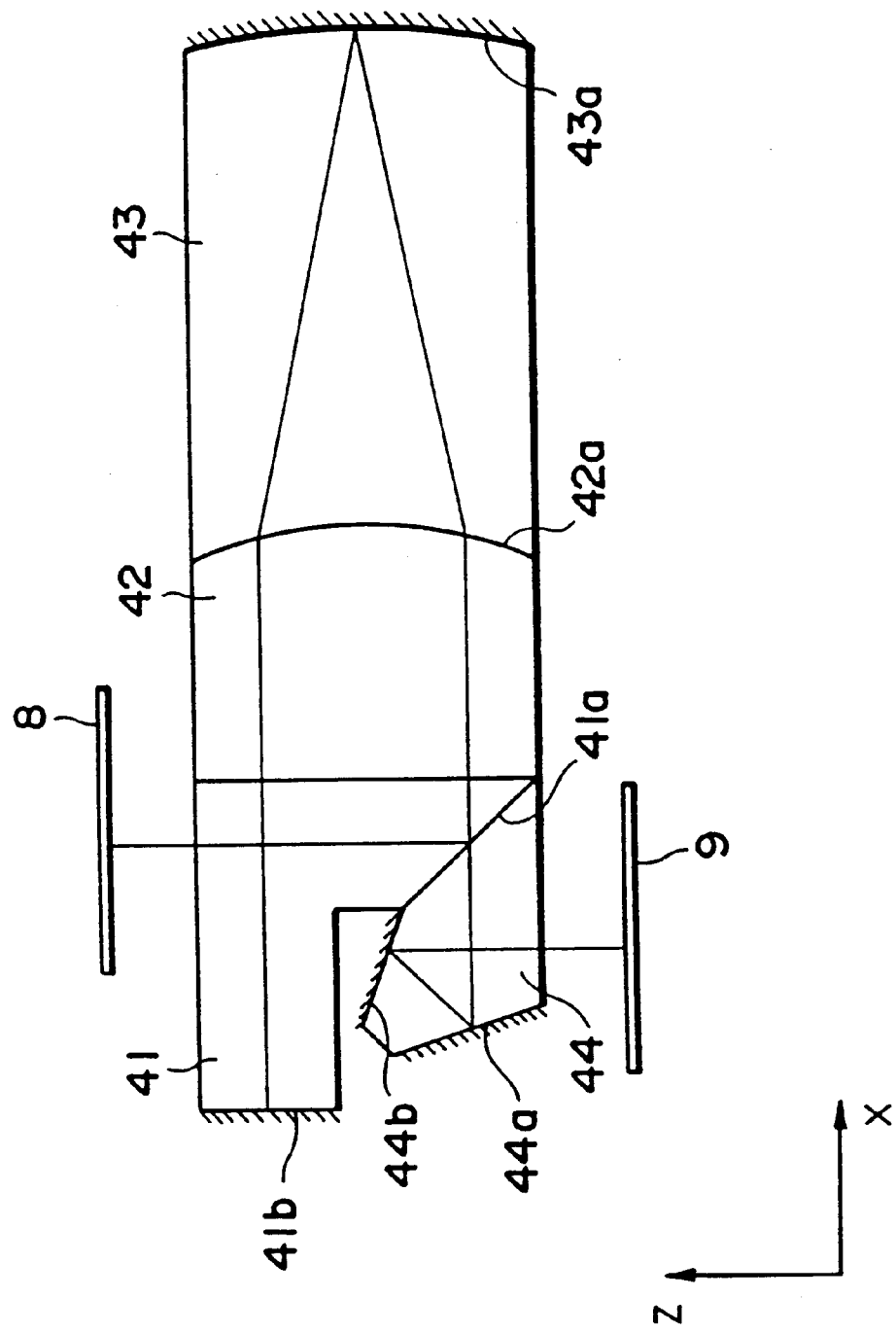

The above-described embodiment employed a combination of two sets of optical systems as the projection optical systems, but instead thereof optical systems as shown in FIG. 15 or FIG. 16 may be applied. FIG. 15 shows an example in which an Amici prism (right-angle roof prism) 34 with a dach (roof) surface is employed in place of the right-angle prism in a Dyson optical system. The Amici prism functions to bend the traveling direction of light by 90° and to invert an image left to right. In FIG. 15, a right-angle prism 31, a plano-convex lens component 32 and a lens component 33 having a reflective surface 33a have the same functions as the right-angle prism 21, the plano-convex lens component 22 and the lens component 23 shown in FIG. 6, respectively, and are omitted to explain herein. A Dyson optical system having two right-angle prisms forms an image for which the lateral magnification is positive in the direction along the optical axis (the X direction) and the lateral magnification is negative in the direction perpendicular to the optical axis (the direction along the object plane and the image plane, i.e., the Y direction). A Dyson optical system having an Amici prism 34 as shown in FIG. 15 inverts an image orientation in the direction perpendicular to the optical axis (the Y direction) in the object plane and the image plane by its dach surface, so that it can form an erect image for which the lateral magnifications is positive both in the direction along the optical axis (the X direction) and in the direction perpendicular to the optical axis (Y direction) in the object plane and the image plane.

FIG. 16 is a lens structural drawing to show an example of Dyson optical system provided with reflective surfaces for bending the optical path. In FIG. 16, light from the mask 8 is deflected 90° in optical path by a semi-reflecting surface 41a inclined at 45° relative to the direction of incidence of light (the Z direction) to enter a plano-convex lens component 42. The plano-convex lens component 42 and a lens component 43 bonded to the plano-convex lens component 42 shown in FIG. 16 have the same functions as the plano-convex lens component 22 and the lens component 23 in FIG. 6, respectively.

The light incident into the plano-convex lens component 42 is reflected by a reflective surface 43a and again passes through the plano-convex lens component 42 to form a primary image of mask 8 on the exit side of plano-convex lens component 42. Another reflective surface 41b is set at the position where the primary image is formed. Here, the semi-reflective surface 41a and the reflective surface 41b are formed on a reflecting member 41. Then the light from the primary image on the reflective surface 41b travels backward in the same optical path to advance through the plano-convex lens component 42 and the lens component 43 and then to pass through the semi-reflective surface 41a. On the transmission side of the semi-reflective surface 41a there are provided a reflecting member 44 having a reflective surface 44a inclined at 112.5° relative to the direction of incidence of rays (the transmission direction) and a reflective surface 44b inclined at 45° relative to the reflective surface 44a. Since the reflective surfaces 44a, 44b have a function of pentagonal prism, the light incident into the reflecting member 44 is deflected 90° in optical path through reflection on the reflective surfaces 44a, 44b.

The light reflected by the reflective surfaces 44a, 44b forms a secondary image of mask 8 on the exit side of reflecting member 44. Here, the secondary image is a real-size erect image. In FIG. 16, the optical path length from the mask 8 to the reflective surface 41b is arranged to be equal to that from the reflective surface 41b to the plate 9.

In the projection optical system shown in FIG. 16 the shape of the reflective surface 41b is the shape of field stop. For example, in case or a trapezoid reflecting surface 41b with the shorter edge in the YZ plane located up on the drawing plane, the field region and exposure region will be trapezoid-with the shorter edge located right on the plane of drawing and on the XY plane. in the projection optical system of FIG. 16, rays passing near the optical axis of the plano-convex lens component 42 and the lens component 43 do not reach the reflective surface 41b and therefore do not contribute to image formation. However, in order to avoid mixture of the optical path from the semi-reflective surface 41a to the reflective surface 43a with the optical path from the reflective surface 41b to the reflective surface 43a, it is rare to use rays passing on and near the optical axis of the plano-convex lens component 42 and the lens component 43. Accordingly, even if the rays passing near the optical path of the plano-convex lens component 42 and the lens component 43 are interrupted as shown in FIG. 16, there occurs no practical problem.

It is of course that the projection optical system as shown in FIG. 15 or in FIG. 16 may be constructed in an inverted arrangement in the relationship between the object side and the image side.

Figure 17:
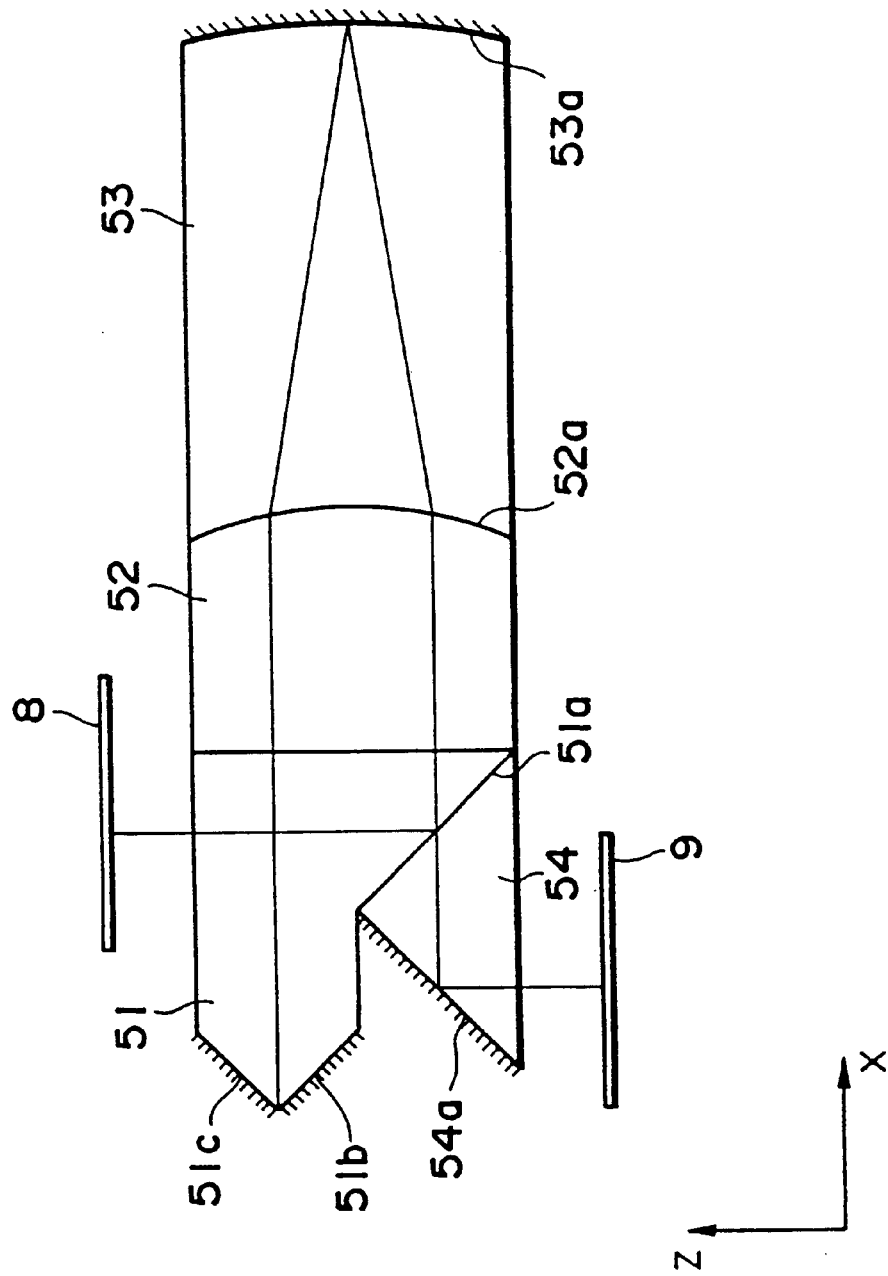

In order to obtain the erect image, the above-described projection optical system shown in FIG. 16 employed the two reflective surfaces 44a, 44b having the same function as the pentagonal prism, but instead thereof the reflective surface for changing the optical path backward composed of two reflective surfaces may be employed, as shown in FIG. 17. In FIG. 17, the arrangement is different from the projection optical system in FIG. 16 in that the reflective surface 41b for changing the optical path backward is replaced by two reflective surfaces 51b, 51c constituting a dach surface having a ridge line along the Y direction (the direction normal to the drawing plane) and the two reflective surfaces 44a, 44b are replaced by a reflective surface 54a inclined at 45° relative to the surface of plate 9. In FIG. 17, a plano-convex lens component 52 and a lens component 53 having a reflective surface 53a have the same functions as those of the plano-convex lens component 42 and the lens component 43 in FIG. 16, respectively.

In FIG. 17, the light from the mask 8 is deflected 90° in optical path by a semi-reflective surface 51a and then passes through the plano-convex lens component 52 and the lens component 53 to reach the reflective surfaces 51b, 51c, forming a primary image of mask 8 there. The primary image is inverted upside down by the reflective surfaces 51b, 51c and again passes through the plano-convex lens component 52 and the lens component 53 then to pass through the semi-reflective surface 51a. The light passing through the semi-reflective surface 51a is deflected 90° in optical path by the reflective surface 54a to go out of a reflecting member 54, forming a secondary image of mask 8. Here, the secondary image is a real-size erect image.

In case that the projection optical system forms no intermediate image (primary image) as shown in FIG. 15 or in case that the optical system does not allow a field stop to be placed at the intermediate-image-formed position as shown in FIG. 17, the shape of illumination region by the illumination optical system may be arranged as similar to the shape of a desired field region. For example, if the apertures 107a, 107b in the field stop 107 in the illumination optical system of FIG. 4 are shaped in a trapezoid profile, trapezoid illumination regions can be obtained.

Since the projection optical systems in FIGS. 15–17 are equipped with no field stop, the field regions on the mask 8 must be precisely defined by the illumination optical system 10. However, the projection optical systems in FIGS. 15–17 each is composed of a Dyson optical system, which can achieve excellent imaging performance with little occurrence of optical aberrations, as compared with the projection optical system composed of two Dyson partial optical systems as shown in FIG. 6.

As described above, in the exposure apparatus of the present embodiment a plurality of projection optical systems form an exposure region having a wide width in the direction perpendicular to the scanning direction, so that the exposure region can be formed in a large scale without increasing the scale of the projection optical systems. In the present embodiment each projection optical system is compact in scale, which can prevent an increase in aberrations due to proportional enlargement and which can permit scanning exposure with excellent imaging performance.

The second embodiment of the present invention is next described referring to the accompanying drawings.

Figure 18:
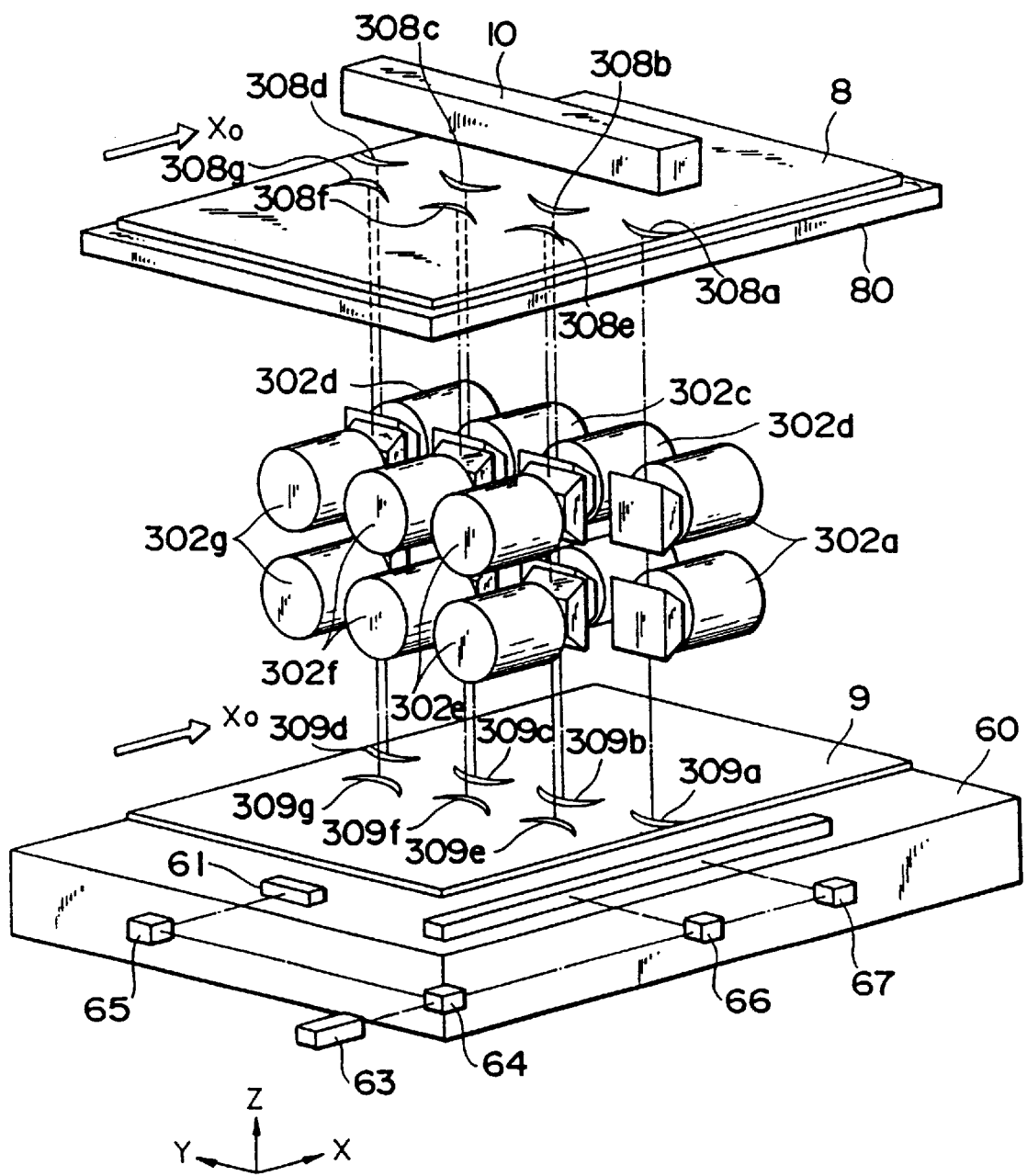
FIG. 18 is a perspective view to show the overall structure of an exposure apparatus in the second embodiment of the present invention.

FIG. 18 is a perspective view to show the structure of an exposure apparatus according to the second embodiment of the present invention. Also, FIG. 19 is a drawing to show the structure of projection optical systems in the exposure apparatus of FIG. 18.

The second embodiment is different from the embodiment as shown in FIG. 3 in that the structure of projection optical systems 302a–302g is different from that in the first embodiment as detailed below and in that because of it the shape of field regions 308a–308g and exposure regions 309a–309g is substantially of a semi-circular ring. The second shown in FIG. 18 is the same as the first embodiment shown in FIG. 3 except for the above points.

FIG. 19 is a drawing to schematically show the structure of each projection optical system. A projection optical system as shown is composed of a first partial optical system 321–323, a field stop 324, and a second partial optical system 325–327. Each of the first partial optical system 321–323 and the second partial optical system 325–327 is an Offner optical system and is constructed in the same structure.

The first partial optical system is composed of an isosceles trapezoid prism 321 having a first reflective surface 321a for deflecting light from the mask 8 in the X-axis direction (to the right in the drawing), a concave mirror 322 for reflecting light reflected by the first reflective surface 321a of isosceles trapezoid prism 321 to the left in the drawing, and a convex mirror 323 disposed as opposed to the concave mirror 322 with the axis common to the optical axis of concave mirror 322. As described above, the second partial optical system has completely the same structure as that of the first partial optical system. In FIG. 19, constituent elements in the second partial optical system are denoted by reference numerals different from those in the first partial optical system, but redundant description will be omitted as to the structure of the second partial optical system.

Illumination light passing through the mask 8 is deflected to the right in the drawing by the first reflective surface 321a of the isosceles trapezoid prism 321 to impinge on the concave mirror 322. The light reflected to the left in the drawing by the concave mirror 322 is then reflected to the right in the drawing by the convex mirror 323 again to impinge on the concave mirror 322. The light again reflected to the left in the drawing by the concave mirror 322 is then deflected downward in the drawing by the second reflective surface 321b of the isosceles trapezoid prism 321 to form a primary image of a pattern of mask 8 between the first partial optical system and the second partial optical system.

The thus formed primary image by the first partial optical system 321–323 is a real-size image of mask 8 for which the lateral magnification is positive in the X direction and negative in the Y direction. A field stop 324 is placed at the position where the primary image is formed.

The light from the primary image passing through the field stop 321 is deflected to the right in the drawing by a first reflective surface 325a of the isosceles trapezoid prism 325 to impinge on a concave mirror 326. The light reflected to the left in the drawing by the concave mirror 326 is then reflected to the right in the drawing by a convex mirror 327 again to impinge on the concave mirror 326. The light again reflected to the left in the drawing by the concave mirror 326 is deflected downward in the drawing by a second reflective surface 325b of the isosceles trapezoid prism 325 to form a secondary image of a pattern of mask 8 on the plate 9.

The second partial optical system has the same structure as the first partial optical system, as described above, so that the second partial optical system forms a real-size image of the primary image for which the lateral magnification is positive in the X direction and negative in the Y direction. Accordingly, the secondary image formed on the plate 9 through the first and second partial optical systems is a real-size erect image (an image with positive lateral magnifications in the X direction and in the Y direction) of mask 8. The projection optical systems each composed of the first and second Offner partial optical systems are both side (both object side and image side) telecentric optical systems.

The projection optical system in FIG. 19 is so arranged that the concave mirror 322 in the first partial optical system and the concave mirror 326 in the second partial optical system both are directed to the left in the drawing, whereby the size of projection optical system can be decreased and in turn the exposure apparatus can be made compact in scale.

Also, the optical axes of projection optical systems 302a–302d and the optical axes of projection optical systems 302e–302g are parallel to the X axis and the apparatus is so arranged that the isosceles trapezoid prisms in the projection optical systems 302a–302d and the isosceles trapezoid prisms in the projection optical systems 302e–302g are located close to each other, that is, that the first group of projection optical systems 302a–302d are opposed to the second group of projection optical systems 302e–302g.

Figure 20:
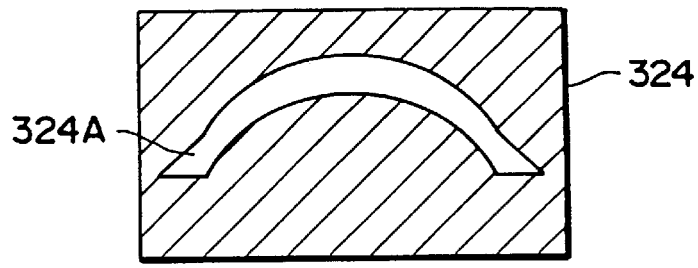
FIG. 20 is a plan view to show a field stop having an aperture with arcuate borders.
Figure 21:
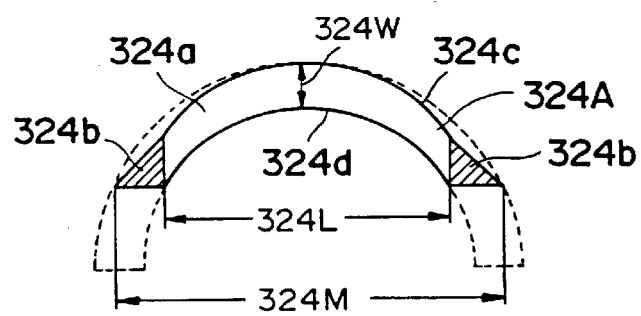
FIG. 21 is a drawing to show a planar positional relation between the aperture with arcuate borders and a maximum field region by an Offner optical system.

FIGS. 20 and 21 are drawings to show a first example of shape of an aperture in the field stop 324. FIG. 20 shows an aperture 324A formed in the field stop 324 and FIG. 21 shows a relation between the shape of aperture 324A and a maximum field region.

As shown by the dashed line in FIG. 21, a maximum field region as defined as a region with sufficiently small aberrations is nearly semi-annular or half-ring in the Offner optical system. Accordingly, the shape of aperture 324A formed in the field stop 324 is defined in the above semi-annular maximum field region.

In FIG. 21, the length of aperture 324A is shown as 324M in the direction (corresponding to the horizontal direction in the drawing) perpendicular to the scanning direction, and within 324M the width in the scanning direction (corresponding to the vertical direction in the drawing) is arranged to be constant (324W) in a central opening portion 324a defined by two arcs 324c and 324d within the length of 324L. In order to maximize the scanning speed, the width 324W of the center opening portion 324a in the scanning direction is preferably selected as to take a maximum area with respect to the maximum field region.

On the other hand, end opening portions 324b (as hatched in the drawing) other than the center opening portion 324a with the length 324L are triangular so that the width in the scanning direction linearly decreases toward the end.

Figure 22:
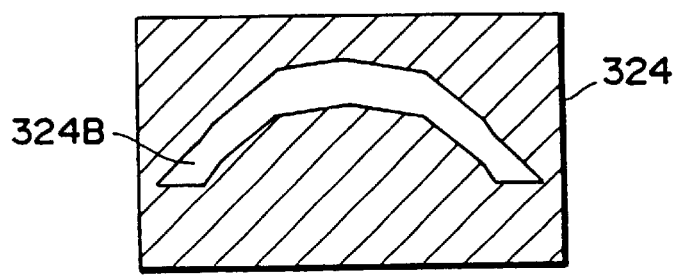
FIG. 22 is a plan view to show a field stop having an aperture with polygonal borders.
Figure 23:
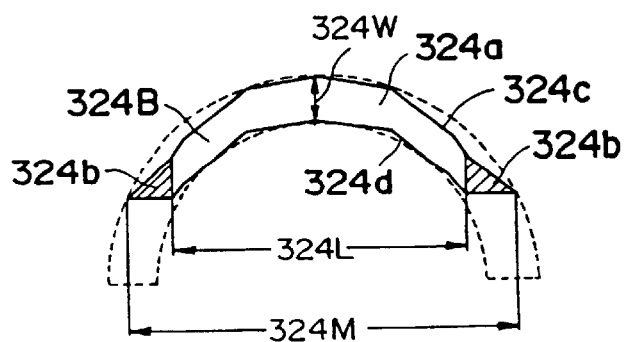
FIG. 23 is a drawing to show a planar positional relation between the aperture with polygonal borders and a maximum field region by an Offner optical system.

FIGS. 22 and 23 are drawings to show a second example of shape of an aperture in the field stop 324. FIG. 22 shows an aperture 324B formed in the field stop and FIG. 23 shows a relation between the shape of aperture 324B and a maximum field region.

In FIG. 23, the length of aperture 324B is shown as 324M in the direction (corresponding to the horizontal direction in the drawing) perpendicular to the scanning direction, and within 324M the width in the scanning direction (corresponding to the vertical direction in the drawing) is arranged to be constant (324W) in a center opening portion 324a as defined by two polygonal lines 324c and 324d in the length of 324L. In order to maximize the scanning speed, the width 324W of the center opening portion 324a in the scanning direction is preferably selected as to become maximum with respect to the maximum field region.

On the other hand, end opening portions 324b (as hatched in the drawing) other than the center opening portion 324a with the length 324L are shaped triangular so that the width in the scanning direction linearly decreases toward the end.

A basic difference between the above two examples is that the center opening portion 324a is defined by the two arcs in the aperture in the field stop shown in FIGS. 20 and 21 while the center opening portion 324a is defined by the two polygonal lines in the aperture in the field stop shown in FIGS. 22 and 23.

Figure 24:
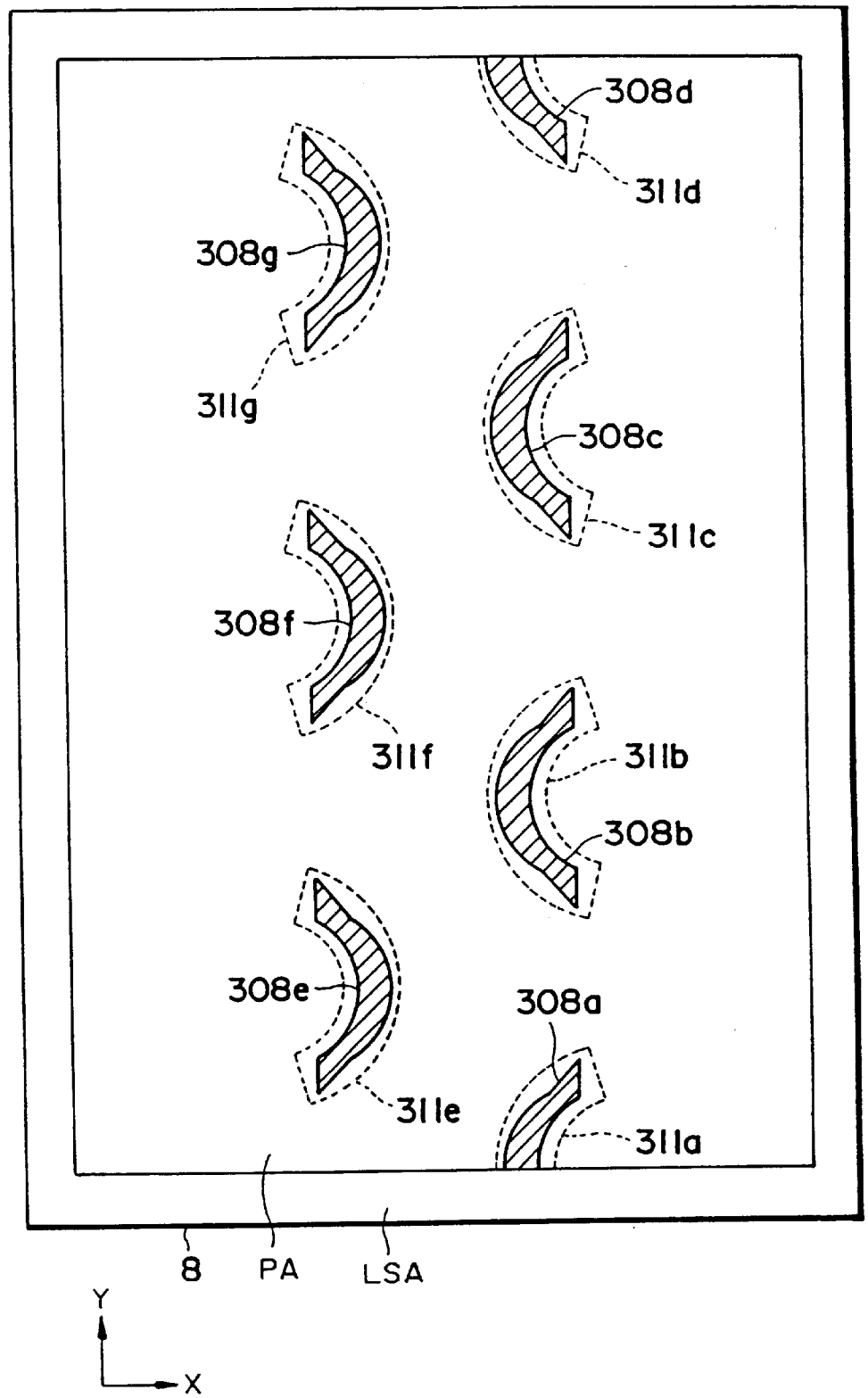
FIG. 24 is a drawing to show a planar positional relation between field regions by Offner projection optical systems and a mask.

FIG. 24 is a drawing to show a layout of field stops on the mask, showing a planar positional relation between field stops 308a–308g defined by the projection optical systems 302a–302g and the mask 8.

In FIG. 24, a rectangular circuit pattern PA is formed on the mask 8 and a light-shielding portion LSA is provided to surround the circuit pattern PA. The illumination optical system 10 illuminates illumination regions 311a–311g surrounded at least by the dashed lines in the drawing with almost uniform illuminance.

The field stops in associated projection optical systems 302a–302g make the field regions 308a–308g defined in a shape of crescent moon as shown by the hatched portions in the drawing enclosed in the illumination regions 311a–311g.

Here, convex sides of the field regions 308a–308d are arranged to be opposed to those of the field regions 308e–308g, and the triangular ends of field regions overlap with the opposed triangular ends of adjacent field regions in the X direction (scanning direction).

The reason why the first group of field regions 308a–308d and the second group of field regions 308e–308g are alternately arranged in the Y direction is that because of each projection optical system being a both side telecentric optical system the regions occupied by the projection optical systems 302a–302g on the XY plane are larger than the corresponding field regions 308a–308g.

Namely, if only linearly aligned projection optical systems 302a–302d are used to define the field regions 308a–308d by field stops thereof, there appear spacings between the regions in the Y direction. Consequently, a continuous exposure region in the Y direction cannot be secured on the plate 9 only by the projection optical systems 302a–302d. Then the projection optical systems 302e–302g are added to complement the Y-directional spacings among the field regions 308a–308d by corresponding field regions 308e–308g, securing a continuous exposure region in the Y direction.

The field regions 308a and 308d are positioned such that in the center portion as the region with constant width in the scanning direction they intersect with the border-between the light-shielding portion LSA and the circuit pattern PA.

As described above, even with the Offner projection optical systems being used, the field regions 308a–308g on the mask 8 are so arranged that a sum of lengths of field regions along the scanning direction (X direction) is constant at an arbitrary position in the direction (Y direction) perpendicular to the scanning direction, similarly in case of the Dyson projection optical systems being used. Namely, in the exposure regions 309a–309g which are real-size erect images of the field regions, the sum of lengths of field regions along the scanning direction (x direction) also becomes constant at an arbitrary position in the direction (Y direction) perpendicular to the scanning direction. As a result, scanning exposure can provide a uniform exposure distribution over the entire surface on the plate 9.

Figure 25:
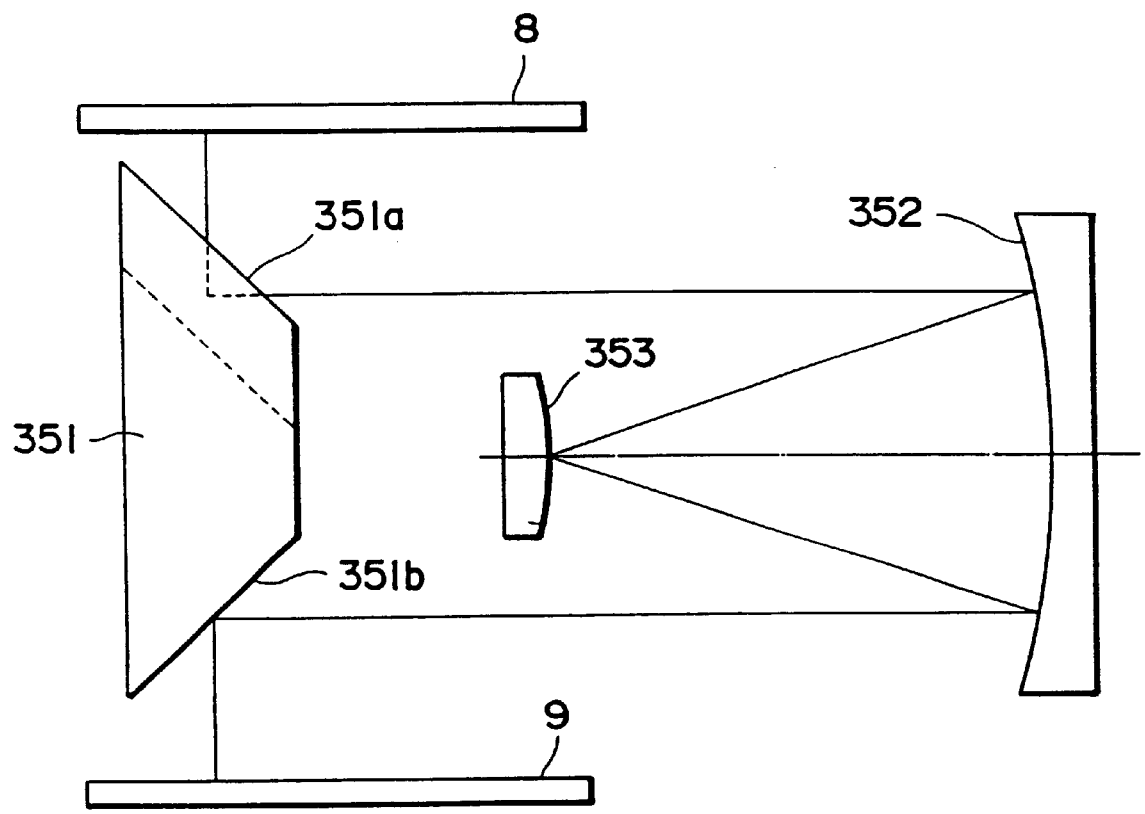
FIG. 25 is a side view to show another example of Offner projection optical system.

FIG. 25 is a drawing to show the structure of another projection optical system.

The projection optical system of FIG. 25 is basically different from the projection optical system of FIG. 19 composed of two Offner partial optical systems and a field stop in that it includes one Offner optical system and excludes the field stop.

Further, the projection optical system of FIG. 25 is the same in structure as each partial optical system in FIG. 19 but is different in that the first reflective surface of isosceles trapezoid prism is a dach (roof) surface.

In the projection optical system of FIG. 25, illumination light passing through the mask 8 is deflected to the right in the drawing by a dach surface 351a of an isosceles trapezoid prism 351 to impinge on a concave mirror 352. The light reflected to the left in the drawing by the concave mirror 352 is reflected to the right in the drawing by a convex mirror 353 again to impinge on the concave mirror 352. The light again reflected to the left in the drawing by the concave mirror 352 is deflected downward in the drawing by a reflective surface 351b of the isosceles trapezoid prism 351 to form a real-size erect image of a pattern of mask 8 on the plate 9.

Thus, the dach surface 351a inverts the image orientation in the direction (the direction perpendicular to the drawing plane or the Y direction) perpendicular to the optical axis in the object plane and in the image plane. Then an erect image of the pattern on the mask 8 is formed on the plate 9 such that the lateral magnification is positive both in the direction along the optical axis (in the X direction) and in the direction perpendicular to the optical axis (in the Y direction) in the object plane and in the image plane. Accordingly, such a scanning exposure apparatus having a plurality of projection optical systems can be so arranged that the scanning direction of mask 8 is made coincident with the scanning direction of plate 9.

Figure 26:
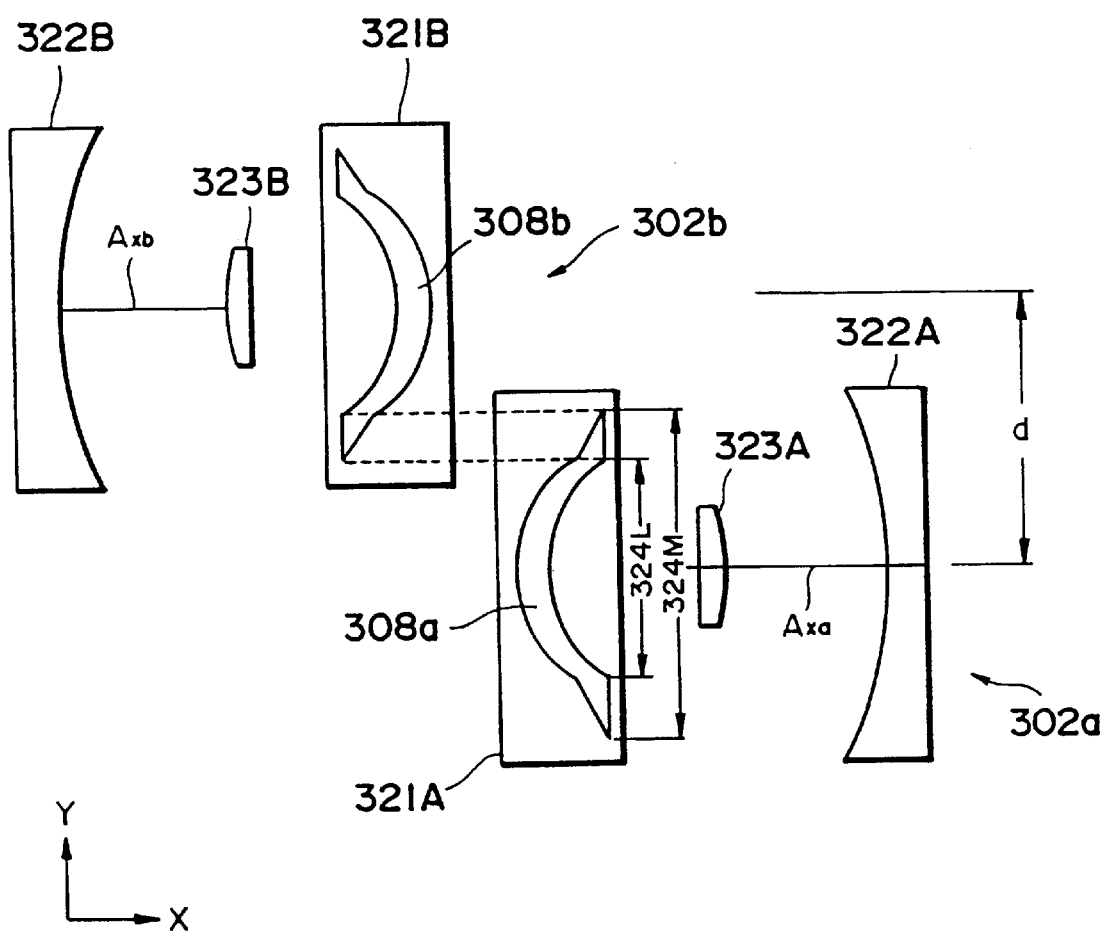
FIG. 26 is a plan view to illustrate a layout of a plurality of Offner projection optical systems.

Next described referring to FIG. 26 is a preferable layout of projection optical systems in the second embodiment. FIG. 26 is an XY plan view to show a relation between two sets of projection optical systems and field regions (exposure regions). In FIG. 26, members having the same functions as those in the first embodiment are denoted by the same reference numerals.

In FIG. 26, a projection optical system 302a for forming an image of field region 308a on the object plane (mask surface in the embodiment) is illustrated only with an isosceles trapezoid prism 321A, a concave mirror 322A and a convex mirror 323A, and a projection optical system 302b for forming an image of field region 308b on the object plane only with an isosceles trapezoid prism 321B, a concave mirror 322B and a convex mirror 323B. Here, let 324L be an inside (arc center side) Y-directional length in the arcuate field region and 324M be a Y-directional maximum length of field region. Then the distance d in the Y direction between the optical axis $A_{xa}$ of projection optical system 302a and the optical axis $A_{xb}$ of projection optical system 302b is preferably determined to satisfy the following relation:

$$d = 324L + (324M - 324L)/2 \quad (5)$$

If the two sets of projection optical systems 302a, 302b do not satisfy the above conditional formula (5), the field regions do not overlap with each other on the object plane or the X-directional (scanning direction) width of field regions cannot be constant, which is not preferable.

The conditional formula (5) holds if the above 324L and 324M are not the lengths in the field regions on the object plane but the lengths in the exposure regions on the image plane (the plate surface in the embodiment) or the lengths in the field stops.

Also, the above conditional formula (5) can be applied to cases where three or more projection optical systems are arranged or to cases that the projection optical systems are of the Dyson type. In case the projection optical systems are of the Dyson type, and if the fields of the Dyson optical systems are trapezoid, 324L may be assigned to the length of shorter edge and 324M to the length of longer edge out of a pair of parallel edges in each trapezoid field.

Figure 27:
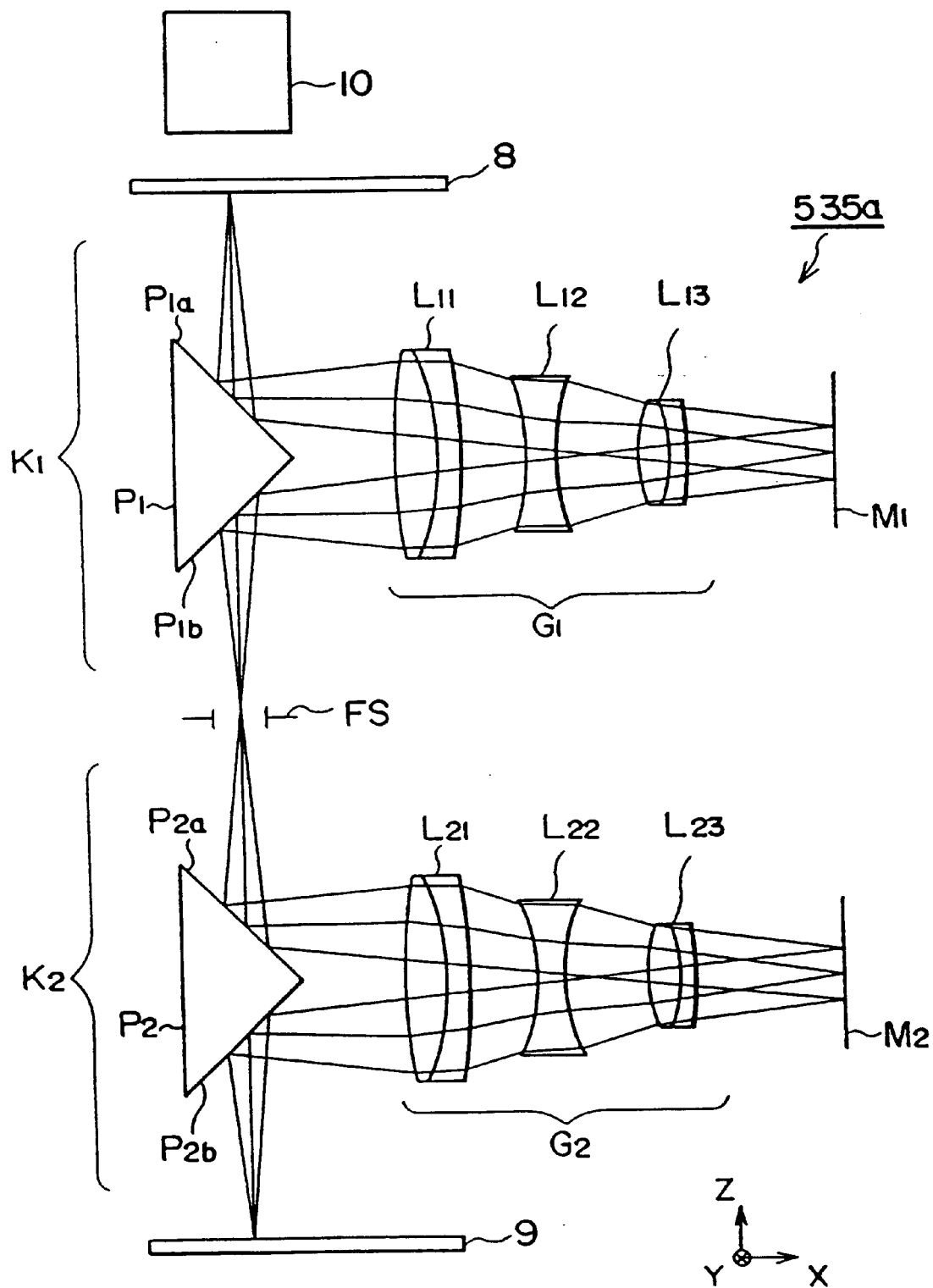
FIG. 27 is a side cross-sectional view to show a third embodiment of a projection optical system applied to the exposure apparatus according to the present invention.

Next the third embodiment of a projection optical system will be explained below, referring to FIGS. 27–28. FIG. 27 shows a structure of the third embodiment. A first projection optical system 535a shown in FIG. 27 corresponds to the projection optical system 2a shown in FIG. 6 and the mask 8, the glass plate 9 and the arrangement thereof are the same as those shown in FIG. 6.

In FIG. 27, the first projection optical system 535a has a first partial optical system K1 for forming a primary image of a circuit pattern on the mask 8, and a second partial optical system K2 or forming an erect image (secondary image) of the circuit pattern on the plate 9, based on light from the primary image. The first partial optical system K1 has a right-angle prism P1 with reflective surfaces P1a, P1b inclined at 45° to the surface of mask 8 (XY plane), a refractive optical system G1 of a positive refractive power as a whole having a positive lens group L11, a negative lens group L12, and a positive lens group L13, and a plane reflective surface M1.

Also, the second partial optical system K2 has a right-angle prism P2 with reflective surfaces P2a, P2b inclined at 45° to the surface of plate 9 (XY plane), a refractive optical system G2 of a positive refractive power as a whole having a lens group L21 of a positive refractive power, a lens group L22 of a negative refractive power, and a lens group L23 of a positive refractive power, and a plane reflective surface M2. Here, a field stop FS is provided at a position where the primary image of the circuit pattern is formed by the first partial optical system K1.

The circuit pattern on the mask 8 is illuminated under nearly uniform illuminance by the illumination optical system 10, and light through the circuit pattern is deflected 90° by the reflective surface P1a of the right-angle prism P1 to advance through the positive lens group L11, negative lens group L12, and positive lens group L13 in the named order to reach the plane reflective surface M1. Here, the plane reflective surface M1 is located substantially at the rear focal-point position of the refractive optical system G1 composed of the positive lens group L11, negative lens group L12, and positive lens group L13. Namely, the plane reflective surface M1 is located on the pupil plane of the first partial optical system K1. The rear focal-point position of the refractive optical system G1 is a Position of the rear focal point when the side of the right-angle prism P1 is defined as the front side and the side of the plane reflective surface M1 is the rear side.

Next, the light reflected by the plane reflective surface M1 travels through the positive lens group L13, negative lens group L12, and positive lens group L11 toward the reflective surface P1b of the right-angle prism P1. Here, the refractive power exerted on the light beam incident into the positive lens group L11 and then emergent toward the plane reflective surface M1 is approximately equal to that exerted on the light beam incident from the plane reflective surface M1 into the lens group L13 and then emergent from the positive lens group L11.

Then the light reaching the reflective surface P1b of the right-angle prism P1 is deflected approximately 90° by the reflective surface P1b to form the primary image of the circuit pattern at the position of the field stop FS. For the primary image, the lateral magnification in the X direction is approximately +1 and the lateral magnification in the Y direction is approximately −1.

The light from the primary image travels through the second partial optical system K2 to form the secondary image of the circuit pattern on the plate 9. Here, the lateral magnifications of the secondary image in the X direction and the Y direction are nearly +1. Namely, the secondary image formed on the plate 9 is an erect image. Since the second partial optical system K2 has the same function as the first partial optical system K1 does, the detailed description thereof is omitted herein.

Accordingly, as explained in the first embodiment, an image formed on the plate 9 is a real size erect image of a circuit pattern on the mask 8, a scanning exposure can be performed by moving integrally the both of the mask 8 and the plate 9.

In addition, since the plane reflective surface M1 is located at the rear focal-point position of the refractive optical system G1, the first partial optical system K1 as described above is telecentric on the side of mask 8 and on the side of field stop FS. Further, since the plane reflective mirror M2 is located at the rear focal-point position of the refractive optical system G2, the second partial optical system K2 is also telecentric on the side of field stop FS and the side of plate 9. Accordingly, the first projection optical system 535a is a both side (mask 8 side and plate 9 side) telecentric optical system.

Figure 28A:
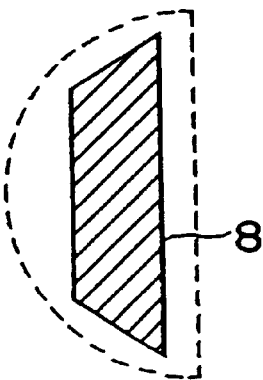
FIGS. 28A to 28C are drawings to show a planar positional relation between an exposure region and a field stop of the third embodiment.
Figure 28B:
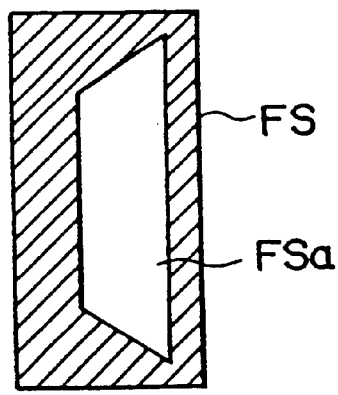
Figure 28C:
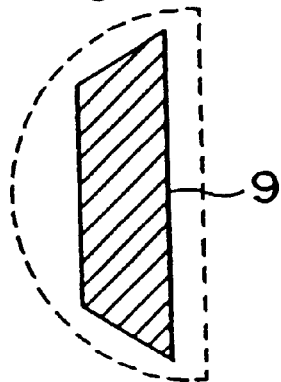

Next, the exposure area of the first projection optical system 535a in FIG. 27 is described referring to FIGS. 28A–28C. FIG. 28A is a plan view to show a relation between an effective field region and the field of the first projection optical system 535a in the XY plane on the mask 8, FIG. 28B is a plan view of the field stop FS, and FIG. 28C is a plan view to show a relation between the effective exposure region and the exposure region of the first projection optical system 535a.

In FIG. 28A, the effective field region, which is a maximum field region obtainable by the first projection optical system 535a, is a semi-circular region surrounded by the dashed line on the mask 8. Here, if the shape of the aperture portion FSa in the field stop FS is trapezoid as shown in FIG. 28B, the field region 8a of the first projection optical system 535a on the mask 8 is trapezoid as similar to the shape of the aperture portion FSa. It is needless to mention that this field region 8a is included in the effective field region.

Also, as shown in FIG. 28C, the effective exposure region, which is the maximum exposure region obtainable by the first projection optical system 535a on the plate 9, is a semi-circular region surrounded by the dashed line. Here, the aperture portion FSa of the field stop FS defines the exposure region 9a on the plate 9 in a trapezoid shape similar to the aperture portion FSa. This exposure region 9a is also included in the effective exposure region. In this arrangement of the trapezoid exposure region 9a, the height of the trapezoid in the X direction is the slit width, and hypotenuse portions (portions changing their heights in the X direction) at the Y-directional end portions are overlap regions (regions overlapping in the Y direction with adjacent exposure regions when a plurality of projection optical systems are arranged). The total structure and the scanning method etc. except for the concrete structure of the projection optical system 535a is the same as those of the first embodiment and therefore, the detail explanation thereto is omitted.

Next, the forth embodiment of the projection optical system will be explained below.

Figure 29:
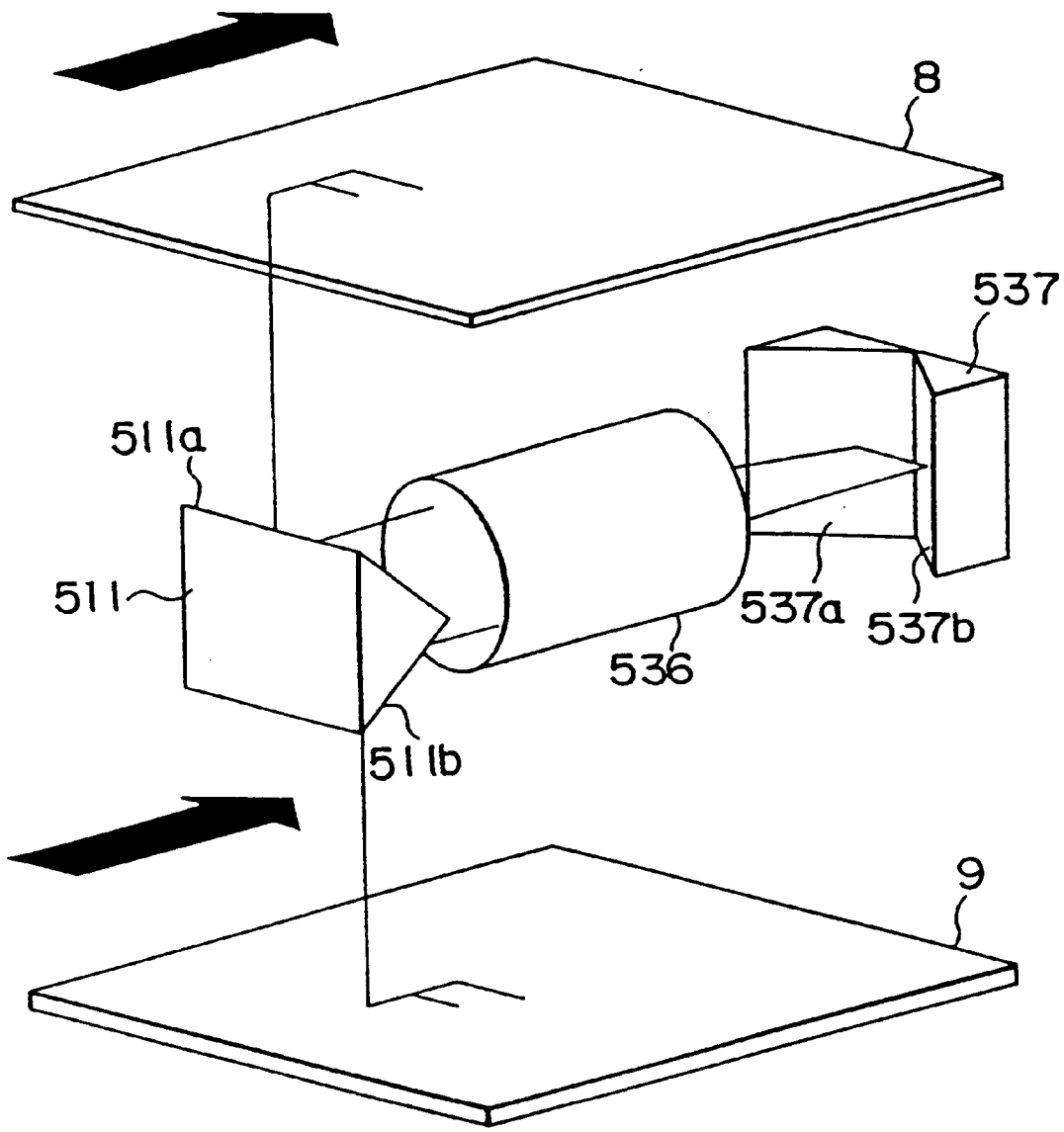
FIG. 29 is a perspective view to show the overall structure of the exposure apparatus in which the projection optical system of the fourth embodiment is applied.

The forth embodiment is shown in FIG. 29.

As shown in FIG. 29, in the forth embodiment, the first Projection optical system has a right-angle prism 511 with reflective surfaces 511a, 511b inclined at 45° to the surface of mask 8 (XY plane), a refractive optical system 536 having a positive refractive power as a whole, and a reflective member 537 disposed at the rear focal-point position of the refractive optical system 536. Here, the refractive optical system 536 has the same function as the refractive optical system G1 in the first projection optical system shown in FIG. 27. Further, the reflective member 537 has right-angle roof reflective surfaces 537a, 537b with a ridgeline along the Z direction, and the ridgeline is located so as to be coincident with the rear focal-point position of the refractive optical system 536.

The light from the mask 8 illuminated by the illumination optical system 10 is deflected 90° by the reflective surface 511a to enter the refractive optical system 536. The light passing through the refractive optical system 536 is reflected twice by the right-angle roof reflective surfaces 537a, 537b of the reflective member 537 to be incident again into the refractive optical system 536. The light from the right-angle roof reflective surfaces 537a, 537b and through the refractive optical system 536 is deflected 90° by the reflective surface 511b of the right-angle prism 511, and thereafter impinges on the plate 9. Since the right-angle roof reflective surfaces 537a, 537b invert the orientation of image in the Y direction, a real-size erect image of mask 8 is formed on the plate 9. Since the reflective member 537 is located at the rear focal-point position of the refractive optical system 536, the first projection optical system is a both side telecentric optical system.

The forth embodiment is so arranged that the right-angle roof reflective surfaces 537a, 537b are located at the rear focal-point position of the refractive optical system 536, but such roof reflective surfaces may be provided in a reflective surface for deflecting an optical path.

Figure 30:
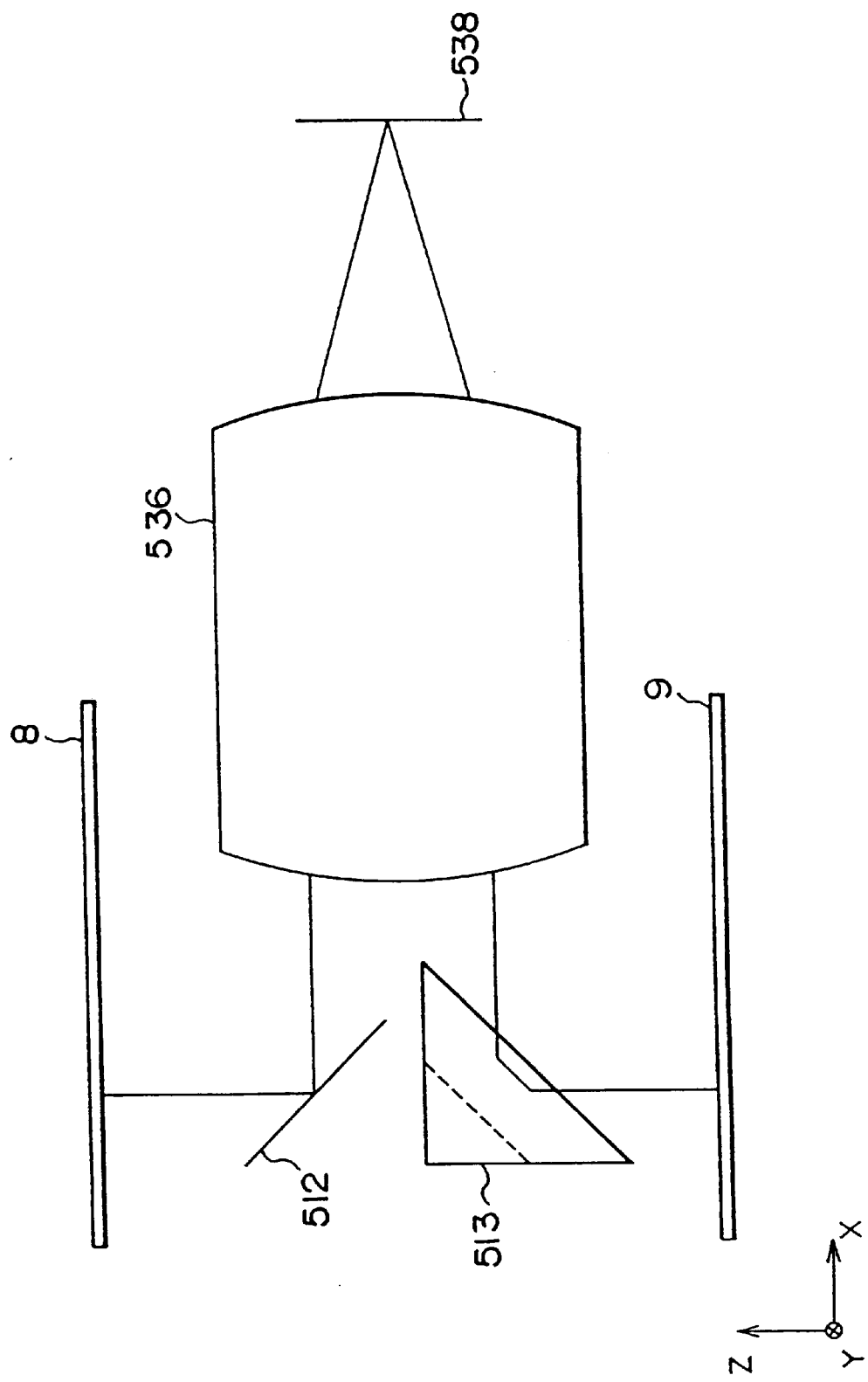
FIG. 30 is a side cross-sectional view to show the fifth embodiment of a projection optical system applied to the exposure apparatus.

Next the fifth embodiment is shown in FIG. 30.

Only the first projection optical system in the projection optical system is shown also in FIG. 30.

As shown in FIG. 30, the first projection optical system has a reflective surface 512 inclined at 45° to the surface of mask 8 (XY plane), a refractive optical system 536 of a positive refractive power as a whole, a plane reflective mirror 538 disposed at the rear focal-point position of the refractive optical system, and a reflective member 513 having the roof reflective surfaces. Since the refractive optical system 536 is the same as the refractive optical system of the forth embodiment shown in FIG. 29 is omitted herein.

The reflective member 513 has two reflective surfaces (roof reflective surfaces) 513a, 513b perpendicular to each other, for example as shown in FIG. 31. Here, a ridgeline 513c of the two reflective surfaces 513a, 513b has an inclination of 45° relative to the XY plane.

Returning to FIG. 30, the light from the mask 8 is deflected 90° by the reflective surface 512 to travel through the refractive optical system 536 and then to reach the plane reflective surface 538. The light reflected by the plane reflective surface 538 passes again through the refractive optical system 536 to reach the reflective member 513. The light reaching the reflective member 513 is deflected 90° toward the plate 9 and also is inverted left to right in the Y direction. Accordingly, a real-size erect image of mask 8 is formed on the plate 9.

In the fifth embodiment shown in FIG. 30, the roof reflective surfaces are present in the optical path between the refractive optical system 536 and the plate 9. The roof reflective surfaces may be arranged in the optical path between the mask 8 and the refractive optical system. Considering negative influence due to errors of the roof reflective surfaces, the roof reflective surfaces are preferably set near the plate 9.

The reflective member 513 is composed of the plane surface reflective mirrors in the modification of FIG. 30, but it may be constructed of a right-angle roof prism.

In the forth and fifth embodiments-shown in FIG. 29 and FIG. 30, the field stop cannot be disposed in the optical path of the projection optical system. In such cases, the field stop may be disposed in the optical path of the illumination optical system.

Figure 32A:
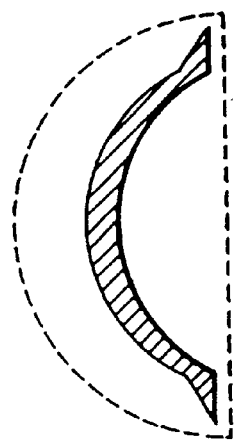
FIGS. 32A to 32C are planar views to show some modification of a field stop used in the third, fourth and fifth embodiment of the projection optical system.
Figure 32B:
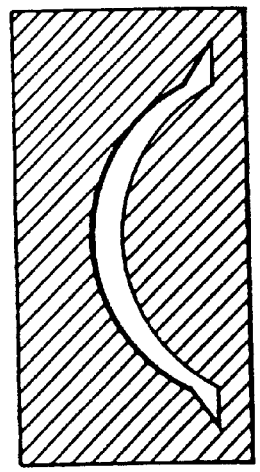
Figure 32C:
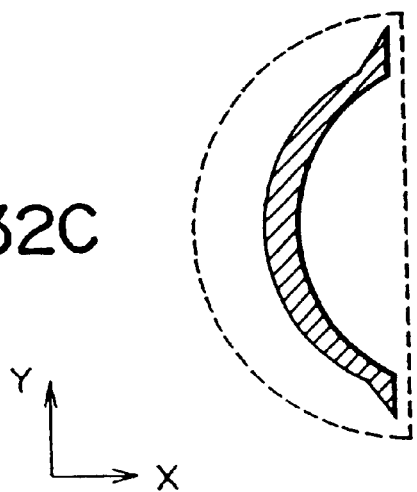

Also, the fifth and forth embodiments showed the trapezoid exposure regions, but the shape of exposure region is not limited to trapezoid. For example, as shown in FIGS. 32A, 32B, and 32C, the exposure region may be arcuate. FIG. 32A is a plan view to show a relation between the effective field region and the arcuate field of the first projection optical system in the XY plane on the mask 8, FIG. 32B is a plan view of a field stop with an arcuate aperture portion, and FIG. 32C is a plan view to show a relation between the effective exposure region and the arcuate exposure region of the first projection optical system.

In FIG. 32A, the effective field region of the first projection optical system (the maximum field region obtainable by the first projection optical system) is a semi-circular region surrounded by the dashed line on the mask 8. Here, if the shape of the aperture portion in the field stop is arcuate as shown in FIG. 32B, the field region of the first projection optical system on the mask 8 is of an arc similar to the shape of the aperture portion. This arc includes two contours of circular parts with different centers of curvature in the X direction but with a same radius of curvature, and contours of right-angle triangle parts in the Y-directional end portions. As shown in FIG. 32C, the effective exposure region of the first projection optical system on the plate 9 (the maximum exposure region obtainable by the first projection optical system) is a semi-circular region surrounded by the dashed line. Here, the arcuate aperture portion in the field stop defines the exposure region on the plate 9 in an arcuate shape similar to the aperture portion. This arcuate exposure region is within the effective exposure region of the first projection optical system. In this arrangement of the arcuate exposure region, the spacing in the X direction between the centers of curvature of the contours of circular parts is the slit width, and the portions of right-angle triangular contours are overlap regions (regions overlapping in the Y direction with exposure regions of adjacent second projection optical systems).

When the arcuate exposure region is employed as shown in FIGS. 32A, 32B, and 32C, portions with a nearly constant image height are used in the projection optical system. In that case, a requirement is that the projection optical system is corrected for aberration at a specific image height, which enjoys an advantage of simplifying the optical designing.

In the above-described embodiments the refractive powers of the lens groups in the refractive optical system are arranged so as to be positive, negative, and positive in this order. It is, however, needless to mention that the arrangement of refractive powers in the refractive optical system is not limited to this arrangement.

In the third, forth and fifth embodiments, the first and second partial optical systems may be replaced by the Offner optical system or the Dyson optical system. However, the partial optical systems of the present invention may have a smaller diameter of optical system than the Offner optical system, and may have a longer working distance than the Dyson optical system.

In the above third, forth and fifth embodiments, as similar to the described in the first-and second embodiments, they can also provide the exposure apparatus which can perform projection exposure under excellent optical performance without a decrease in throughput even for a large exposure region.

Next the sixth embodiment of the projection optical system will be explained below, referring to FIGS. 33–38D. The combination of projection optical systems 630 and 640 shown in FIG. 33 corresponds to the projection optical system 2a of the first embodiment. The mask 8, the plate 9 and the other except for the projection optical system are the same as those of the first embodiment.

Figure 33:
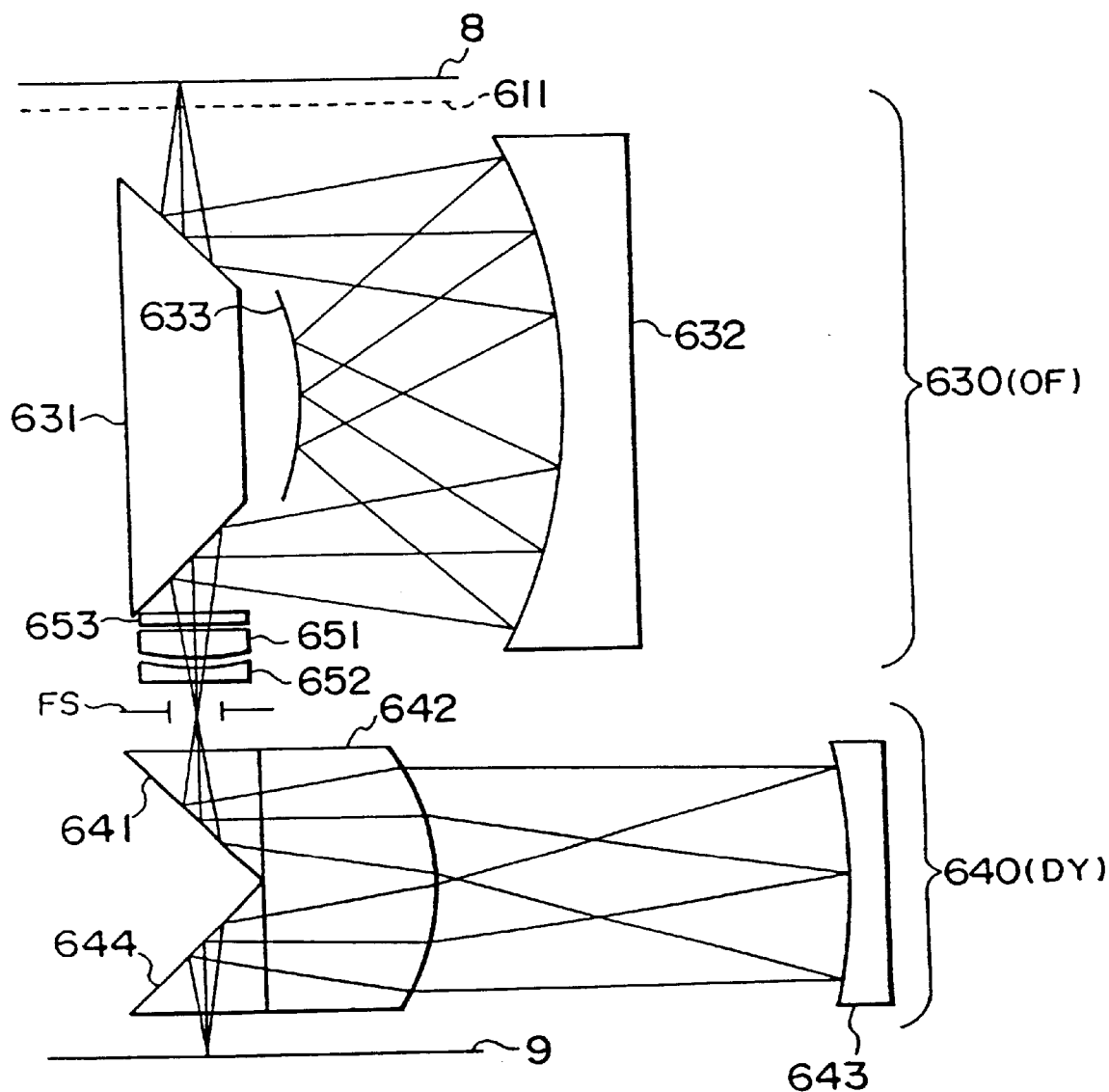
FIG. 33 is a side cross-sectional view to show a sixth embodiment of a projection optical system applied to the exposure apparatus according to the present invention.

In FIG. 33, the mask 8 is placed so that the circuit pattern thereof faces down in the drawing (to the projection optical system). Further, a pellicle film 611 for preventing a trouble due to attachment of dust to the circuit pattern is provided on the circuit pattern side of the mask 8.

The projection optical system of FIG. 33 has a first image-forming optical system 630 for forming a primary image of mask 8, a field stop FS disposed at a position of the primary image, and a second image-forming optical system 640 for forming a secondary image of mask 8 on the plate 9, based on light from the primary image, wherein the first image-forming optical system 630 is constructed of an Offner optical system OF and the second image-forming optical system 640 of a Dyson optical system DY. Here, the Offner optical system OF has a trapezoid mirror 631 with two reflective surfaces inclined relative to the XY plane (mask surface), a concave mirror 632, and a convex mirror 633. Further, the Dyson optical system DY has a prism 641 having a totally reflective surface inclined relative to the XY plane (plate surface), a plano-convex lens component 642, a concave mirror 643, and a prism 644 having a totally reflective surface inclined relative to the XY plane.

Light from the mask 8 illuminated is deflected about 90° by one reflective surface of the trapezoid mirror 631, thereafter travels via the concave mirror 632 and convex mirror 633 in this order, is again reflected by the concave mirror 632, and then reaches the other reflective surface of the trapezoid mirror 631. The light reaching this reflective surface is deflected about 90°, and thereafter reaches the aperture portion in the field stop FS to form an intermediate image of mask 8 there. Here, the intermediate image of mask 8 is an image with the lateral magnification in the X direction being +1 and the lateral magnification in the Y direction being −1.

The light from the intermediate image formed on the field stop FS is deflected about 90° in optical path thereof by the prism 641, thereafter travels via the plano-convex lens component 642, the concave mirror 643, and the plano-convex lens component 642 in the named order to reach the prism 644, and is deflected about 90° in optical path thereof by the prism 644 to form an image of the intermediate image (secondary image of mask 8). Here, the image of the intermediate image is an image with the lateral magnification in the X direction being +1 and the lateral magnification in the Y direction being −1 with respect to the intermediate image. Namely, the secondary image on the plate 9 is a real-size erect image with both the lateral magnifications in the X direction and the Y direction being +1 with respect to the mask 8.

Here in the sixth embodiment, the Offner optical system OF is arranged as the first image-forming optical system 630 on the mask 8 side, while the Dyson optical system DY as the second image-forming optical system 640 on the plate 9 side. The reason is as follows. In recent years, there are many cases where the pellicle film is provided on the circuit pattern side of mask 8 as shown in FIG. 33. In such cases, the working distance to the mask 8 needs to be extended. However, the Dyson optical system generally has a property that spherical aberration becomes uncorrectable with an extended working distance. Here, the working distance could be extended if refractive indices of the prisms 641, 644 should be made larger than that of the plano-convex lens component 642. This technique, however, can earn only a working distance of several mm. There are some cases where a magnification adjusting optical system or an-image position correcting optical system as described below is provided in the projection optical system. Thus, if the working distance of the projection optical system itself is short, it becomes difficult to dispose such a magnification adjusting optical system or image position correcting optical system therein.

Thus, the sixth embodiment employs the Offner optical system OF with a long working distance on the mask 8 side. This is effective for the mask 8 with the pellicle film 611. Further, because the spacing between the Offner optical system OF and the intermediate-image-formed position (the position of field stop) is extended, there is an advantage that the magnification adjusting optical system and the image position correcting optical system can be disposed at this position.

The above magnification adjusting optical system is next described referring to FIG. 33. As shown in FIG. 33, the sixth embodiment is so arranged that a magnification adjusting optical system consisting of a plano-convex lens 651 and a plano-concave lens 652 is disposed in the optical path between the Offner optical system 630(OF).and the Dyson optical system 640(DY). These plano-convex lens 651 and plano-concave lens 652 each are arranged so as to be movable along the optical axis (or in the Z-axis direction in this case). Here, moving the plano-convex lens 651 and plano-concave lens 652 in the optical-axis direction, the lateral magnification changes for the intermediate image of mask 8 formed on the field stop FS. Accordingly, it becomes possible to change the projection magnification of the entire projection optical system composed of the Offner optical system 630(OF) and the Dyson optical system 640(DY).

In the sixth embodiment, at least three set of the combination of the Offner optical system and the Dyson optical system are provide and each of the Offner optical systems forms intermidiate image or illumination region in the mask 9 in and each of the Dyson optical system forms an image (which is secondary image of the illumination region) of the intermidiate images on exposure regions 9a 9b or 9c on the plate 9. The secondary image is an real-erect image of the illumination region.

Figure 34:
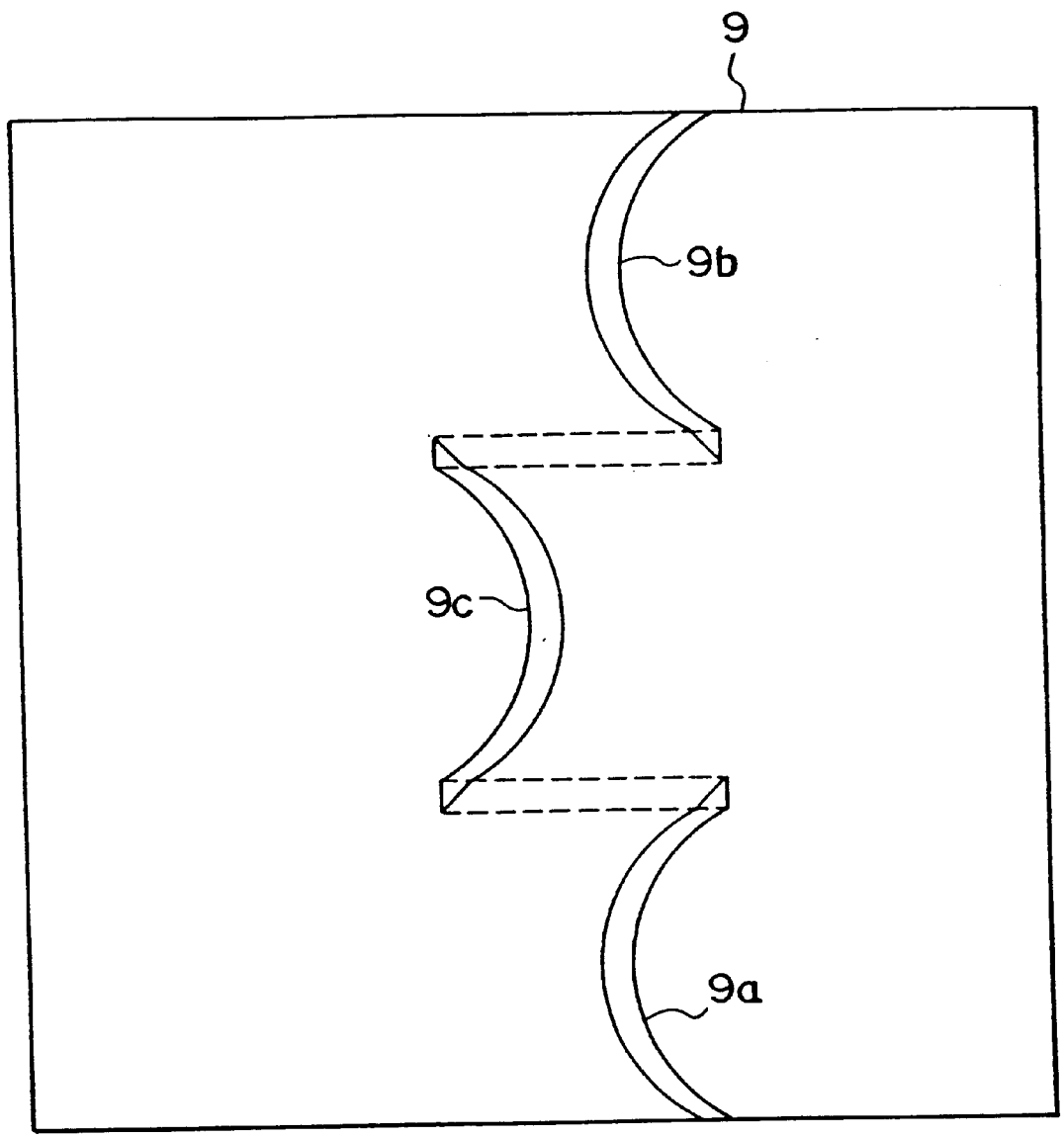
FIG. 34 is a planar view to show arrangment of exposure regions on a plate in the exposure apparatus in which the projection optical system of the sixth embodiment is applied.

As shown in FIG. 34, exposure regions 9a–9c on the plate 9 are adjacent to each other as overlapping by a predetermined amount in the Y direction. Here, overlapping regions between the respective exposure regions 9a–9c are called as overlap regions. In an overlap region, a sum of X-directional lengths (slit widths) of the exposure regions 9a, 9c is determined so as to be always constant at any position in the Y direction. Similarly, a sum of X-directional lengths (slit widths) of the exposure regions 9b, 9c is determined so as to be always constant at any position in the Y direction. Accordingly when the exposure is performed while the mask 9 and the plate is moved integrally along to a direction X shown in FIG. 33, as similar to the first embodiment, all of circuit patterns on the mask 8 is sequencially transferred on the plate 9.

Next described referring to FIGS. 35A–35D is the exposure region obtainable by the projection optical system according to the sixth embodiment. FIG. 35A is a drawing to show a developed state of optical paths in the projection optical system. The Offner optical system OF and the Dyson optical system DY shown in FIG. 35A have a common optical axis Ax. In the sixth embodiment, "to have a common optical axis Ax" means that image heights of principal rays of light beams traveling from the Offner optical system OF to the Dyson optical system DY (or light beams traveling from the Dyson optical system DY to the Offner optical system OF) are equal to each other.

Here, the maximum field that can be achieved by the Offner optical system OF is semi-circular, as shown in FIG. 35B, because the light beams are eclipsed by the convex mirror 633. Also, the Offner optical system has astigmatism, and the slit width d is determined by a region of image heights little affected by the astigmatism. The maximum field that can be achieved by the Dyson optical system DY is semi-circular as shown in FIG. 35C. Thus, the field of the entire projection optical system is determined by the field of the Offner optical system if the field of the Dyson optical system covers the field of the Offner optical system. In other words, in the case where the maximum image height YDY of the Dyson optical system DY is larger than the maximum image height YOF of the Offner optical system OF (or if YOF≦YDY), the field of the Offner optical system OF is the field of the entire projection optical system. FIG. 35D shows the field of the entire projection optical system.

In scanning exposure it is required that the length in the scanning direction, of the exposure region for scanning the plate (the slit width of the exposure region) is always constant at any position in the direction perpendicular to the scanning direction in order to keep exposure amounts constant in the direction perpendicular to the scanning direction. Accordingly, the shape of the exposure region formed on the plate should be an arcuate shape consisting of two contours of circular parts with centers thereof deviating by the slit width d in the scanning direction and with a same radius of curvature, as shown in FIG. 35E. In this case, the arcuate exposure region should be within the scope of the field of the entire projection optical system as shown in FIG. 34D.

In the case where scanning exposure is made with the plurality of exposure regions 9a–9c as shown in FIG. 34, the X-directional length of each exposure region 9a–9c needs to be kept always constant at any position in the Y direction, as described previously. In this case, the arcuate exposure region of each projection optical system is preferably an exposure region, as shown in FIG. 36, having contours consisting of two circular parts with centers thereof deviating by the slit width d in the scanning direction and with a same radius of curvature and triangular parts added to the Y-directional ends of these circular parts, because a wide exposure area can be secured.

Now, for example in fabricating liquid crystal panels of the active matrix type using the exposure apparatus according to the sixth embodiment, overlapping exposures of plural pattern layers become necessary in fabrication steps in order to form the active devices. Here, a process treatment is conducted after pattern exposure for a certain layer, and there are cases where the plate 9 expands or contracts in this process treatment.

In that case, it is necessary to adjust the projection magnification of mask 8 in accordance with expansion or contraction of plate 9. In case of normal exposure apparatus with a single projection optical system, the projection magnification of mask 8 can be adjusted by controlling only the magnification (lateral magnification) of projection optical system; whereas, in case of exposure apparatus with a plurality of projection optical systems as in the sixth embodiment, adjusting magnifications of individual projection optical systems would result in causing a problem that the plurality of exposure regions 9a–9c lose mutual overlap or gain excessive overlap on the plate 9. Here, the loss of mutual overlap between the plurality of exposure regions 9a–9c causes a problem of an internal missing region without transferred circuit pattern extending in the scanning direction (X direction) on the plate 9; the excessive overlap between the plural exposure regions 9a–9c causes a problem of excessive exposure amount in the excessively overlapping regions, resulting in errors in linewidth of the circuit pattern after developed.

Thus, the sixth embodiment is so arranged that a plane-parallel plate 653 as shown in FIG. 33 is further provided as rotatable about the X-axis and Y-axis directions as the image position correcting optical system in the optical path between the first image-forming optical system 630a–630c and the second image-forming optical system 640a–640c. Then, on the occasion of magnification adjustment of the projection optical system with the plano-convex lens 651 and plano-concave lens 652 as shown in FIG. 33, the plane-parallel plate 653a–653c is inclined about the X-axis direction so as to adjust the positions of the plural exposure regions 9a–9c in the Y direction.

This enables the circuit pattern to be always well transferred onto the plate 9 even if adjustment of magnification is conducted for each projection optical system.

In the case where the magnification of each projection optical system is adjusted by the magnification correcting optical system 651, 652 and where the image position correcting optical system 653a–653c is adjusted about the X-axis direction as described above, the adjustment is limited to only the adjustment of projection magnification in the Y-axis direction. However, the magnification between the mask 8 and the plate 9 in the scanning direction (X-axis direction) can be changed by inclining the plane-parallel plate 653a–653c about the Y-axis direction in the scanning exposure. Here, the plane-parallel plate 653a–653c as the image position correcting optical system is preferably constructed so as to rotate about the Y axis in correspondence to the scanning speed of the mask 8 and plate 9 carried by unrepresented stages.

Figure 37:
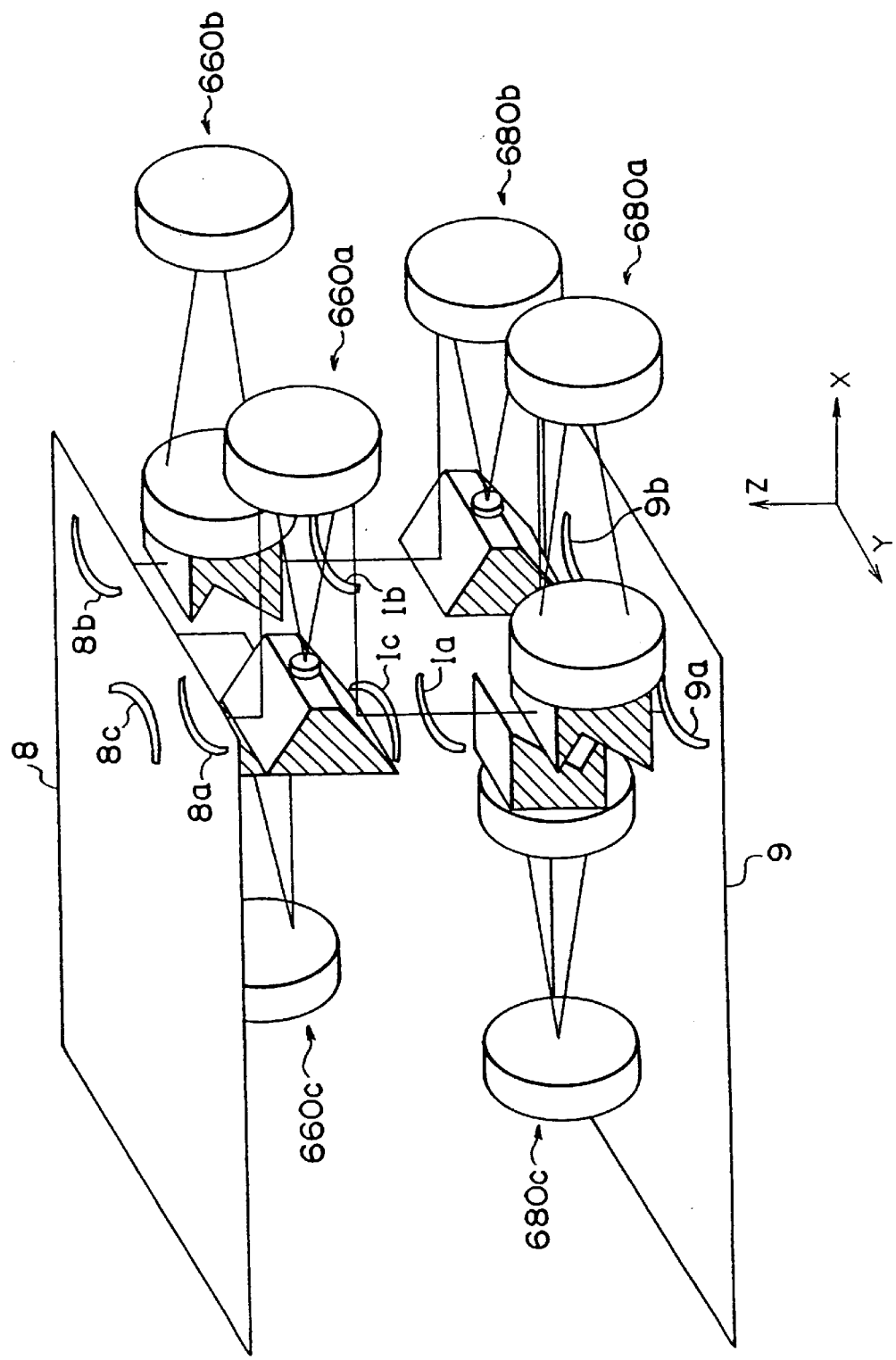
FIG. 37 is a perspective view to schematically show the modification of the sixth embodiment of the projection optical system.

Also, aberrations arising from the Offner optical system OF in itself can be reduced by loosening curvatures of the concave mirror 632 and convex mirror 633 in the Offner optical system OF; in that case, the slit width of the field of the Offner optical system OF in itself can be expanded. In case of a zigzag arrangement of three or more projection optical systems, there is a possibility that projection optical systems adjacent to each other in the Y direction interfere with each other especially if the diameters of the Offner optical systems in the projection optical systems become larger. In such cases, two projection optical systems adjacent to each other in the Y direction may be so arranged, as shown in FIG. 37, that for one projection optical system the first image-forming optical system 660a is the Offner optical system OF and the second image-forming optical system 680a is the Dyson optical system DY and that for the other projection optical system, inversely, the first image-forming optical system 660b is the Dyson optical system DY and the second image-forming optical system 680b is the Offner optical system OF.

In the sixth embodiments shown in FIGS. 33–37, the Offner optical system OF and Dyson optical system DY composing the projection optical system are arranged to have the common optical axis Ax as shown in FIG. 35A. Here, the Offner optical system OF and Dyson optical system DY composing the projection optical system may be constructed in a state that the optical axes thereof are decentered from each other.

Next described referring to FIGS. 38A–38E are the construction of a projection optical system in which the optical axis of the Dyson optical system DY is decentered with respect to the Offner optical system OF, and the exposure region that can be achieved thereby. FIG. 38A is a drawing to show a developed state of optical paths in the projection optical system. In FIG. 38A, the Offner optical system OF and the Dyson optical system DY composing the projection optical system are in a state that the respective optical axes AxOF, AxDY are decentered from each other. The state that the optical axes AxOF, AxDY are decentered from each other means that image heights of principal rays of light beams traveling from the Offner optical system OF to the Dyson optical system DY (image heights relative to the optical axis AxOF of the Offner optical system OF) are different from image heights of principal rays of light beams traveling from the Dyson optical system DY to the Offner optical system OF (image heights relative to the optical axis AxDY of the Dyson optical system DY).

As shown in FIG. 38B, the maximum field that can -be achieved by the Offner optical system OF is semi-circular because the light beams are eclipsed by the convex mirror 633. Also, the Offner optical system has astigmatism, and the slit width d is determined by the scope of image heights little affected by the astigmatism. Further, the maximum field that can be achieved by the Dyson optical system DY is semi-circular as shown in FIG. 38C.

FIG. 38D shows the field of the entire projection optical system. In this case, the maximum field region obtainable by the projection optical system is an overlap region between the arcuate field of the Offner optical system OF and the semi-circular field of the Dyson optical system DY as represented by the hatched lines in the drawing.

As described previously, it is required in scanning exposure that the length in the scanning direction, of the exposure region for scanning the plate (slit width of the exposure region) is always constant at any position in the direction perpendicular go the scanning direction. Accordingly., the shape of the exposure region formed on the plate is an arcuate shape, as shown in FIG. 38E, having contours of two circular parts with centers thereof deviating by the slit width d in the scanning direction and with a same radius of curvature and triangular parts added to the Y-directional ends of the circular parts. This arcuate exposure region is within the range of the Field of the entire projection optical system shown in FIG. 38D.

In the case where the optical axes AxOF, AxDY of the Offner optical system OF and the Dyson optical system DY are decentered from each other, the region 613 shown in FIGS. 38C–38E is a region where no light beam passes. Thus, this region 613 may be cut off upon producing the Dyson optical system DY. In this case, a cross-sectional profile in the direction perpendicular to the optical axis AxOF of the lens component 642 in the Dyson optical system DY is elliptic. This arrangement permits the prisms 641, 644 in the Dyson optical system DY to be constructed in a small size, or to have shorter optical path lengths, which expands the spacing between the lens component 642 or the prism 644 and the plate 9, thus presenting an effect of extending the working distance of the Dyson optical system DY itself.

It is thus understood that if the working distance of the Dyson optical system DY is very short, it is effective to decenter the optical axes AxOF, AxDY of the Offner optical system OF and the Dyson optical system DY from each other.

As described above, the exposure apparatus in the sixth embodiment according to the present invention includes such advantages that with the Offner optical system OF used on the mask side, the working distance on the mask side can be taken long, which is ready for masks with a pellicle film or the like attached thereto and whereby the magnification adjusting optical system and the image position correcting optical system may be set in the optical path.

If the optical path lengths of the prisms 641, 642 in the Dyson optical system DY are set short, the working distance of the Dyson optical system DY can be extended. In this case, glass corresponding to the shortened parts of the optical path length in the prisms 641, 644 may be used for the magnification adjusting optical system and the image position correcting optical system.

If the Offner optical system OF and the Dyson optical system DY have the common optical axis Ax, the concave mirror 633 in the Offner optical system OF may be replaced by a lens component such as a doublet. In this case, reflection on the back face of the lens component is used instead of reflection by the concave mirror 633, thereby correcting chromatic aberration caused in the Dyson optical system DY. Also, astigmatism caused in the Offner optical system OF can be corrected by the Dyson optical system, which enables the slit width to be set relatively large.

In the above sixth embodiment, the merits obtained in the first to fifth embodiments can be also obtained.

Further, because the exposure apparatus according to the sixth embodiment uses the so-called Offner optical system as the first image-forming optical system, the working distance can be extended without degrading spherical aberration. Generally, the Offner optical system is corrected for astigmatism only in portions at a specific image height. In the sixth embodiment, because the so-called Dyson optical system is used as the second image-forming optical system, astigmatism generated by the first image-forming optical system can be corrected, thus expanding the image-height range for excellent image-forming performance. Namely, the slit width can be fully secured upon scanning exposure.

Next the seventh embodiment of the projection optical system will be explained below, referring to FIGS. 39 and 40.

Figure 39:
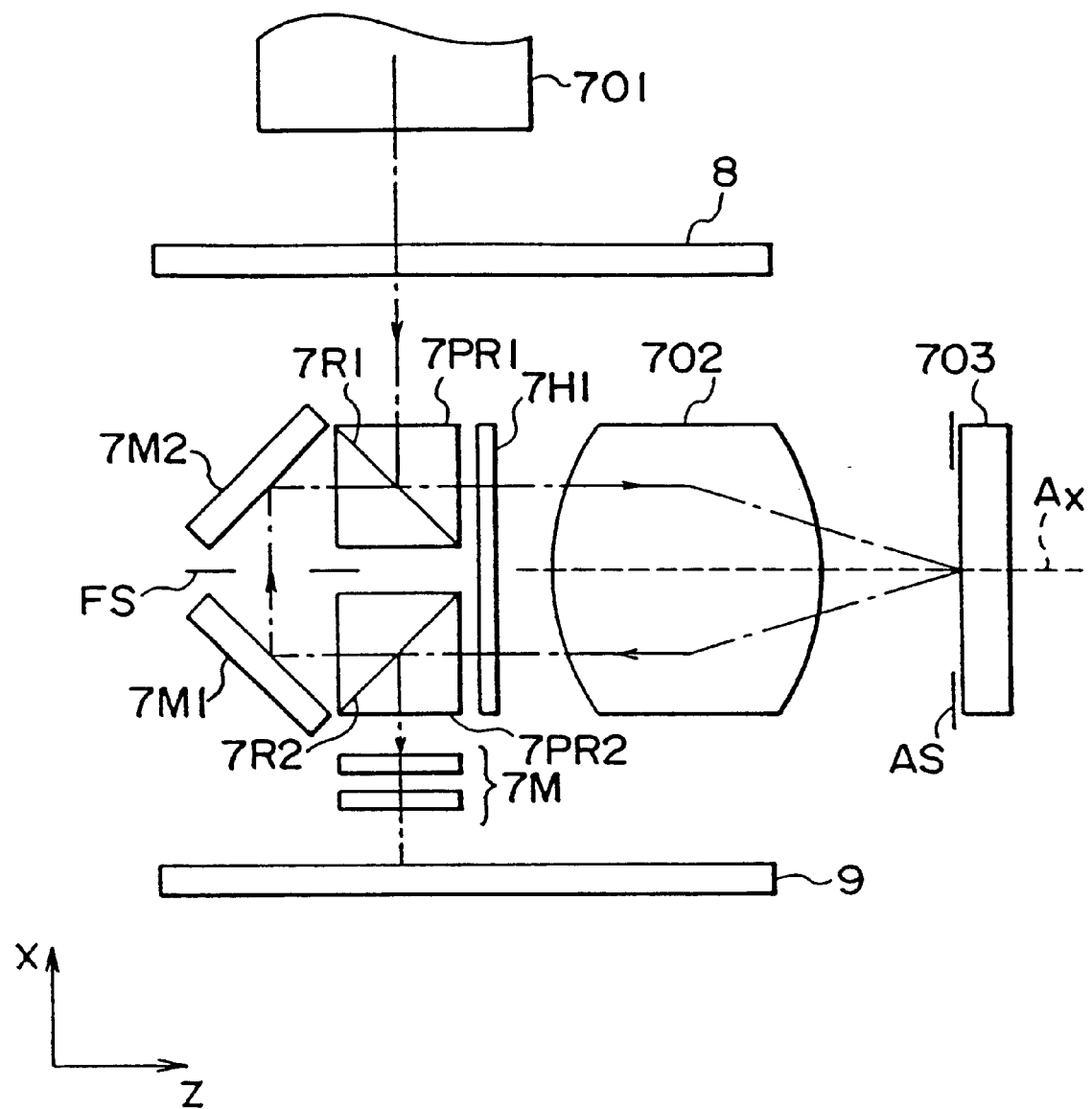
FIG. 39 is a side cross-sectional view to show the structure of the seventh embodiment of the projection optical system.

FIG. 39 is a plan view to show the seventh embodiment of the projection optical system. The directions referred below is the same as those of the previous embodiments, and elements except for the projection optical system are the same as those of the first embodiment.

In FIG. 39, provided between the mask 8 and the plate 9 are a lens unit 702 and a plane reflective mirror 703 having the optical axis Ax parallel to an in-plane direction (YZ direction) of these mask 8 and plate 9. Here, the lens unit 702 has a positive refractive power, and the plane reflective mirror 703 is disposed at a position of the rear focal point of the lens unit 702. This arrangement makes rays entering the lens unit 702 in parallel with the optical axis Ax emergent from the lens unit 702 in parallel with the optical axis Ax.

On the opposite side of the lens unit 702 to the plane reflective mirror 703 there are polarizing beam splitters 7PR1, 7PR2 arranged as the first and second light splitting means. These polarizing beam splitters 7PR1, 7PR2 are constructed in such a structure that a polarization separating surface 7R1, 7R2, being a dielectric multilayer film for separating light beams with mutually orthogonal polarization directions from each other, is set on a junction plane in a prism type beam splitter. Here, the polarization separating surfaces 7R1, 7R2 are inclined at ±45° relative to the in-plane direction (YZ direction) of the mask 8 and plate 9.

Two reflective mirrors 7M1, 7M2 with mutually orthogonal reflective surfaces are placed as the beam transferring means on the opposite side to the lens unit 702 with respect to the polarizing beam splitters 7PR1, 7PR2. Further, a quarter wave plate 7H1 is provided as the phase changing member in the optical path between the polarizing beam splitters 7PR1, 7PR2 and the lens unit 702. Here, an aperture stop AS is provided near the reflective surface of the plane reflective mirror 703, and a field stop FS having an aperture portion in a predetermined shape is provided in the optical path between the reflective mirror 7M1 and the reflective mirror 7M2.

On the opposite side of the projection optical system as described above with respect to the mask 8 there is provided an illumination optical system 701 for irradiating linearly polarized light with an oscillation plane in the direction normal to the plane of the drawing (s-polarized light with respect to the polarization separating surface 7R1 in the polarizing beam splitter 7PR1) to a predetermined field region on the mask 8.

Now, the s-polarized light from the illumination optical system 701 and through the mask 8 advances along the X direction, is reflected by the polarization separating surface 7R1 in the polarizing beam splitter 7PR1, and then is deflected so that the optical path thereof runs along the Z direction. This s-polarized light passes through the quarter wave plate 7H1 to be converted into circularly polarized light and thereafter the circularly polarized light enters the lens unit 702. The circularly polarized light passing through the lens unit 702 is reflected by the plane reflective mirror 703 and again passes through the lens unit 702 and the quarter wave plate 7H1 in this order to be converted into p-polarized light. This p-polarized light advances along the Z direction in the drawing and passes through the polarization separating surface 7R2 in the polarizing beam splitter 7PR2. Then the p-polarized light is deflected 90° in optical path thereof by the reflective mirror 7M1 so that the optical path thereof runs along the X direction, and next reaches the field stop FS. At this position, an intermediate image of mask 8 is formed in the aperture portion of the field stop FS. The lateral magnifications of the intermediate image are +1 for the Z direction and −1 for the Y direction.

Next, the p-polarized light from the intermediate image is deflected 90° by the reflective mirror 7M2 to advance along the Z direction and again to enter the polarizing beam splitter 7PR1. This p-polarized light passes through the polarizing beam splitter 7PR1, and then is converted through the quarter wave plate 7H1 into circularly polarized light, which enters the lens unit 702. The circularly polarized light entering the lens unit 702 is reflected by the plane reflective mirror 703, and thereafter again passes through the lens unit 702 and the quarter wave plate 7H1 to be converted into s-polarized light advancing along the Z direction. The s-polarized light is then incident into the polarizing beam splitter 7PR2. This s-polarized light is reflected by the polarization separating surface 7R2 in the polarizing beam splitter 7PR2 to advance along the X direction. Then the s-polarized light passes through a magnification correcting optical system M composed of convex and concave lenses finely movable along the X direction to reach the plate 9. An image of the field stop FS is formed on the plate 9 with the lateral magnification in the Z direction being +1 and the lateral magnification in the Y direction being −1. That is, a real-size erect image (secondary image) of mask 8 is formed on the plate 9 with the X-directional and Z-directional lateral magnifications both being +1. Accordingly, moving the mask 8 and plate 9 together in the Z direction, the pattern on the mask 8 can be serially transferred onto the plate 9, thus realizing scanning exposure.

The magnification correcting optical system 7M as described above is provided in order to get ready for expansion or contraction etc. of substrate in various processes. This can change the magnification of the projection optical system itself in the range of 1 to slight enlargement or reduction.

Figure 40:
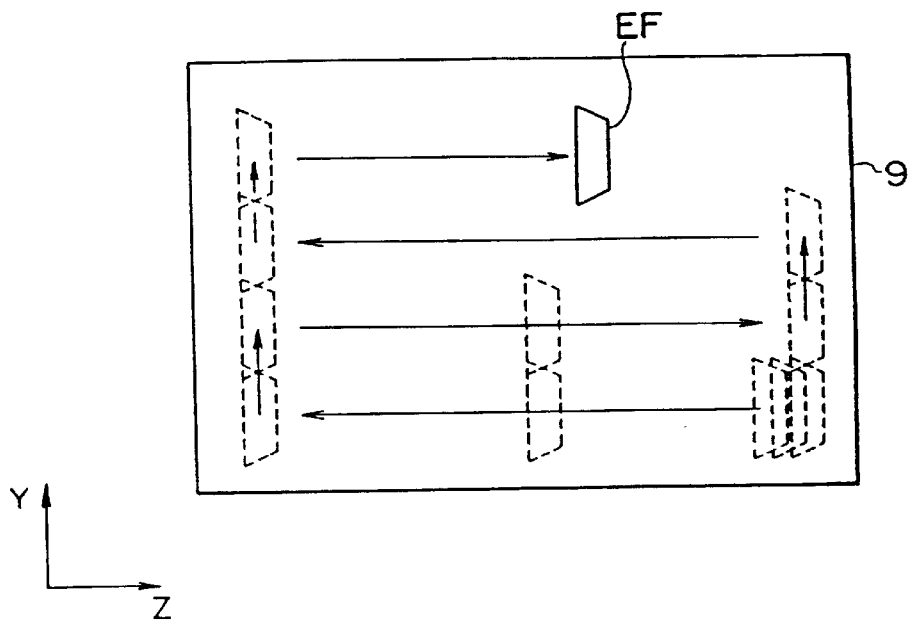
FIG. 40 is a planer view to explain an exposure operation in the seventh embodiment.

The exposure operation by the present embodiment is next described briefly referring to FIG. 40. FIG. 40 is a plan view to show a relation between the plate 9 and the exposure region EF in the present embodiment. In FIG. 40, the vertical direction in the plane of drawing is the Y direction, the horizontal direction in the plane of drawing is the Z direction, and the direction normal to the plane of drawing is the x direction. This coordinate system of FIG. 40 corresponds to that of FIG. 39.

In FIG. 40, the trapezoid exposure region EF is first located at the corner (at edges in the Y direction and Z direction). Here, moving the mask 8 and plate 9 together in the Z direction (scanning direction) with respect to the exposure region EF, the pattern of mask 8 is transferred to a part of plate 9. Then, the mask 8 and plate 9 are moved in the Y direction (step direction). On this occasion, an amount of movement in the step direction may be determined so that an overlap region of the trapezoid exposure region EF before movement overlaps with that after movement. The overlap region in the trapezoid exposure region means an exposure region corresponding to a region where a plurality of exposures are made on the plate 9 by a plurality of exposure regions or a single exposure region. For example, breaking a trapezoid into a rectangle and two triangles on either side of the rectangle in the Y direction, the regions corresponding to these triangles are overlap regions.

After that, the mask 8 and plate 9 are moved along the Z direction, i.e., in the opposite direction to the first scanning exposure, thereby serially transferring the pattern of mask 8 onto the plate 9. After this second scanning exposure, the mask 8 and plate 9 are moved along the Y direction and third scanning exposure is carried out. In this manner, the present embodiment is so arranged that the moving operation along the Z direction (scanning exposure operation) and the moving operation along the Y direction (step operation) are repeated to transfer the pattern on the entire surface of mask 8 onto the plate 9. This is ready for a large exposure region without an increase in the size of projection optical system.

The shape of the exposure region EF is not limited to trapezoid, but may be for example hexagonal, slit, or arcuate. That is to say, the shape of the exposure regions of the previous embodiments can be also applied to the seventh embodiments.

The seventh embodiment employed such an arrangement that an exposure amount in the overlap region was made equal to that in the exposure region 10 other than the overlap region by the shape of the aperture portion in the field stop FS, but a light-reducing filter or a filter with dot patterns may be provided at the end portions of the aperture portion in the field stop.

In the seventh embodiment, there is a possibility that where there are fabrication errors of the quarter wave plate 7H1 or the polarizing beam splitter 7PR1, s-polarized light is mixed in the p-polarized light traveling from the lens unit 702 to the field stop FS whereby the s-polarized light component reaches the plate 9. There is also a possibility that where there are fabrication errors of the polarization beam splitter 7PR2, this polarizing beam splitter 7PR2 reflects the p-polarized light traveling from the lens unit 2 to the field stop FS whereby the p-polarized light reaches the plate 9.

In such cases, the primary image and secondary image of mask are formed on the plate 9, causing a problem of defects in transfer of pattern on the mask 8. In this case, it is preferred that a focus correcting optical system with a predetermined refractive power be provided in the optical path running from the polarizing beam splitter 7PR2 to the polarizing beam splitter 7PR1. This focus correcting optical system can differentiate the position of the primary image of mask from the position of the secondary-image of mask in the X direction, which can make the influence of the primary image of mask ignorable on the plate 9.

On this occasion, the primary image of mask 8 is formed by the light passing only the optical system consisting of the lens unit 702 and the plane reflective plate 703 and the magnification correcting optical system M, while the secondary image of mask 8 is formed by the light passing the optical system, magnification correcting optical system M, and focus correcting optical system. Accordingly, adjusting the refractive powers of the magnification correcting optical system M and focus correcting optical system, it becomes possible that while the position of the primary image is shifted from that of the secondary image in the X direction, the magnification of the secondary image is adjusted to 1 or a magnification corresponding to expansion or contraction of substrate. Also, the magnification correcting optical system M and focus correcting optical system both may be placed in the optical path running from the polarizing beam splitter 7PR2 to the polarizing beam splitter 7PR1.

Figure 41:
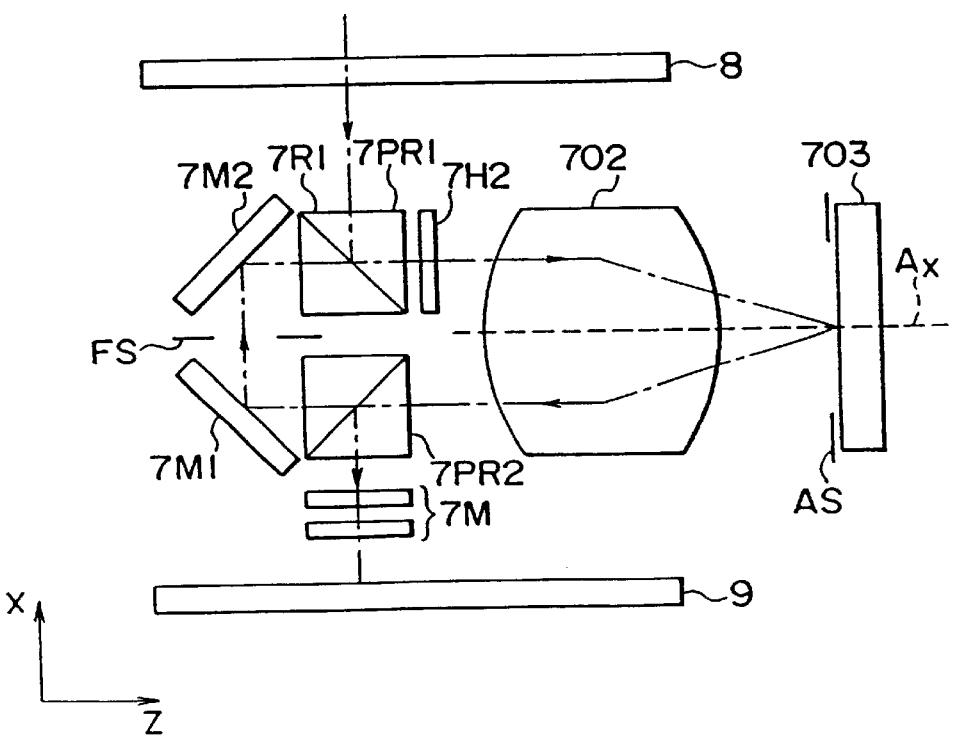
FIG. 41 is a side cross-sectional view to show the structure of the first modification of seventh embodiment of the projection optical system.

Next, a modification of the seventh embodiment is described referring to FIG. 41. This modification is an example in which the quarter wave plate 7H1 as the phase changing member in the present embodiment is replaced by a half wave plate 7H2 provided in the optical path between the polarizing beam splitter 7PR1 and the lens unit 702. In FIG. 41, members with like functions as those in the embodiment of FIG. 39 are denoted by the same reference numerals, and the same coordinate system as in FIG. 39 is employed herein.

In FIG. 41, light from the mask 8 illuminated by linearly polarized light in the direction perpendicular to the plane of the drawing (s-polarized light with respect to the polarization separating surfaces 7R1, 7R2 in the polarizing beam splitters 7PR1, 7PR2), similarly as in the first embodiment, is reflected by the polarization separating surface 7R1 in the polarizing beam splitter 7PR1, and thereafter passes through the half wave plate 7H2 to be converted into p-polarized light. This p-polarized light passes the lens unit 702, plane reflective mirror 703, and lens unit 702 in this order, and thereafter passes through the polarizing beam splitter 7PR2. Then the optical path of the p-polarized light is deflected 90° by the reflective mirror 7M1 to reach the field stop FS. Here, a primary image of mask 8 is formed in the aperture portion of field stop FS with the Z-directional lateral magnification being +1 and the Y-directional lateral magnification being −1, similarly as in the present embodiment. The optical path of the p-polarized light from the primary image is deflected 90° by the reflective mirror 7M2, and thereafter the p-polarized light passes through the polarizing beam splitter 7PR1 and then through the half wave plate 7H2 to be converted into s-polarized light. This s-polarized light passes the lens unit 702, plane reflective mirror 703, and lens unit 702 in this order and thereafter is reflected by the polarizing beam splitter 7PR2 to pass through the magnification correcting optical system M and then to reach the plate 9. By this, a real-size erect image of mask 8 is formed on the plate 9 with the Y-directional and Z-directional lateral magnifications both being +1. In this manner, the half wave plate 7H2 can also be applied as the phase changing member.

Figure 42A:
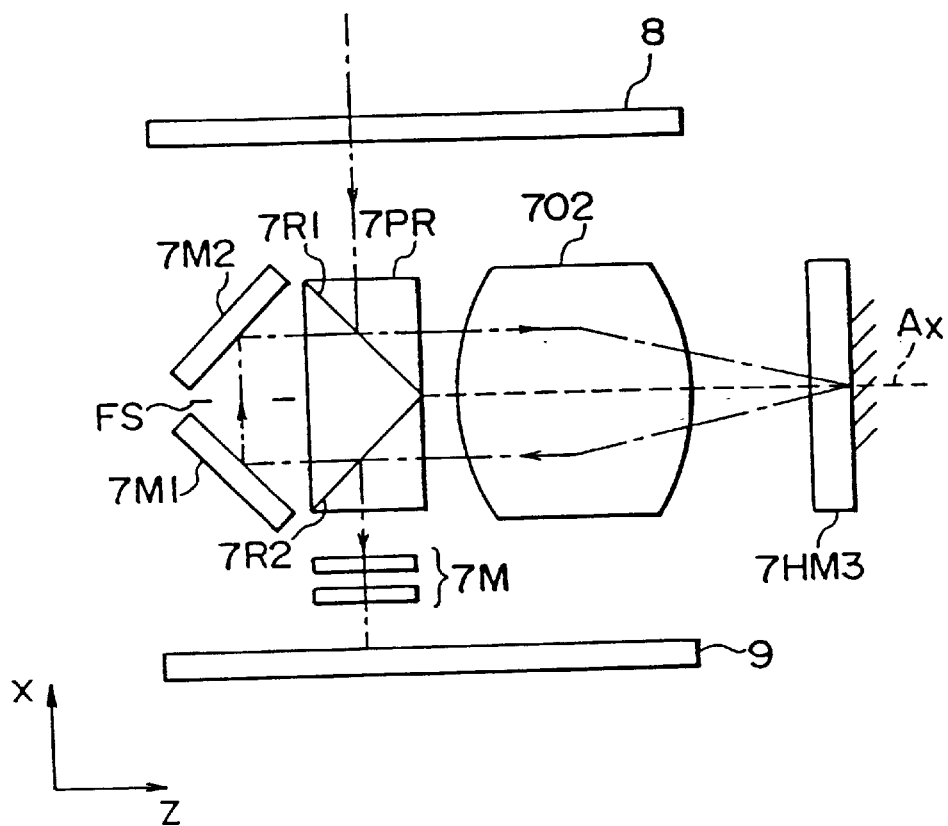
FIGS. 42A and 42B are side cross-sectional views to show the structure of the second modification of the seventh embodiment of the projection optical system and a field thereof.
Figure 42B:
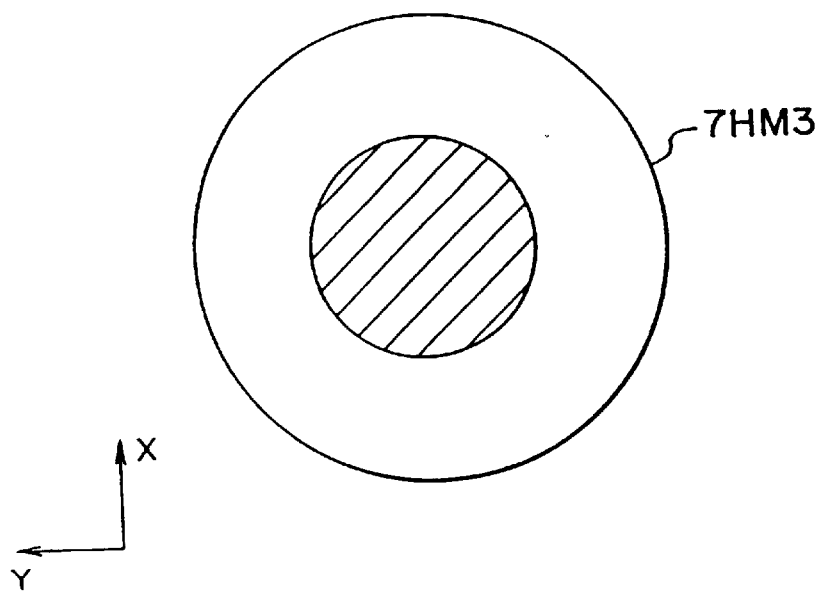

Another modification of the present embodiment is next described referring to FIGS. 42A and 42B. The, second modification according to the present invention is an example in which the quarter wave plate 7H1 as the phase changing member in the present embodiment is formed integrally with the plane reflective mirror 703. In FIG. 42A members with like functions as those in the present embodiment are denoted by the same reference numerals, and the same coordinate system as in FIG. 39 is employed.

The second modification shown in FIG. 42A is different from the present embodiment in that the two polarizing beam splitters 7PR1, 7PR2 are made integral with each other and in that a reflective member 7HM3, which is a quarter wave plate on the back face of which a reflective film is vapor-deposited, is located at the rear focal point of the lens unit 702. Here, as shown by the hatched lines in FIG. 41B, the reflective film is provided in a partial region of the quarter wave plate, and the shape of the region is circular. Thus, this region of the reflective film corresponds to the aperture portion in the aperture stop AS in the present embodiment and the first modification. Here, because the reflective film is provided in the partial region of the quarter wave plate, it is sufficient that the function of the quarter wave plate is achieved only in this region, but the other regions do not have to be an accurate quarter wave plate.

In FIG. 42A, a polarization separating element 7PR with two polarization separating surfaces 7R1, 7R2 is provided in the optical path between the reflective mirrors 7M1, 7M2 as the beam transferring member and the lens unit 702, and these polarization separating surfaces 7R1, 7R2 are arranged as perpendicular to each other.

The optical path in the present modification is next described referring to FIG. 42A. In FIG. 42A, light from the mask 8 illuminated by linearly polarized light in the direction normal to the plane of drawing (s-polarized light with respect to the polarization separating surfaces 7R1, 7R2 in the polarization separating element 7PR), similarly as in the present embodiment, is reflected by the polarization separating surface 7R1 in the polarization separating element 7PR, and then passes through the lens unit 702 to reach the reflective member 7HM3. The p-polarized light reaching the reflective member 7HM3 is converted into circularly polarized light by the quarter wave plate, and is reflected by the reflective film vapor-deposited on the back face of the quarter wave plate. After that, the circularly polarized light again passes through the quarter wave plate to be converted into s-polarized light, which is emergent therefrom. This s-polarized light again passes through the lens unit 702 and then through the polarization separating surface 7R2 in the polarization separating member 7PR, and the optical path thereof is deflected 90° by the reflective mirror 7M1 to reach the field stop FS. Here, the primary image of mask 8 is formed with the Z-directional lateral magnification being +1 and the Y-directional lateral magnification being −1, similarly as in the above embodiment. The optical path of the p-polarized light from the primary image is deflected 90° by the reflective mirror 7M2, and thereafter the p-polarized light passes through the polarization separating surface 7R1 in the polarization separating element 7PR. Then the p-polarized light passes through the lens unit 702 to reach the reflective member 7HM3. The p-polarized light reaching this reflective member 7HM3 is reflected thereby so that it is again incident into the lens unit 702 after converted into s-polarized light. The s-polarized light from the reflective member 7HM3 through the lens unit 702 is reflected by the polarization separating surface 7R2 in the polarization separating element 7PR, and then passes through the magnification correcting optical system M to reach the plate 9. By this, a real-size erect image of mask 8 is formed on the plate 9 with the Y-directional and Z-directional lateral magnifications both being +1. In this manner, the phase changing member having a phase changing function may be integrated with the reflective surface.

Since the seventh embodiment is so arranged that the quarter wave plate is located near the pupil position of the optical system, the degree of influence of the quarter wave plate on the image-forming performance can be made lower. In the above-described each of the seventh embodiment and the modifications hereof, instead of providing the beam transferring member for transferring the light beam from the polarizing beam splitter 7PR2 as the second light splitting means in the direction traversing the optical axis Ax toward the polarizing beam splitter 7PR as the first light splitting means, it is also possible to employ such an arrangement that the light from the second light splitting means is guided directly to the first light splitting means along the direction traversing the optical axis Ax. Such an arrangement is next described referring to FIG. 43.

Figure 43:
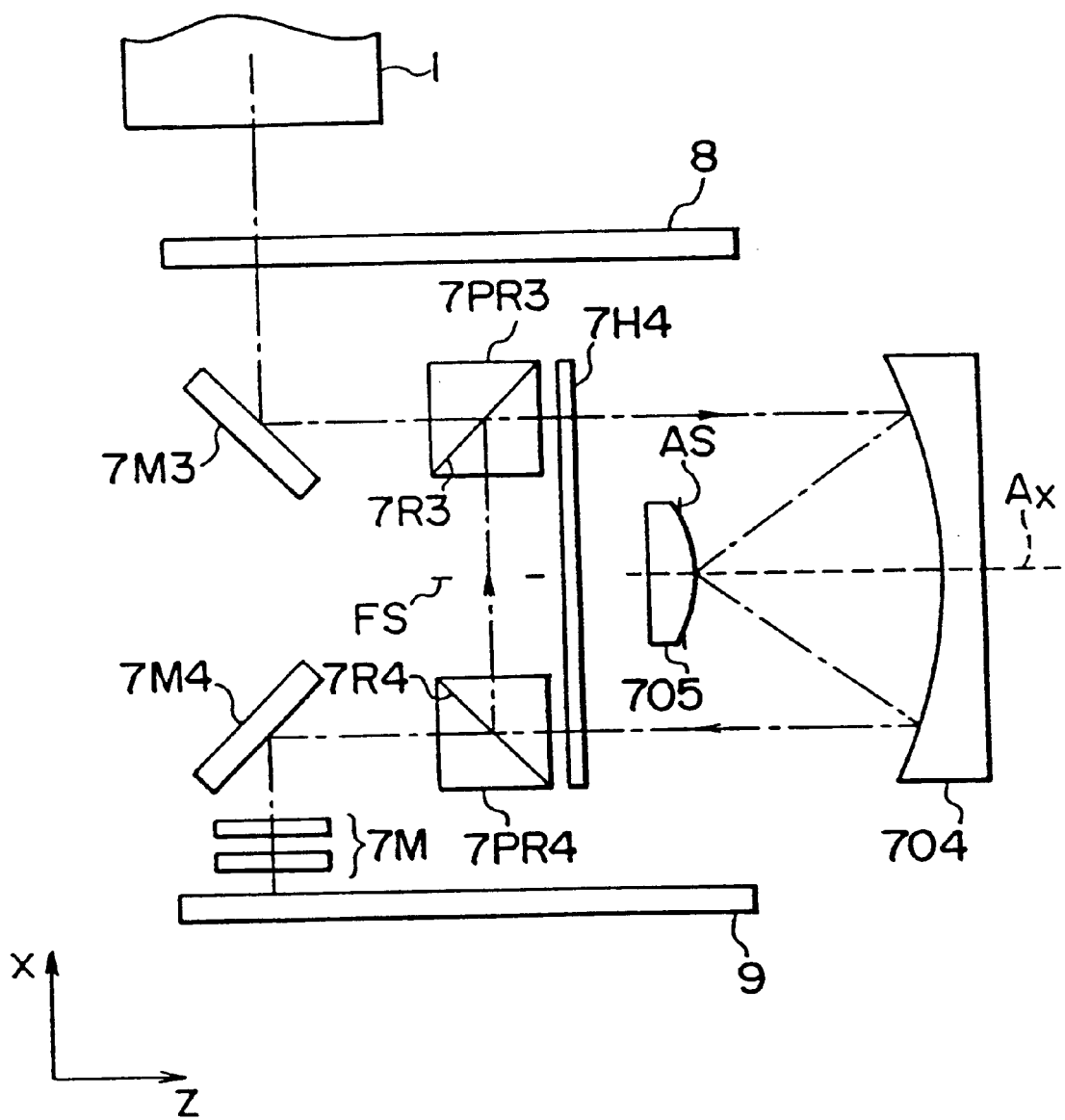
FIG. 43 is a side cross-sectional view to show the structure of the third modification of the seventh to embodiment of the projection optical system.

FIG. 43 is a plan view to show a third modification of the seventh embodiment to which the Offner optical system is applied in the present invention. In FIG. 43, members with like functions as those in the embodiment of FIG. 39 are denoted by the same reference numerals, and the same coordinate system as in FIG. 39 is employed.

In FIG. 43, provided between the mask 8 and the plate 9 are a concave mirror 704 and a convex mirror 705 having the optical axis Ax parallel to an in-plane direction (YZ direction) of these mask 8 and plate 9. Here, the convex mirror 705 is arranged so as to be approximately coincident with the focal point of the concave mirror 704. An aperture stop AS is provided near the convex mirror 705.

On the opposite side to the concave mirror 704 with respect to the convex mirror 705 polarizing beam splitters 7PR3, 7PR4 are disposed as the first and second light splitting means. These polarizing beam splitters 7PR3, 7PR4 have respective polarization separating surfaces 7R3, 7R4 inclined at ±45° relative to the in-plane direction (YZ direction) of the mask 8 and plate 9.

A reflective mirror 7M3 for deflecting the light from the mask 8 by 90° to make it travel in parallel with the optical axis Ax is provided in the optical path between the polarizing beam splitter 7PR3 and the mask 8, and a reflective mirror 7M4 for deflecting the light from the polarizing beam splitter 7PR4 traveling in parallel with the optical axis Ax by 90° to make it travel along the direction normal to the plate 9 is provided in the optical path between the polarizing beam splitter 7PR4 and the plate 8. Here, the two reflective mirrors 7M3, 7M4 are so arranged that the reflective surfaces thereof are perpendicular to each other.

Also, a quarter wave plate 7H4 is provided as a phase changing member in the optical path between the polarizing beam splitters 7PR3, 7PR4 and the concave mirror 704, and a field stop FS having an aperture portion of a predetermined shape is provided in the optical path between the polarizing beam splitter 7PR3 and the polarizing beam splitter 7PR4.

In the third modification of the seventh embodiment, there is provided an illumination optical system 701 for irradiating linearly polarized light with an oscillation plane in the horizontal direction in the plane of drawing (p-polarized light with respect to the polarization separating surface 7R3 in the polarizing beam splitter 7PR3) to a predetermined field region on the mask 8.

Next, the third modification of the seventh embodiment is described along the optical path. In FIG. 43, the p-polarized light. from the illumination optical system 701 and through the mask 8 travels along the X direction in the drawing to reach the reflective mirror 7M3. The optical path of the p-polarized light reflected by the reflective mirror 7M3 is deflected 90° to advance along the Z direction, and then passes through the polarization separating surface 7R3 in the polarizing beam splitter 7PR3. Then the p-polarized light passes through the quarter wave plate 7H4 to be converted into circularly polarized light. This circularly polarized light is then reflected by the concave mirror 704, convex mirror 705, and concave mirror 704 in this order to advance along the Z direction and then to reach the quarter wave plate 7H4. The p-polarized light reaching the quarter wave plate 7H4 is converted into s-polarized light by the quarter wave plate 7H4, and the s-polarized light is reflected by the polarization separating surface 7R4 in the polarizing beam splitter 7PR4 to advance along the X direction in the drawing and then to reach the field stop FS. Here, a primary image of mask 8 is formed in the aperture portion of field stop FS. The lateral magnifications of the primary image of mask 8 are +1 for the Z direction and −1 for the Y direction.

Next, the s-polarized light from the primary image is reflected by the polarization separating surface 7R3 in the polarizing beam splitter 7PR3 to advance along the Z direction and to pass through the quarter wave plate 7H4 to be converted into circularly polarized light. This circularly polarized light is reflected by the concave mirror 704, convex mirror 705, and concave mirror 704 in this order, and thereafter advances along the Z direction to pass through the quarter wave plate 7H4. Here, because the light from the concave mirror 704 and through the quarter wave plate 7H4 is p-polarized light, this p-polarized light passes through the polarizing beam splitter 7PR4 to advance along the X direction and the optical path thereof is deflected 90° by the reflective mirror 7M4 to reach the plate 9. By this, an image of the field stop FS is formed on the plate 9 with the Z-directional lateral magnification being +1 and the Y-directional lateral magnification being −1. That is, a real-size erect image (secondary image) of mask 8 is formed on the plate 9 with the Y-directional and Z-directional lateral magnifications both being +1. Also in the present modification, the magnification correcting optical system 7M consisting of convex and concave lenses finely movable along the X direction is disposed in the optical path between the polarizing beam splitter 7PR4 (reflective mirror 7M4) and the plate.

As described, the third modification of the seventh embodiment can also realize scanning exposure by moving the mask 8 and plate 9 together in the Z direction.

The third modification of the seventh embodiment employs the structure that the light beam from the second light splitting means is guided directly to the first light splitting means without interposition of beam transferring member. This arrangement allows use of portions with high-image heights in the Offner optical system. The third modification of the seventh modification employs the field stop FS with an arcuate aperture portion because the Offner optical system is applied.

Figure 44:
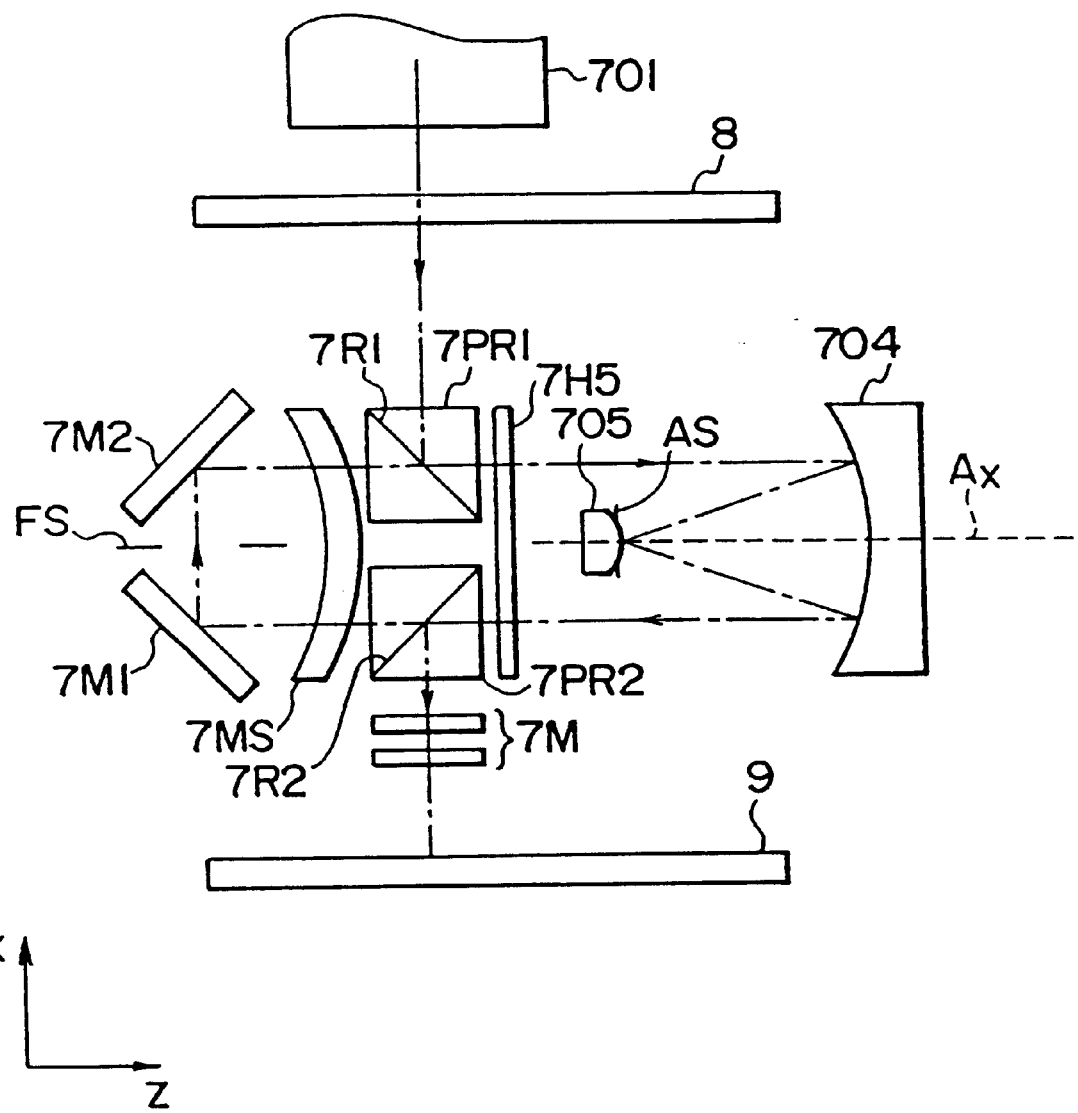

The fourth modification of the seventh embodiment is next described referring to FIG. 44. FIG. 44 is a plan view of the fourth modification in which an Offner optical system and an optical member for correcting astigmatism generated in the Offner optical system are applied in the present invention. In FIG. 44, members with like functions as those in the embodiment of FIG. 39 and the third modification of FIG. 44 are denoted by the same reference numerals, and the same coordinate system as in FIG. 43 is employed.

In FIG. 44, the polarizing beam splitter 7PR1 having the polarization separating surface 7R1 is provided in the optical path between the concave mirror 704 in the Offner optical system and the mask 8, and the polarizing beam splitter 7PR2 having the polarization separating surface 7R2 is provided in the optical path between the concave mirror 704 and the plate 9. A quarter wave plate 7H5 is disposed in the optical path between the polarizing beam splitters 7PR1, 7PR2 and the concave mirror 704. On the opposite side to the concave mirror 704 with respect to the polarizing beam splitters 7PR1, 7PR2 there are two reflective mirrors 7M1, 7M2 for. transferring a light beam of from the polarizing beam splitter 7PR2 in the direction perpendicular to the optical axis Ax to guide it to the polarizing beam splitter 7PR1. Also, an -astigmatism correcting member 7MS of a meniscus shape with a convex surface to the concave mirror 704 is disposed in the optical path between these reflective mirrors 7M1, 7M2 and the polarizing beam splitters 7PR1, 7PR2. Further, the present modification is so arranged that a field stop FS having an aperture portion of an arcuate shape is provided in the optical path between the two reflective mirrors 7M1, 7M2.

Next, the optical path in the forth modification of the seventh embodiment is described referring to FIG. 44. In FIG. 44, the illumination optical system 701 uniformly illuminates a predetermined illumination region on the mask 8 with linearly polarized light in the direction normal to the plane of drawing (s-polarized light with respect to the polarization separating surfaces 7R1, 7R2 in the polarizing beam splitters 7PR1, 7PR2), similarly as in the seventh embodiment.

In FIG. 44, the s-polarized light from the mask 8 illuminated by the illumination optical system 701 is reflected by the polarization separating surface 7R1 in the polarizing beam splitter 7PR1 and thereafter passes through the quarter wave plate 7H5 to be converted into circularly polarized light. Then the circularly polarized light is reflected by the concave mirror 704, convex mirror 705, and concave mirror 704 in this order then to pass through the quarter wave plate 7H5 to be converted into p-polarized light. This p-polarized light passes through the polarizing beam splitter 7PR2 and then through the astigmatism correcting member 7MS and thereafter the optical path thereof is deflected 90° by the reflective mirror 7M1 to reach the field stop FS. Here, a primary image of mask 8 is formed in the aperture portion of field stop FS with the Z-directional lateral magnification being +1 and the Y-directional lateral magnification being −1, similarly as in the present embodiment. The optical path of the p-polarized light from the primary image is deflected 90° by the reflective mirror 7M2 and the p-polarized light passes through the astigmatism correcting member 7MS and then through the polarizing beam splitter 7PR1. The p-polarized light passing through this polarizing beam splitter 7PR1 then passes through the quarter wave plate 7H5 to be converted into circularly polarized light, and thereafter travels via the concave mirror 704, convex mirror 705, and concave mirror 704 in this order to pass through the quarter wave plate 7H5 to be converted into s-polarized light. This s-polarized light is reflected by the polarizing beam splitter 7PR2 and thereafter passes through the magnification correcting optical system M to reach the plate 9. By this, a real-size erect image of mask 8 is formed on the plate 9 with the Y-directional and Z-directional lateral magnifications both being +1.

Since the present modification is so arranged that the astigmatism correcting member 7MS can correct astigmatism generated in the Offner optical system, the width (slit width) of exposure region in the scanning direction can be expanded, thereby improving the throughput. Further, because the present modification is so arranged that the astigmatism correcting member 7MS is set as coaxial with the optical axis Ax of the Offner optical system, it can enjoy such an advantage that adjustment of the astigmatism correcting member 7MS is easy. This astigmatism correcting member 7MS may be constructed of two separate optical members, one disposed in the optical path between the polarizing beam splitter 7PR2 and the reflective mirror 7M1 and the other in the optical path between the reflective mirror 7M2 and the polarizing beam splitter 7PR1.

Figure 45:
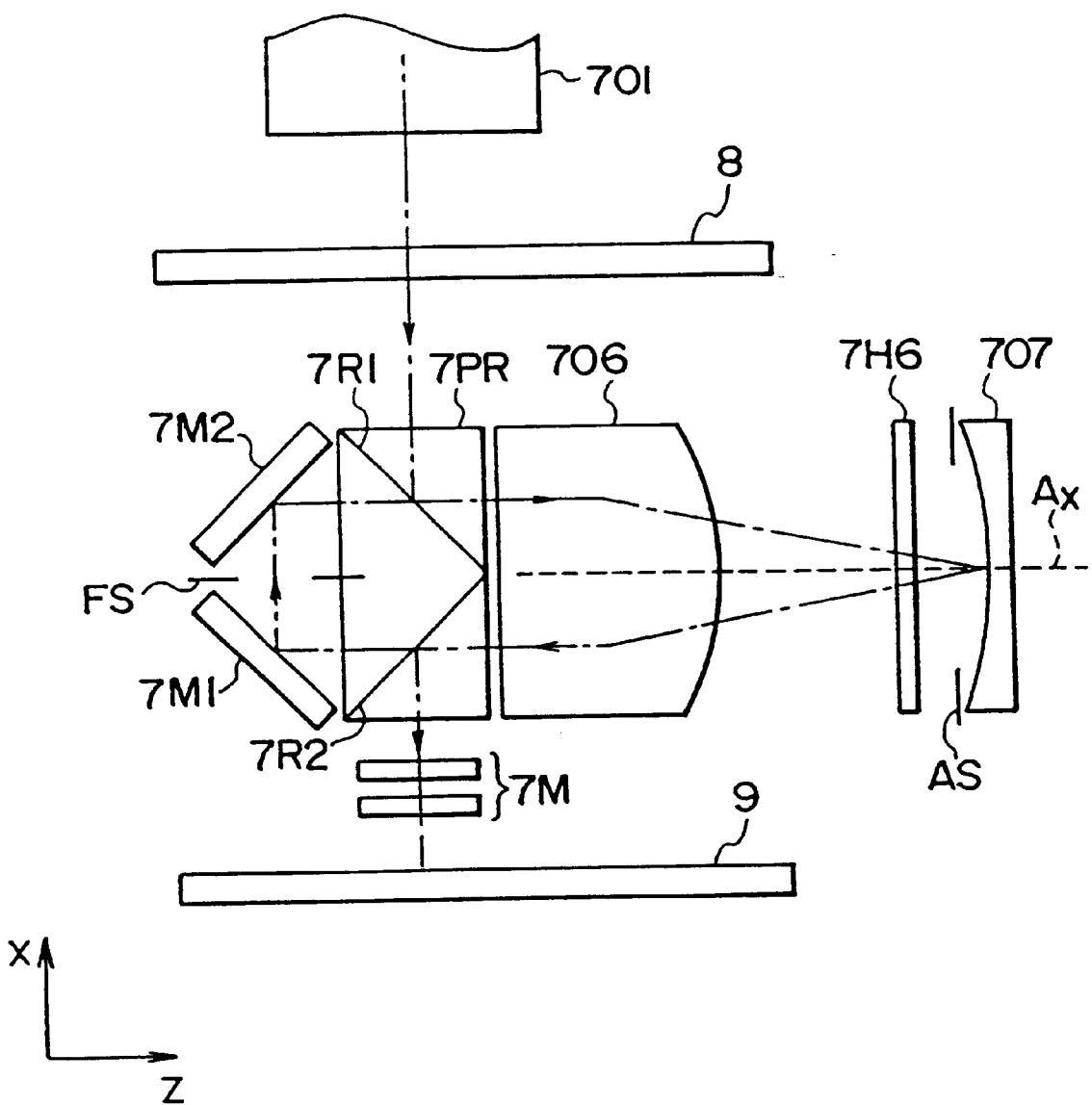

The above third and forth modifications of FIG. 43 and FIG. 44 employ the Offner optical system as the projection optical system, but the Dyson optical system may be applied. Next described referring to FIG. 45 is the fifth modification of the seventh embodiment employing the Dyson optical system as the projection optical system. FIG. 45 is a plan view of the fifth modification of the seventh embodiment in which the Dyson optical system is applied in the present invention. In FIG. 45, members with like functions as those in the first embodiment of FIG. 39 are denoted by the same reference numerals, and the same coordinate system as in FIG. 39 is employed.

In FIG. 45, provided between the mask 8 and plate 9 are a plano-convex lens 706 and a concave mirror 707 having the optical axis Ax parallel to an in-plane direction (YZ direction) of the mask 8 and plate 9. Here, an aperture stop AS is provided near the concave mirror 707. On the opposite side to the concave mirror 707 with respect to the plano-convex lens 706 there is provided a polarization separating element 7PR with two polarization separating surfaces 7R1, 7R2 as the first and second light splitting means. These polarization separating surfaces 7R1, 7R2 are arranged as perpendicular to each other. On the opposite side to the plano-convex lens 706 with respect to the polarization separating element 7PR there are two reflective mirrors 7M1, 7M2 with respective reflective surfaces thereof perpendicular to each other as the beam transferring means. A field stop FS having an aperture portion of a predetermined shape is provided in the optical path between the two reflective mirrors 7M1, 7M2. A quarter wave plate 7H6 is provided as a phase changing member in the optical path between the plano-convex lens 706 and the concave mirror 707.

Next, the optical path in the fifth modification of the seventh embodiment is described referring to FIG. 45. The illumination optical system 701 shown in FIG. 45 is arranged to uniformly illuminate a predetermined illumination region on the mask 8 with linearly polarized light in the direction normal to the plane of drawing (s-polarized light with respect to the polarization separating surfaces 7R1, 7R2 in the polarizing beam splitters 7PR1, 7PR2), similarly as in the first embodiment.

In FIG. 45, the s-polarized light from the mask 8 illuminated by the illumination optical system 701 is reflected by the polarization separating surface 7R1 in the polarization separating element 7PR and is then subjected to the refracting effect in the plano-convex lens 706. Then the s-polarized light is converted into circularly polarized light by the quarter wave plate 7H6. This circularly polarized light is reflected by the concave mirror 707 and thereafter passes through the quarter wave plate 7H6 to be converted into p-polarized light. This p-polarized light passes through the polarization separating surface 7R2 in the polarization separating element PR and the optical path thereof is deflected 90° by the reflective mirror 7M1 to reach the field stop FS.

Here, a primary image of mask 8 is formed in the aperture portion of field stop FS with the Z-directional lateral magnification being +1 and the Y-directional lateral magnification being −1, similarly as in the seventh embodiment. The optical path of the p-polarized light from the primary image is deflected 90° by the reflective mirror 7M2 and then passes through the polarization separating surface 7R1 in the polarization separating element 7PR to enter the plano-convex lens 706. The p-polarized light entering the plano-convex lens 706 then passes through the quarter wave plate 7H6 to be converted into circularly polarized light. Then the circularly polarized light is reflected by the concave mirror 707 and again passes through the quarter wave plate 7H6 to be converted into s-polarized light. This s-polarized light passes through the plano-convex lens 706 and is reflected by the polarization separating surface 7R2 in the polarization separating element 7PR. After that, the s-polarized light passes through the magnification correcting optical system M to reach the plate 9. Here, a real-size erect image of mask 8 is formed on the plate 9 with the Y-directional and Z-directional lateral magnifications both being +1.

The Dyson optical system shown in FIG. 45 is composed of one plano-convex lens 706 and the concave mirror 707, but a plurality of lens components having a positive combinational refractive power may replace the one plano-convex lens 706.

Since the Dyson optical system is generally difficult to secure a sufficient working distance, the optical system may be constructed in a type different from the so-called Dyson type by combining the concave mirror with a lens group while keeping the working distance long enough. For example, in the first embodiment shown in FIG. 39, it is conceivable to replace the plane reflective mirror. 703 with a concave mirror.

In the above-described each modification of the seventh embodiment and the seventh embodiment the prism type polarization separating element was used as the first and second polarization separating means, but instead thereof, it is also possible to employ such an arrangement that a dielectric multilayer film is vapor-deposited over a surface of a plane-parallel plate and this surface is used as the polarization separating surface.

In the seventh embodiment and the first to fifth modifications of the seventh embodiment, it is desired that a quarter wave plate be provided in the optical path between the magnification correcting optical system 7M and the polarizing beam splitter 7PR2. By this, the exposure light reaching the plate 9 becomes circularly polarized light.

The projection optical systems according to the seventh embodiment and the first to fifth modifications thereof as described above have an effect of considerable decrease of cost because they can be constructed by a very small number of lens components as compared with the projection optical systems for obtaining an erect image by simply combining two refractive optical systems on a same axis. Further, the projection optical systems can be constructed of a smaller number of constituent elements of projection optical system, which can lower occurrence of a fabrication errors etc., thus presenting an excellent effect of easy adjustment of projection optical system itself.

Figure 46:
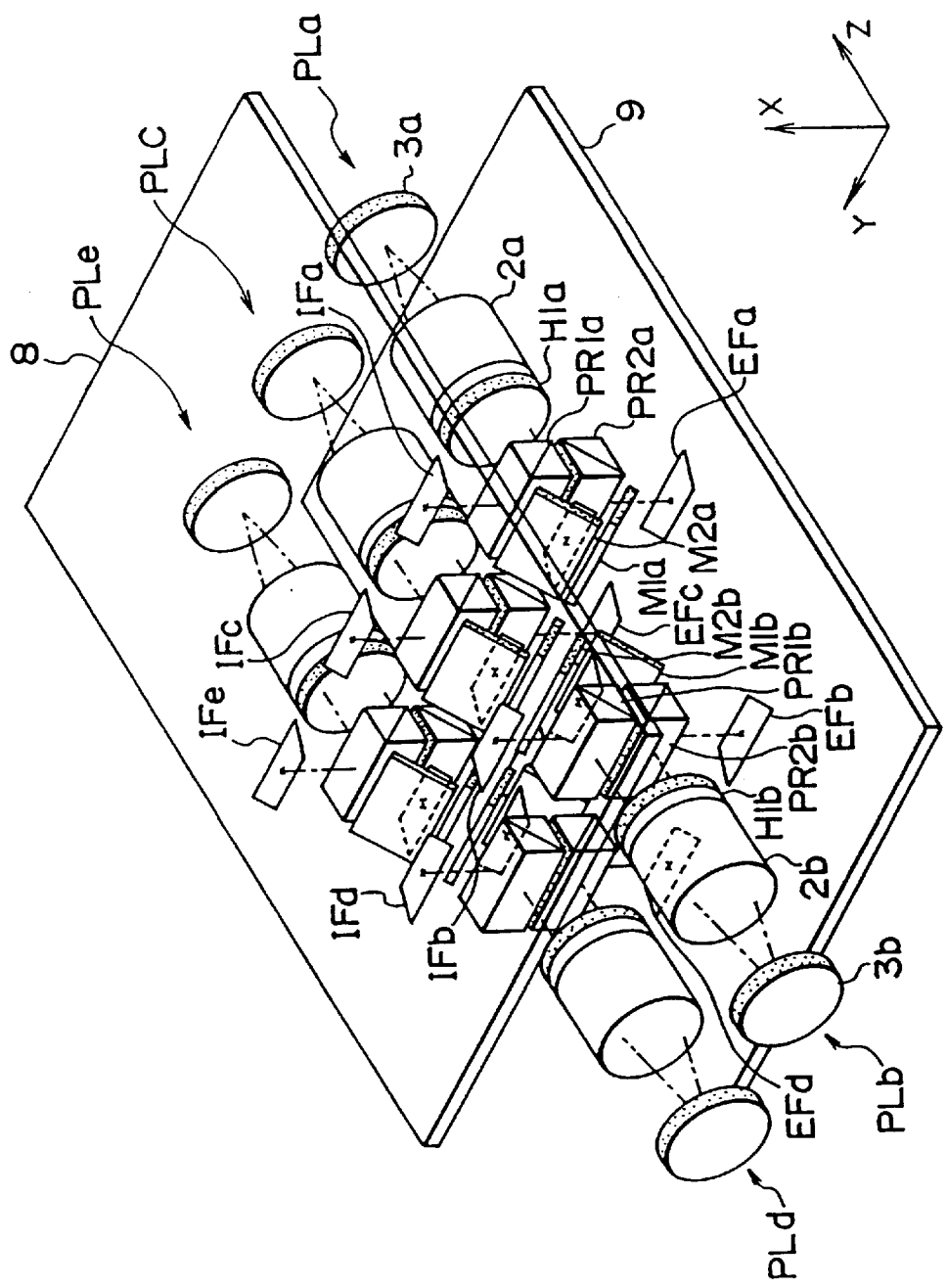
FIG. 46 is a perspective view of the exposure appratus to which the sixth modification of the seventh embodiment of the projection optical system is applied.

The sixth modification of the seventh embodiment is next described referring to FIG. 46. FIG. 46 is a drawing to diagrammatically show the sixth modification of the seventh embodiment provided with a Plurality of projection optical systems in a zigzag arrangement to transfer the pattern on the entire surface of mask 8 onto the plate 9 by one scanning exposure. FIG. 46 employs the same coordinate system as FIG. 39, and members with like functions as those in the seventh embodiment of FIG. 39 are denoted by the same reference numerals.

Figure 47:
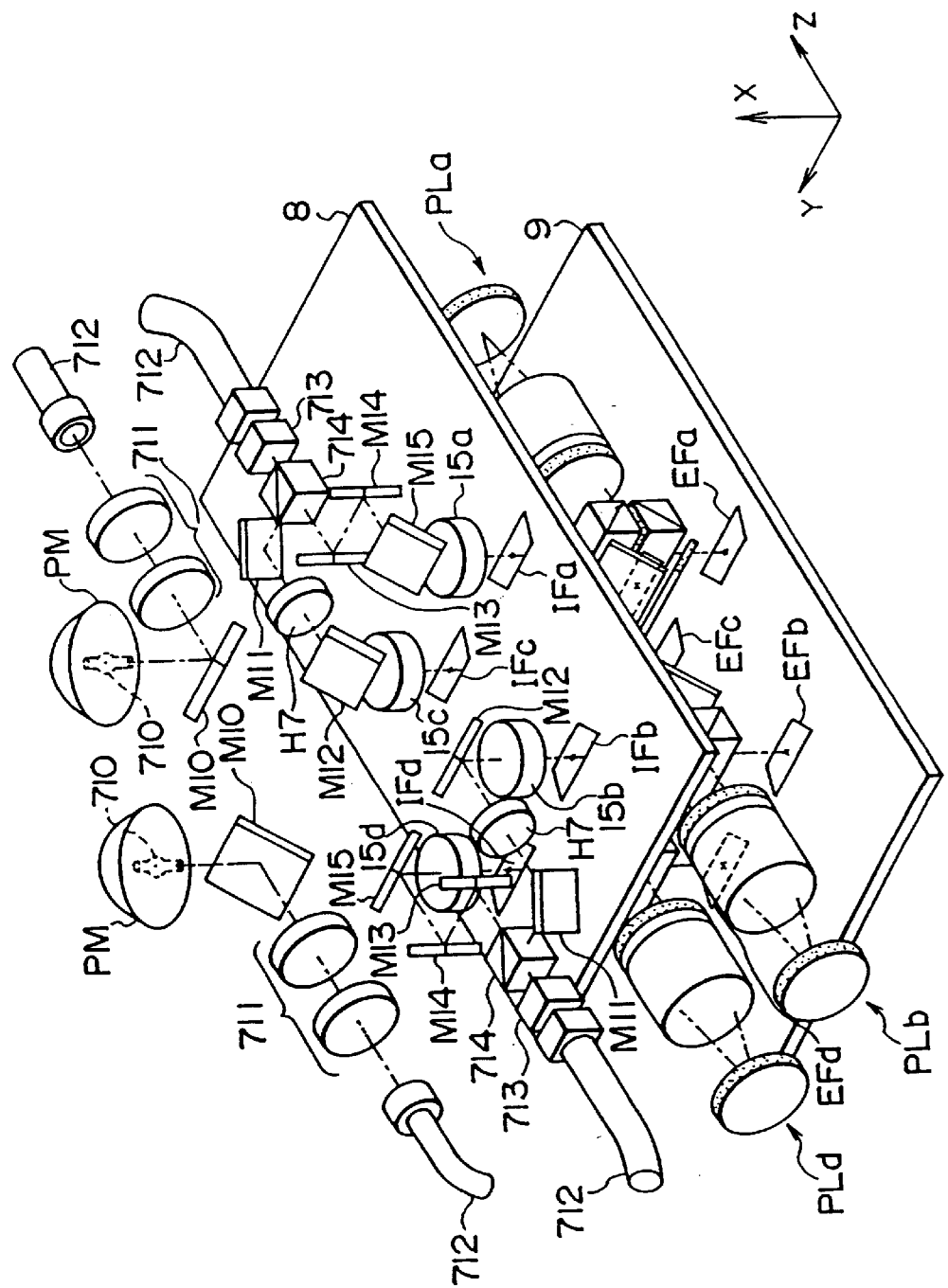
FIG. 47 is a perspective view of the preferred illumination system for the sixth modification of the seventh embodiment.

In FIG. 46, five projection optical systems PLa–PLe are provided in the space between the mask 8 and the plate 9. Since the structure of the projection optical systems PLa–PLe shown in FIG. 47 is the same as in the seventh embodiment of FIG. 39, the description thereof is omitted herein. These projection optical systems PLa–PLe form real-size erect images of field regions IFa–IFe, respectively on the mask 8, on exposure regions EFa–EFe on the plate 9.

In FIG. 46, the projection optical systems PLa, PLc, PLe are arranged so that the field regions thereof IFa, IFc, IFe are aligned along the Y direction, while the projection optical systems PLb, PLd are arranged so that the field regions IFb, IFd thereof are aligned along the Y direction. On this occasion, the Z-directional position where the field regions IFa, IFc, IFe are located is different from the Z-directional position where the field regions IFb, IFd are located.

The shape of each field region IFa–IFe shown in FIG. 46 is trapezoid, and the field regions IFa–IFe are located so that oblique sides of the field regions IFa–IFe overlap with each other. Namely, each field region IFa–IFe is positioned so that a sum of lengths in the Z direction (scanning direction), of the field regions IFa–IFe becomes always constant in the Y direction (the direction perpendicular to the scanning direction).

Here, if the magnification is adjusted in each exposure region EFa–EFe by the magnification correcting optical system M shown in FIG. 39, positional relations between the exposure regions EFa–EFe deviate from each other so as to make exposure amounts on the plate 9 nonuniform. Although not shown, the seventh embodiment employs a plane-parallel plate arranged as rotatable in the Y,Z directions in each projection optical system PLa–PLe, and positions in the Y,Z directions, of each exposure region EFa–EFe are adjusted by rotation of the plane-parallel plate.

The shape of each field region IFa–IFe is not limited to trapezoid, but it may be rectangular, hexagonal, or arcuate as long as the sum of lengths in the Z direction, of the field regions IFa–IFe is always constant.

Although not shown in FIG. 46, the sixth modification of the seventh embodiment includes a plurality of illumination optical systems on the opposite side to the projection optical systems PLa–PLe with respect to the mask 8. These illumination optical systems have respective polarizers in the optical paths thereof to supply linearly polarized light to the mask 8. Also, a laser for supplying linearly polarized light can also be applied as a light source in each illumination optical system.

Upon actual exposure, while illuminating each field region IFa–IFe in the mask 8 by the illumination optical system not shown, the mask 8 and plate 9 are moved together along the Z direction, whereby images of pattern of mask 8 in the field regions IFa–IFe are serially formed on the plate 9. By this, the pattern of mask 8 is transferred onto the plate 9.

Although the sixth modification employed the five projection optical systems, it is needless to mention that the present invention is by no means limited to the five projection optical systems. Further, the projection optical systems do not have to be limited to the projection. optical system in the seventh embodiment of FIG. 39, but any projection optical system in the first to fifth modifications may also be applied.

Since the above-described exposure apparatus shown in FIG. 46 can realize exposure on a large-scale substrate by a single exposure operation, the throughput can be improved. Further, the exposure region can be expanded without increasing the size of projection optical system itself, thus presenting an advantage of not degrading the optical performance.

It is also conceivable that the exposure apparatus shown in FIG. 46 is arranged to include only two projection optical systems (for example, only the projection optical systems PLa, PLb) and that the exposure method of repeating the scanning exposure operation and step operation is performed as in the seventh embodiment shown in FIG. 39. The throughput. can be improved in that case because the number of steps operations can be decreased as compared with the seventh embodiment.

Next described referring to FIG. 47 is the illumination optical system suitable for the embodiment of FIG. 46. In FIG. 47, the same coordinate system as in FIG. 46 is employed and members with like functions as those in the sixth modification of the seventh embodiment of FIG. 46 are denoted by the same reference numerals.

In FIG. 47, a super-high pressure mercury lamp 710 supplies illumination light of a predetermined wavelength (for example, the g-line (436 nm) or the h-line (404 nm)). The illumination light from the super-high pressure mercury lam 710 is collected by an ellipsoidal mirror 7PM to travel via a path bending mirror 7M10 and to pass through a collector lens system 711 then to enter a light guide 712 consisting of a bundle of optical fibers. The illumination light emerging from the light guide 712 is incident into a fly's eye lens 713 to form a plurality of secondary light source images on the exit plane of the fly's eye lens 713. The illumination light from the exit plane of the fly's eye lens 713 is split into two linearly polarized light beams having mutually orthogonal polarization directions by the polarizing beam splitter 714.

Here, the s-polarized light reflected by the polarizing beam splitter 714 travels along the Y direction in the drawing and then is reflected by a path bending mirror 7M11 so as to advance along the Z direction in the drawing. Linearly polarized light from the path bending mirror 7M11 will have an oscillation plane in the X direction in the drawing. The. linearly polarized light having the oscillation plane in the X direction passes through a half wave plate 7H7 to be converted into linearly polarized light having an oscillation plane along the Y direction in the drawing. The linearly polarized light is then reflected by a path bending mirror 7M12 to reach a condenser lens 715c. This condenser lens 715c is located so that the front focal point thereof is positioned on the exit plane of the fly's eye lens 713, and the field region IFc on the mask 8 is thus illuminated in a superimposed manner by the linearly polarized light having the oscillation plane along the Y direction.

On the other hand, the p-polarized light passing through the polarizing beam splitter 714 advances along the Z direction in the drawing and is then reflected by a path bending mirror 7M13 whereby the optical path thereof is deflected to the Y direction in the drawing. Then the light travels toward a path bending mirror 7M14. On this occasion, the linearly polarized light between the polarizing beam splitter 714 and the path bending mirror 7M13 will have the oscillation plane along the Y direction in the drawing, and the linearly polarized light between the path bending mirror 7M13 and the path bending mirror 7M14 will have the oscillation plane along the Z direction in the drawing. The linearly polarized light reflected by the path bending mirror 7M14 will have the oscillation plane in the Y direction in the drawing to advance along the Z direction, and the optical path thereof is deflected 90° by path bending mirror 7M15 to advance along the X direction. The linearly polarized light from this path bending mirror 7M15 becomes linearly polarized light having the oscillation plane in the Y direction in the drawing, which passes through a condenser lens 715a to reach the mask 8. This condenser lens 715a is also located so that the front focal point thereof is positioned on the exit plane of -the fly's eye lens 713, similarly as the condenser lens 715c, so that the field region IFa on the mask 8 is illuminated in a superimposed manner by the linearly polarized light having the oscillation plane along the Y direction.

By this, the field regions IFa, IFc become s-polarized with respect to the polarization separating surfaces in the polarizing beam splitters PR1a, PR1c in the respective projection optical systems PLa, PLc. Since the illumination optical system for illuminating the Field regions IFb, IFd has the same structure as the illumination optical system for illuminating the field regions IFa, IFc, the description thereof is omitted herein.

Figure 48:
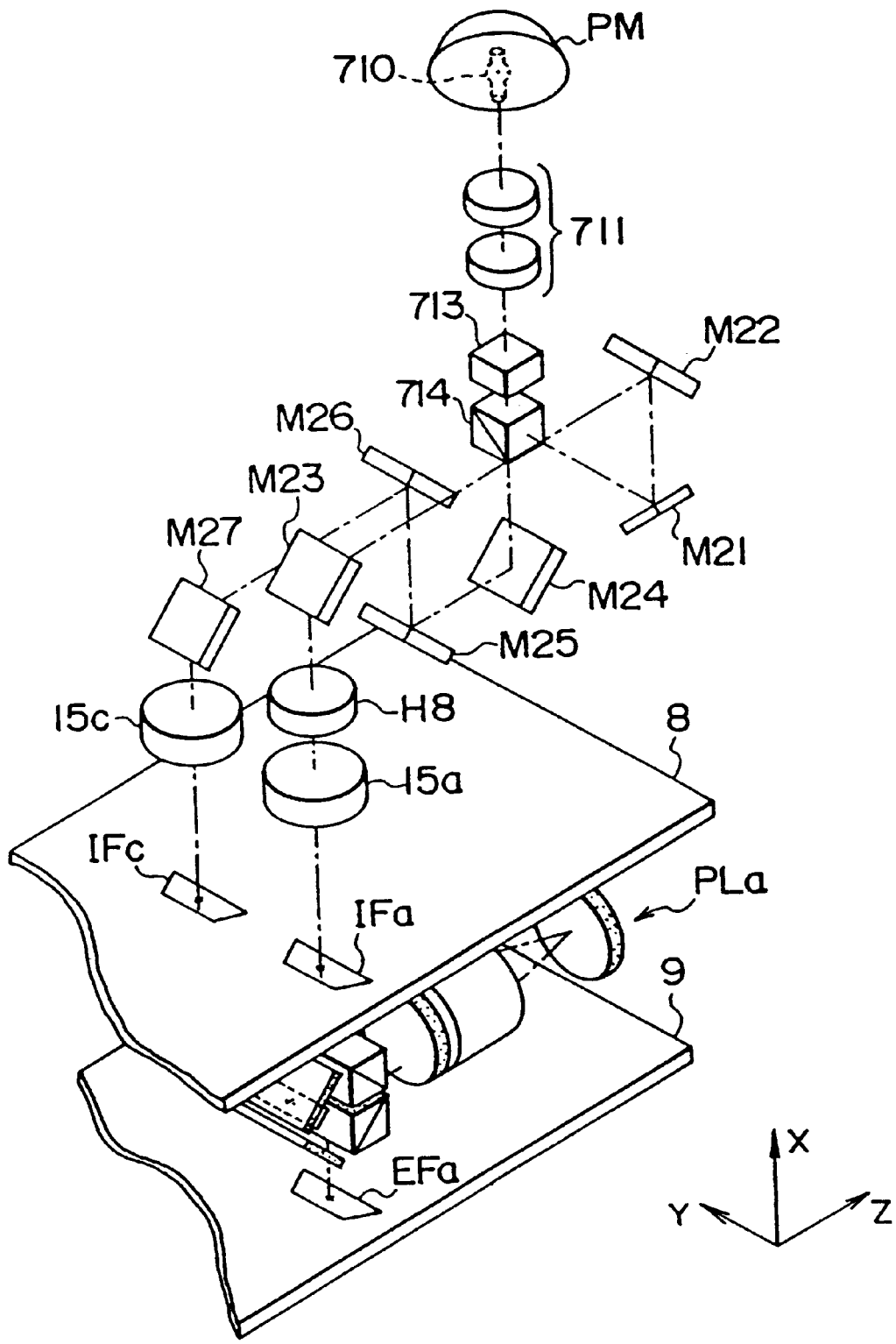
FIG. 48 is a drawing to show the preferred. illumination the exposure apparatus in which the seventh modification of the sixth embodiment of the projection optical system is incorporated.

As described, the illumination optical system as shown in FIG. 47 can considerably decrease losses in the light from the light source when a plurality of regions are illuminated with linearly polarized light in a mutually equal polarization state. The illumination optical system car. also be constructed in the structure shown in FIG. 48. A modification of the illumination optical system is next described referring to FIG. 48. In FIG. 48, the same coordinate system as in FIG. 47 is employed and members with like functions as those in the illumination optical system of FIG. 47 are denoted by the same reference numerals.

In FIG. 48, the illumination light from the super-high pressure mercury lamp 710 is collected by the ellipsoidal mirror 7PM and is incident through the collector lens system 711 into the fly's eye lens 713 to form a plurality of secondary light source images on the exit plane of the fly's eye lens 713. The illumination light from the exit plane of the fly's eye lens 713 is split into two linearly polarized light beams having mutually orthogonal polarization directions by the polarizing beam splitter 714.

Here, the s-polarized light reflected by the polarizing beam splitter 714 becomes linearly polarized light having the oscillation plane in the Z direction in the drawing to advance along the Y direction in the drawing and then to reach a path bending mirror 7M21. The linearly polarized light reflected by the path bending mirror 7M21 advances along the X direction in the drawing and is reflected by a path bending mirror 7M22 with the oscillation plane in the Y direction. The linearly polarized light reflected by the path bending mirror 7M22 is deflected so as to advance in the Z direction, becoming linearly polarized light with the oscillation plane in the X direction. The linearly polarized light then reaches a path bending mirror 7M23. The linearly polarized light reflected by the path bending mirror 7M23 and traveling in the X direction will have the oscillation plane in the Z direction, and then passes through a half wave plate 7H8 to have the oscillation plane thereof in the Y direction. The linearly polarized light with the oscillation plane in the Y direction is condensed by the condenser lens 715a having the front focal point on the position of the exit plane of the fly's eye lens 713 to illuminate the field region IFa in the mask 8 in a superimposed manner.

On the other hand, the p-polarized light transmitted by the polarizing beam splitter 714 becomes linearly polarized light having the oscillation plane in the Y direction in the drawing and advances along the X direction in the drawing to reach a path bending mirror 7M24. The linearly polarized light reflected by the path bending mirror 7M24 travels along the Z direction in the drawing and then is reflected by a path bending mirror 7M25 so as to travel toward a path bending mirror 7M26 along the optical path extending in the X direction. The linearly polarized light reaching the path bending mirror 7M26 is deflected by the path bending mirror 7M26 so that the optical path thereof runs in the Z direction, and reaches a path bending mirror 7M27. The linearly polarized light reflected by this path bending mirror 7M27 travels along the X direction in the drawing and then is condensed by the condenser lens 715 having the front focal point located on the exit plane of the fly's eye lens 713 to illuminate the mask 8 in a superimposed manner. Here, because the oscillation plane of the linearly polarized light is not rotated by the path bending mirrors 7M24–7M27 in the optical path from the polarizing beam splitter 714 to the mask 8, the linearly polarized light having the oscillation plane in the Y direction in the drawing passes in this optical path. Accordingly, the field region IFc on the mask 8 is illuminated in a superimposed manner by the linearly polarized light having the oscillation plane in the Y direction, coming from the condenser lens 715c.

By this, the field regions IFa, IEc are illuminated in the s-polarized state with respect to the polarization separating surfaces in the polarizing beam splitters PR1a, PR1c in the projection optical systems PLa, PLc. The illumination optical system of FIG. 47 is so arranged that the optical path length from the polarizing beam splitter 714 to the field region IFa becomes equal to the optical path length from the polarizing beam splitter 714 to the field region IFc.

Since the illumination optical system for illuminating the field regions IFb, IFd is constructed in the same structure as the illumination optical system for illuminating the field regions IFa, IFc, illustration thereof is omitted in FIG. 48.

As described, the illumination optical system shown in FIG. 48 can also considerably decrease losses in the light from the light source when a plurality of regions are illuminated by the linearly polarized light of a same polarization state. Further, because in the optical system shown in FIG. 48, X-directional positions are different between the path bending mirrors 7M23, 7M27 for deflecting the light from the polarizing beam splitter 714 traveling along the Z direction, to the X direction, the path bending mirrors 7M23, 7M27 can be constructed in a large scale without interference therebetween. Namely, the freedom of arrangement of the path bending mirrors 7M23, 7M27 can be increased.

In the illumination optical systems shown in FIG. 47 and FIG. 48, a half wave plate rotatable about the traveling direction of light may be interposed in each of two optical paths separated by the polarizing beam splitter 714. Here, rotating the half wave plate in each optical path, the oscillation plane of linearly polarized light reaching each field region rotates, whereby an exposure amount in each exposure region corresponding to the each field region can be changed.

As described, the illumination optical systems shown in FIG. 47 and FIG. 48 can supply the illumination light of linearly polarized light to a plurality of regions without losing the light from light source.

Here, in the above eight embodiment, an optical system is arranged to have at least one reflective surface coaxial with the optical axis thereof, and the structure is thus half decreased as compared with mere, refractive optical systems, because an image of object is formed by light passing back and forth through the optical system by means of the reflective surface. Further, because the projection optical system according to the present invention is so arranged that a real-size erect image of mask is formed on a substrate by two round passages of light through the optical system, the structure can be quarter as compared with optical systems for obtaining an erect image by a simple combination of two coaxial refractive optical systems. Accordingly, the present invention permits the number of constituents in the projection optical system to be largely curtailed, thus presenting an advantage that the effect of cost reduction is very high.

Further in the seventh embodiment, the erect image means an image with the lateral magnifications in the vertical direction and the horizontal direction both being positive. In the seventh-embodiment as described above, for example as shown in FIG. 39, it is preferred that the optical system be disposed on one side of first and second light splitting means and that a beam transferring member for transferring a light beam passing the second light splitting means along the direction traversing the optical axis be disposed on the other side of the first and second light splitting means.

In the seventh embodiment as described above, for example as shown in FIGS. 42A and 42B, it is preferred that the optical system be disposed on one side of the first and second light splitting means, that a first deflecting member for guiding light from the mask to the first light splitting means be disposed on the other side of the first light splitting means, and that a second deflecting member for guiding light from the second light splitting means to the substrate be disposed on the other side of the second light splitting means.

More further in the seventh embodiment, for example as shown in FIG. 39, it is desired that the first and second light splitting means be polarizing beam splitters and that a phase changing member for changing the phase between mutually orthogonal polarization components be disposed in the optical path running from the first light splitting means through the optical system to the second light splitting means. This arrangement enables exposure to be made in a very low state of losses in quantity of light in the first and second light splitting means. Further, because the direction of an oscillation plane of linearly polarized light in which the light from the mask first passes back and forth through the optical system can be made different from the direction of an oscillation plane of linearly polarized light in which the light next passes back and forth through the optical system, flare and double images can be prevented, thus improving the optical performance.

The exposure apparatus according to the seventh embodiment is preferably arranged, for example as shown in FIG. 46, in such a manner that the apparatus is provided with an illumination optical system having a light source and a polarizing beam splitter for splitting light from the light source, guiding one light split into by the polarizing beam splitter to a first field region, and guiding the other light split into by the polarizing beam splitter to a second field region. This arrangement realizes the structure for guiding the light from a light source to a plurality of field regions without losses in quantity of light.

Further, it is desired that a phase changing member for changing the phase between mutually orthogonal polarization components be disposed in the optical path between the polarizing beam splitter and the first or second field region. Since this arrangement permits the phase changing members to make polarization states of light beams guided to a plurality of field regions in a same polarization state, light splitting means in a plurality of projection optical systems can be constructed in the same structure. This can reduce the production cost.

It is also preferred in the seventh embodiment that a field stop be provided in the optical path running from the first light splitting member (7PR1) to the second light splitting member. This arrangement can decrease flare due to the optical system (702, 703).

In the seventh embodiment, the optical system may be arranged, for example as shown in FIG. 39, to have a lens unit, and a plane reflective mirror disposed near the position of the focal point of the lens unit. This arrangement is very simple as including a quarter number of lens components as compared with the arrangement using simply two refractive optical systems for obtaining an erect image.

In the modification of the seventh embodiment, the optical system may be arranged, for example as shown in FIGS. 42A and 42B, to have a convex mirror (705) and a concave mirror (704) coaxially arranged, or may be arranged, for example as shown in FIG. 44, to have a concave mirror (707) and a lens component (706) coaxially arranged.

It is preferred that the optical system (702, 703) in the modification of the seventh epresent invention be a both side telecentric optical system.

In the seventh embodiment, it is desired, for example as shown in FIG. 39, that the optical axis (Ax) of the optical system (702, 703) be parallel to an in-plane direction (YZ direction) of the mask (8) or substrate (9). This arrangement can decrease the size of the optical system (702, 703) in the direction normal to the mask (substrate). Thus, the distance can be decreased between the mask (8) and the substrate (9), thus enhancing the stiffness of a carriage for supporting these mask (8) and substrate (9).

In the seventh embodiment it is preferred, for example as shown in FIG. 39, that the first light splitting member (7PR1) reflect the light from the mask (8) to the optical system (702, 703) and that the second light splitting member (7PR2) transmit the light coming from the first light splitting member (7PR1) through the optical system (702, 703) to guide it to the beam transferring member (7M1, 7M2) but reflect the light coming from the beam transferring member (7M1, 7M2) through the first light splitting member (7PR1) and the optical system (702, 703) to guide it onto the substrate (9).

Further, it is preferred in the seventh embodiment that an optical element for converting linearly polarized light traveling from the second light splitting member to the substrate into circularly polarized light be disposed in the optical path between the second light splitting member and the substrate.

Next the eighth embodiment of the projection optical system will be explained below, referring to FIGS. 49–54D. The projection optical system corresponds to those of the previous embodiments and the other elements except for the projection optical system is the same as those of the previous embodiments.

Figure 49:
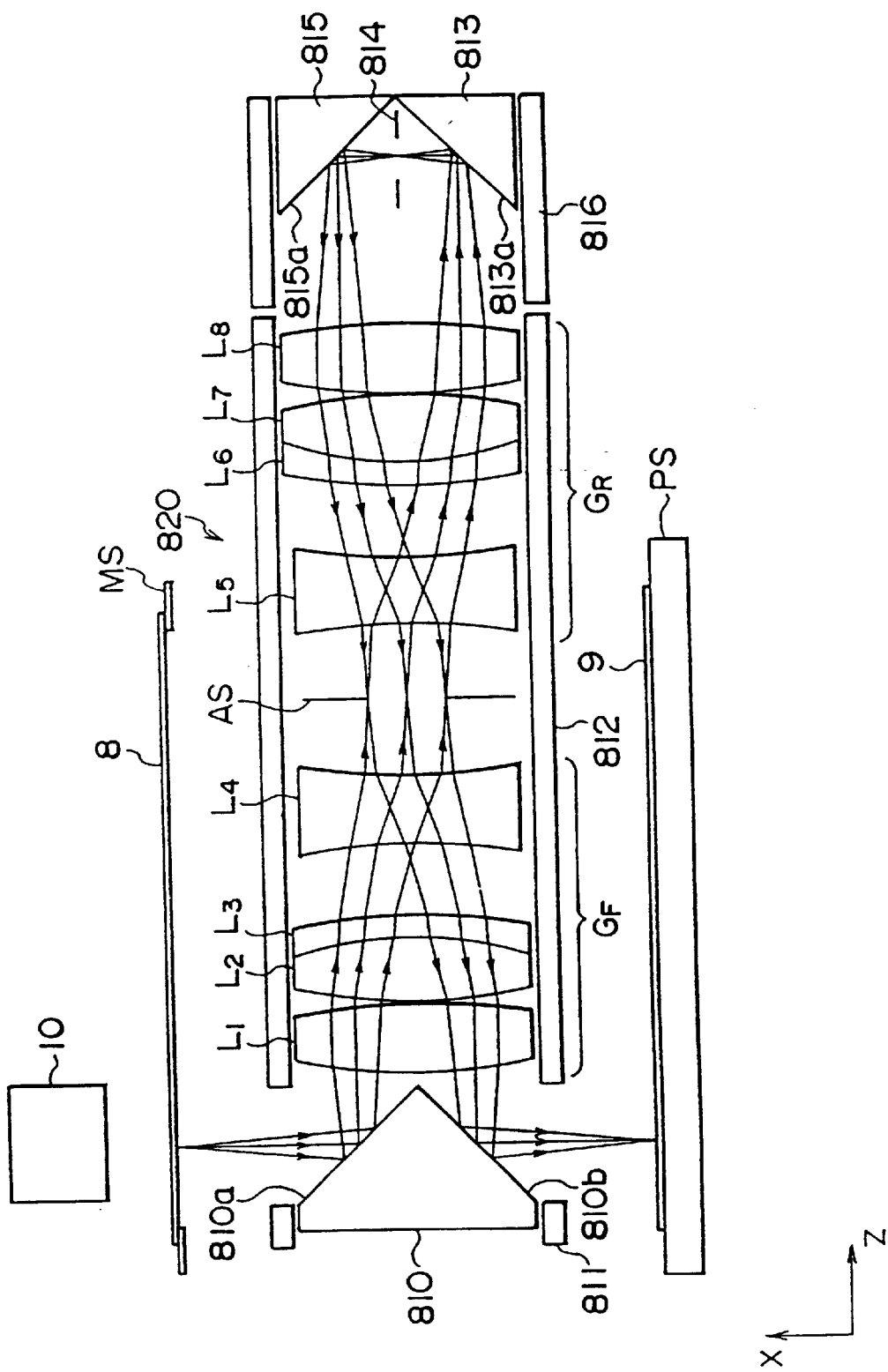
FIG. 49 is a side cross-sectional view to show the eighth embodiment of the projection optical system according to the present invention.

FIG. 49 is a drawing to show the structure of the eighth embodiment according to the present invention. In FIG. 49, the Z axis is taken along the scanning direction of the mask as a first object and the plate as a second object, the Y axis along the direction perpendicular to the scanning direction in the mask plane, and the X axis along the direction normal to the mask and the plate.

In FIG. 49, the illumination optical system IL has, for example, a super-high pressure mercury lamp, which illuminates the mask 8 at the wavelength of exposure light (for example, the g-line (435.8 nm)). Here, the mask 8 has a circuit pattern not shown, and is held by a mask stage MS so that this-circuit pattern faces the plate 9 (down in the drawing). This mask it stage MS is arranged as movable within the YZ plane in the drawing. The plate 9 is, for example, a glass substrate coated with a photoresist on the surface thereof, and is held by a plate stage PS arranged as movable within the YZ plane in the drawing.

Figure 50:
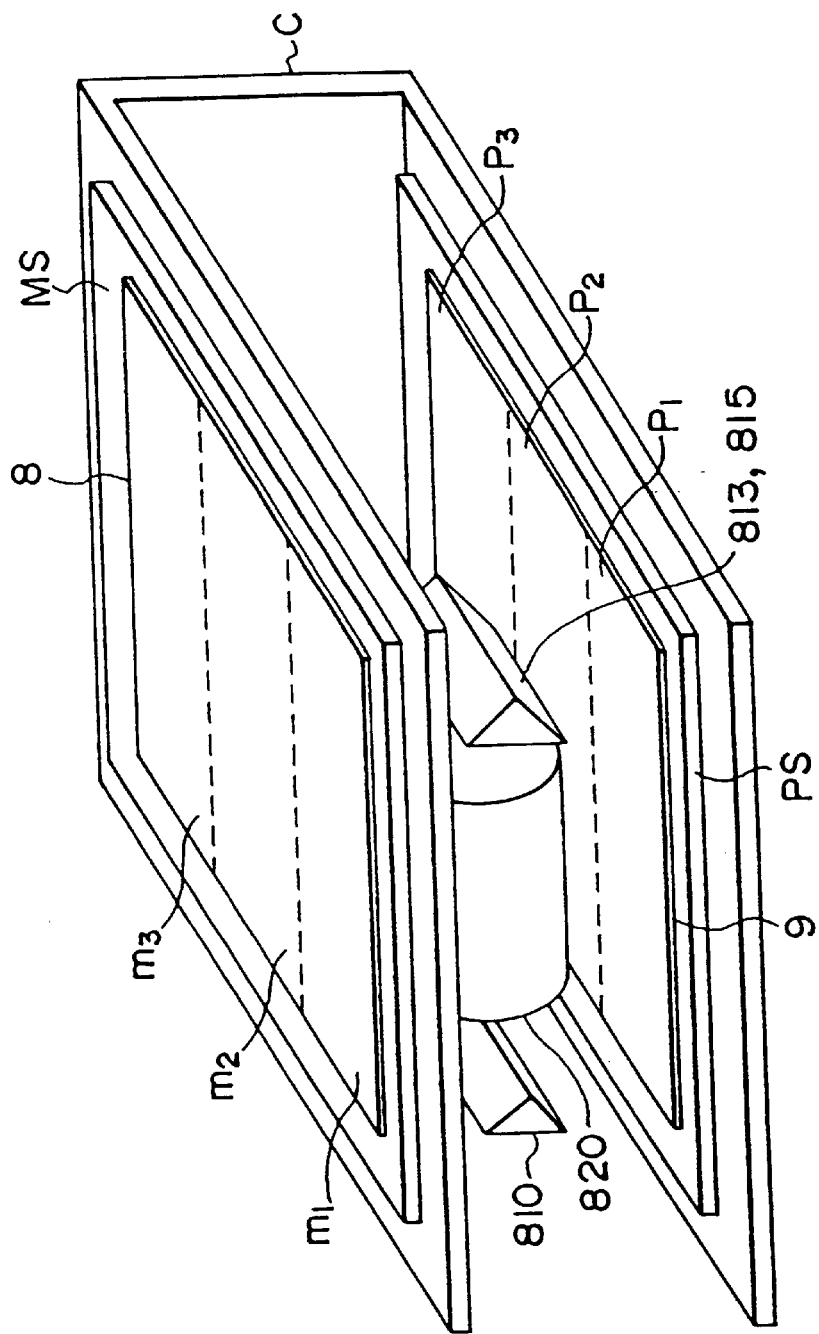
FIG. 50 is a perspective view to show the exposure apparatus in which the projection optical system of eighth embodiment is incorporated.

These mask stage MS and plate stage PS are mounted in a united manner on a carriage C having a C-shaped cross section on the XY plane, as shown in FIG. 50. This carriage C is arranged as movable within the YZ plane.

Returning to FIG. 49, an image-forming lens for projection 20 having the optical axis along the Z direction is disposed between the mask 8 and the plate 9. On one side of the projection image-forming lens 820 there is provided a reflective member 10 having a reflective surface 10a inclined at 45° relative to the mask 8 and a reflective surface 810b inclined at 45° relative to the plate 9. On the other side of the projection image-forming lens 820 there are provided, as a beam transferring member, a reflective member 813 having a reflective surface 13a inclined at 45° relative to the optical axis of the projection image-forming lens 820 and a reflective member 815 having a reflective surface 815a inclined at 45° relative to the optical axis of the projection image-forming lens 820. Here, the reflective surface 813a and reflective surface 815a are arranged as perpendicular to each other.

The projection image-forming lens 820 has a front group GF of a positive refractive power as a whole including lens components L1–L4, an aperture stop AS for defining the numerical aperture of the projection image-forming lens 820, and a rear group GR of a positive refractive power as a whole including lens components L5–L8. In the eighth embodiment, the front group GF and rear group GR have the same structure and are so arranged that the position of the rear focal point of the front group GF and the position of the front focal point of the rear group GR are located at the position of the aperture stop AS. Accordingly, the projection image-forming lens 820 is a both side telecentric optical system.

Also, the reflective member 810 is mounted on a support member 811 fixed to the main body of exposure apparatus, and the reflective members 813, 815 are mounted on a support member 816 similarly fixed to the main body of exposure apparatus. The lens components L1–L8 and aperture stop in the projection image-forming lens 820 are mounted in a lens barrel 812 fixed to the main body of exposure apparatus. Now, light from the mask 8 illuminated by the illumination optical system IL is deflected 90° in optical path by the reflective surface 810a to advance along the direction of the optical axis (Z direction) of the projection image-forming lens 820 and then to reach the lens component L1 in the projection image-forming lens 820. This light successively passes through the lens components L1–L4 then to reach the aperture stop AS. The light passing through the aperture stop AS successively passes the lens components L5–L8 and thereafter is emergent therefrom in parallel with the optical axis of the projection image-forming lens 820. The light emergent from the projection image-forming lens 820 is deflected 90° in optical path by the reflective surface 813a to advance to the field stop 814 fixed to the support member 816. Since the field stop 814 is located at a position. conjugate with the mask 8 with respect to the projection image-forming lens 820, an intermediate image of the mask 8 is formed here. This intermediate image has the lateral magnification in the Y direction of −1 and the lateral magnification in the Z direction of +1.

Next, the light from the intermediate image on the field stop 814 is deflected 90° in optical path by the reflective surface 15a so as to advance in parallel with the optical axis of the projection image-forming lens 820 and then to reach the lens component L8 in the projection image-forming lens 820. This light successively passes the lens components L8–L5, the aperture stop AS, and the lens components L4–L1, and thereafter is emergent in parallel with the optical axis of the projection image-forming lens 820. The light from the projection image-forming lens 820 is deflected 90° in optical path by the reflective surface 810b to reach the plate 9. Here, since the field stop 814 and plate 9 are arranged as conjugate with each other with respect to the projection image-forming lens 820, a secondary image of mask 8 is formed on the plate 9. This secondary image of mask 8 is a real-size erect image with the Y-directional and Z-directional lateral magnifications both being +1. In this manner, the eighth embodiment obtains the erect image by four reflections on the reflective surfaces and two image formations by the projection image-forming lens.

The eighth embodiment uses the same structure for the front group GF and the rear group GR. Namely, since the focal length of the front group GF is equal to the focal length of the rear group GR, the mask 8 and the intermediate image on the field stop 814 are in a relation of magnification of 1, and the intermediate image on the field stop 14 and the secondary image on the plate 9 are in a relation of magnification of 1.

In the eighth embodiment, however, the magnification relation between the mask 8 and the secondary image on the plate 9 is 1 even if the focal lengths of the front group GF and the rear group GR are different from each other. Namely, when the magnification relation between the mask 8 and the intermediate image on the field stop 814 is β (≠±1), the magnification relation between the intermediate image and the secondary image on the plate 9 becomes 1/β. It is thus understood that the magnification relation between the mask 8 and the secondary image on the plate is 1 as a whole. For example, if the magnification between the mask 8 and the intermediate image on the field stop 814 is increased, separations between the reflective surfaces 810a or 810b in the reflective member 10 and the mask 8 or plate 9 (i.e. working distances) can be expanded. Therefore, the projection optical system according to the eighth embodiment has an advantage of high freedom for optic designing.

The exposure operation in the eighth embodiment is briefly described in the following with reference to FIG. 50. The following description shows an example of exposure in which the area on the mask 8 is divided into three regions m1–m3 and the regions m1–m3 are projected for exposure in three regions p1–p3 on the plate 9.

Upon second or further exposure on the plate 9, a positional deviation between the mask 8 and the plate 9 is first detected using an alignment optical system not shown and based on the detection result, alignment is made by moving at least one of the mask stage MS and the plate stage PS in the YZ plane.

After that, driving the carriage C, positioning is made so that the Z-directional edge of the region m1 in mask 8 and the Z-directional edge of the region p1 in plate 9 are located in the field of the projection image-forming lens 820. Then the carriage C is moved at a predetermined speed along the Z direction (scanning direction) while the illumination optical system IL omitted in FIG. 50 illuminates the mask 8. By this, an image of the region m1 in the mask 8 is serially formed in the region p1 on the plate 9.

Next, the carriage C is moved along the Y direction (the direction perpendicular to the scanning direction) in the drawing so as to position the region m2 on the mask 8 and the region p2 on the plate 9 as coincident with each other. After that, the carriage C is moved at the predetermined speed along the Z direction (scanning direction) to serially form an image of the region m2 in the mask 8 on the region p2 on the plate 9.

Finally, the carriage C is moved along the Y direction (the direction perpendicular to the scanning direction) in the drawing so as to position the region m3 on the mask 8 and the region p3 on the plate 9 as coincident with each other. After that, the carriage C is moved at the predetermined speed along the Z direction (scanning direction) to serially form an image of the region m3 in the mask 8 on the region p3 on the plate 9.

Here, in the above exposure operation, the moving direction of carriage C upon scanning exposure of the regions m1, m3 in the mask 8 is different 180° from the moving direction of carriage C upon scanning exposure of the region m2 in the mask 8.

The positioning operation using the alignment optical system not shown may be omitted upon first exposure on the plate 9.

In the eighth embodiment the carriage C is arranged as movable in the YZ plane; if the carriage C is arranged as movable only in the Z direction, the mask stage MS and plate stage PS may be arranged to move in the Y direction, which is equivalent to moving the carriage C in the Y direction.

In the eighth embodiment, if the projection image-forming lens 820 is a one-side telecentric optical system, in order to achieve telecentricity at least on the plate 9 side, the reflective member 810 as a field splitting member should be set on the telecentric side while the reflective members 813, 815 on the non-telecentric side. This achieves telecentricity on the mask 8 side and the plate 9 side. On this occasion, the reflective surfaces 813a, 815a of the respective reflective members 813, 815 should be arranged in such a manner that with respect to the optical axis of the projection image-forming lens 820 principal rays of light beams traveling from the projection image-forming lens 820 to the reflective surface 813a are symmetric with principal rays of light beams traveling from the reflective surface 815a to the projection image-forming lens 820. Since such a one-side telecentric optical system as described above includes a possibility that the magnification of the secondary image of mask 8 on the plate 9 is partially different in the Z direction, the projection image-forming lens 820 is preferably constructed of a both side telecentric optical system.

The eighth embodiment shown in FIG. 49 and FIG. 50 effects exposure by the operation of moving the mask 8 and plate 9 in the direction perpendicular to the scanning direction, but exposure may be effected by single scan with a plurality of projection optical systems.

The exposure apparatus provided with a plurality of projection optical systems according-to the eighth embodiment is next described referring to FIG. 51. FIG. 51 is a diagrammatic drawing to show an arrangement of the plurality of projection optical systems. In FIG. 51, members with like functions as those in FIG. 49 and FIG. 50 are denoted by the same reference numerals, and the same coordinate system as in FIG. 49 and FIG. 50 is employed.

In FIG. 51, five projection optical systems 821–825 are disposed in the space between the mask 8 and the plate 9. In the eighth embodiment, the entire optical system having the projection image-forming lens 820 in FIG. 49, the reflective member 810, the reflective members 813, 815, and the field stop 814 is called as a projection optical system. Each projection optical system 821–825 forms a real-size erect image of a field region ML1–ML5 on the mask 8 in an exposure region PL1–PL5 on the plate 9.

The projection optical systems 821–823 are arranged so that the field regions ML1–ML3 are aligned along the Y direction, while the projection optical systems 824, 825 are arranged so that the field regions ML4, ML5 are aligned along the Y direction. Here, the Z-directional position where the field regions ML1–ML3 are located is different from the Z-directional position where the field regions ML4, ML5 are located. FIG. 51 shows an example in which shapes of each field region ML1–ML5 and each exposure region PL1–PL5 are slit (rectangular), but the shares are arbitrary as long as a sum of lengths in the Z direction (scanning direction), of the field regions ML1–ML5 is always constant in the Y direction (the direction perpendicular to the scanning direction). Specifically, conceivable shapes are hexagonal, arcuate, or trapezoid. The shapes will be detailed hereinafter.

Upon actual exposure, the illumination optical system not shown illuminates the mask 8, and the mask 8 and plate 9 are moved together along the Z direction, whereby the field regions ML1–ML5 scan the entire surf ace on the mask 8 and the exposure regions PL1–PL5 scan the entire surface on the plate 9. By this, an image of mask 8 is serially successively formed on the plate 9.

Since in the exposure apparatus having the projection optical systems 821–823 and the projection optical systems 824, 825 are so arranged that the reflective members 813, 815 thereof as beam transferring members are opposed to each other, separations in the direction perpendicular to the scanning direction (or in the Y direction) can be decreased between the exposure regions PL1–PL3 and the exposure regions PL4, PL5, which is convenient in respect of layout.

It is noted that the number of projection optical systems is not limited to 5 in the second embodiment.

The projection image-forming lens 820 according to the exposure apparatus shown in FIG. 51 preferably satisfies the following condition.

$$\Phi/2 < d \tag{1}$$

where $\Phi$: the maximum lens diameter of the projection image-forming lens 820;

d: the working distance of the projection image-forming lens 820.

Figure 52B:
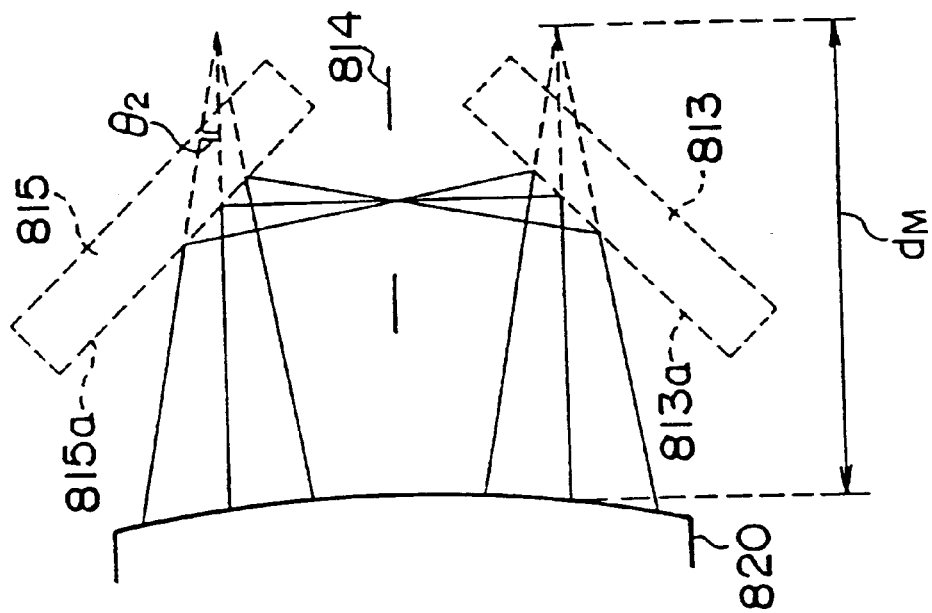
FIGS. 52A and 52B are enlarged views of the eighth embodiment of the optical projection system.
Figure 52A:
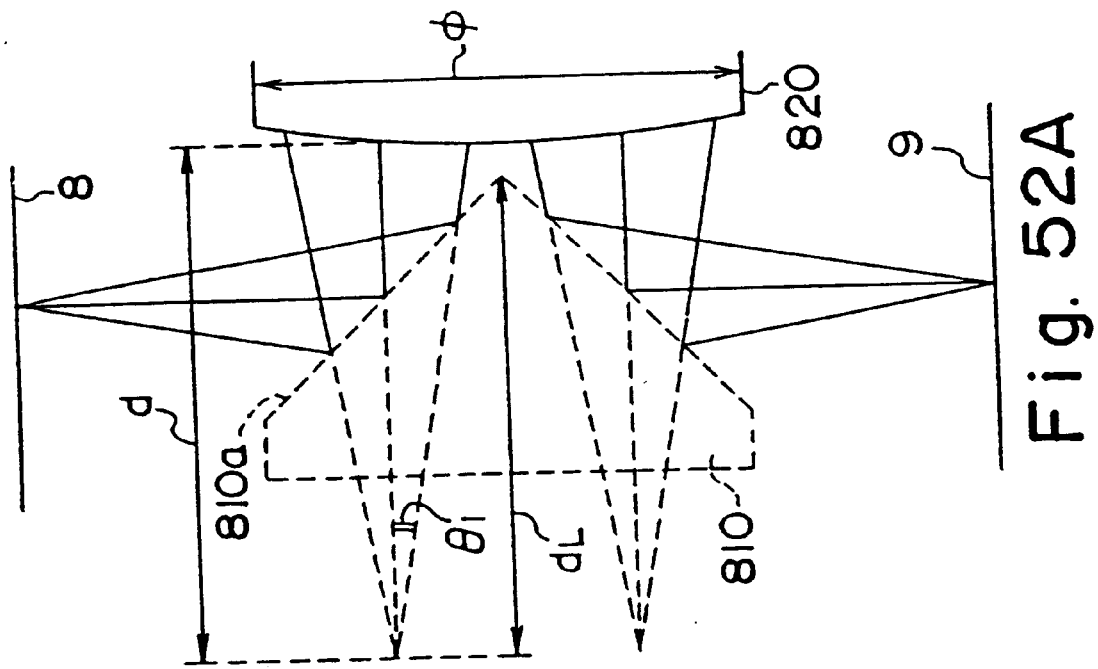

The above working distance d is a distance obtained by ignoring bending of optical path by the reflective surface 810a of reflective member 810, as shown in FIG. 52B which is an enlarged drawing of the projection optical system on the mask 8 and plate 9 side.

Unless the projection image-forming lens 820 satisfies the above condition of Equation (1), the mask 8 interferes with the projection image-forming lens 820 (or lens barrel 12), which is not preferred.

Figure 53A:
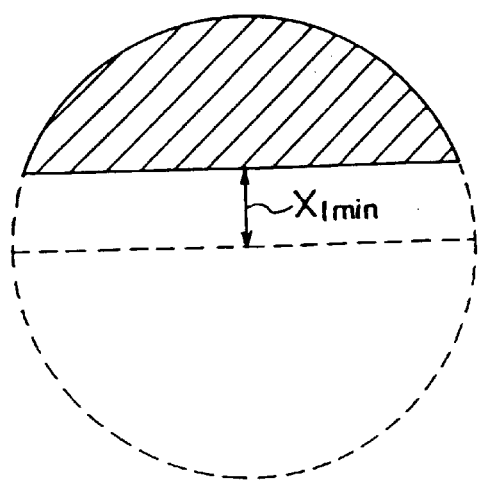
FIGS. 53A and 53B are drawings to show a field of the eighth embodiment of the projection optical system.

Since in the exposure apparatus shown in FIG. 51 the field of the projection image-forming lens 20 is divided into two by the reflective member 810, an eclipse appears in the field region near the optical axis of the projection image-forming lens 820, as shown in FIG. 53A. In FIG. 53A the dashed line represents the entire field of the projection image-forming lens 820 as observed along the Z direction, and the region of effective field (non-eclipsed field) of the projection image-forming lens is indicated by hatching. In FIG. 52B and FIG. 53A, the length in the Z direction, of the eclipse region on the mask 8 surface or the plate 9 surface, that is, the length X1min in the X direction, of the projection image-forming lens 820 as observed along the Z direction, is expressed by the following condition of Equation (2) where dL is a distance between the apex of the reflective member 810 and the object point of the projection image-forming lens 820, and θ1 is an angle obtained from NA1=sin θ1 where NA1 is a numerical aperture of the projection image-forming lens 20.

$$X1\min = dL \cdot \tan \theta 1 \tag{2}$$

Here, the position of the object point of the projection image-forming lens 820 shown in FIG. 52B and the field of the projection image-forming lens 820 shown in FIG. 53A are those obtained by ignoring bending of optical path by the reflective surface 10a of reflective member 10 as represented by the dashed lines in the drawing.

Figure 53B:
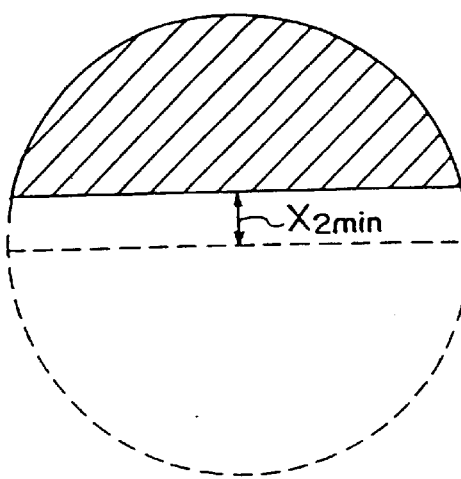

Since on the intermediate image side of the projection image-forming lens 20 the reflective members 813, 815 transfer the light beam in the direction traversing the optical axis of the projection image-forming lens 20, an eclipse appears in the field region on the intermediate image side of the projection image-forming lens 820, as shown in FIG. 53B. In FIG. 53B the entire field region on the intermediate image side of the projection image-forming lens 820 is represented 15- by the dashed line and the effective field (non-eclipsed region) on the intermediate image side of the projection image-forming lens 820 is indicated by hatching. In FIG. 52B and FIG. 53B, the length X2min in the X direction, of the eclipse region on the intermediate image plane is expressed by the following condition of Equation (3) where dM is a distance between the projection image-forming lens 820 and the intermediate image plane, and θ2 is an angle obtained from NA2=sinθ2 where NA2 is the numerical aperture of the projection image-forming lens 820.

$$X2\min = dM \cdot \tan \theta 2 \tag{3}$$

Here, the distance between the projection image-forming lens 820 and the intermediate image plane shown in FIG. 52B cad the field of the projection image-forming lens 820 shown in FIG. 53B are those obtained by ignoring bending of optical path by the reflective members 813, 815.

From the above, the field region and exposure region that can be used in the projection optical system according to the exposure apparatus shown in FIG. 51 are an overlapping region between the two effective fields shown in FIG. 53A and FIG. 53B.

It is thus desired that an area of the aperture portion in the field stop 814 be within the above overlapping region between the effective fields. FIGS. 54A–54D show relations between the shape of the aperture portion in the field stop 814 and the effective field of the projection image-forming lens 820. In FIGS. 54A–54D, the dashed lines represent the effective field of the projection image-forming lens 820 on the plate 9 and the solid lines images of aperture portions in the field stop 14 projected by the projection image-forming lens 820. Here, the effective field of the projection image-forming lens 820 is the overlapping region between the two effective fields shown in FIG. 53A and FIG. 53B.

Figure 54A:
FIGS. 54A, 54B, 54C and 54D are drawings to show is planar positional relationship between the fields and the exposure regions.

FIG. 54A shows an example in which the field stop 814 has a slit aperture portion. For example, this type of slit aperture portion is preferably used for cases of single scanning exposure with a projection optical system.

Figure 54B:
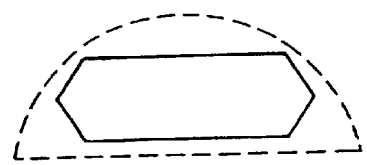
Figure 54C:
Figure 54D:
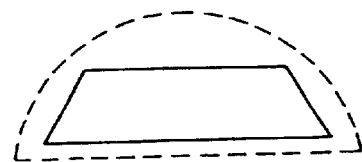

FIG. 54B shows an example in which the field stop 814 has a hexagonal aperture portion, FIG. 54C an example in which the field stop 814 has an arcuate aperture portion, and FIG. 54D an example in which the field stop 814 has a trapezoid aperture portion. As shown, the aperture portions in FIG. 54B to FIG. 54D each have portions where the length of aperture opening portion in the Z direction (scanning direction) is not constant. For example, in the case where two or more scanning exposures are conducted by one projection optical system as shown in FIG. 50 or in the case where a single scanning exposure is conducted by the plurality of projection optical systems as shown in FIG. 51, the portions with lengths of aperture portion not constant should be set in the overlap regions. The overlap regions are regions where a plurality of exposure regions overlap with each other. On this occasion, a sum of lengths in the Z direction, of the plurality of aperture portions in the overlap regions is always constant in the Y direction (the direction perpendicular to the scanning direction). By this arrangement, differences in exposure amount between the plurality of exposure regions become always 0.

Here, as ; shown in FIG. 54A to FIG. 54D, the aperture portion in the field stop 814 is arranged to be located within the effective field of the projection image-forming lens 820.

Figure 55:
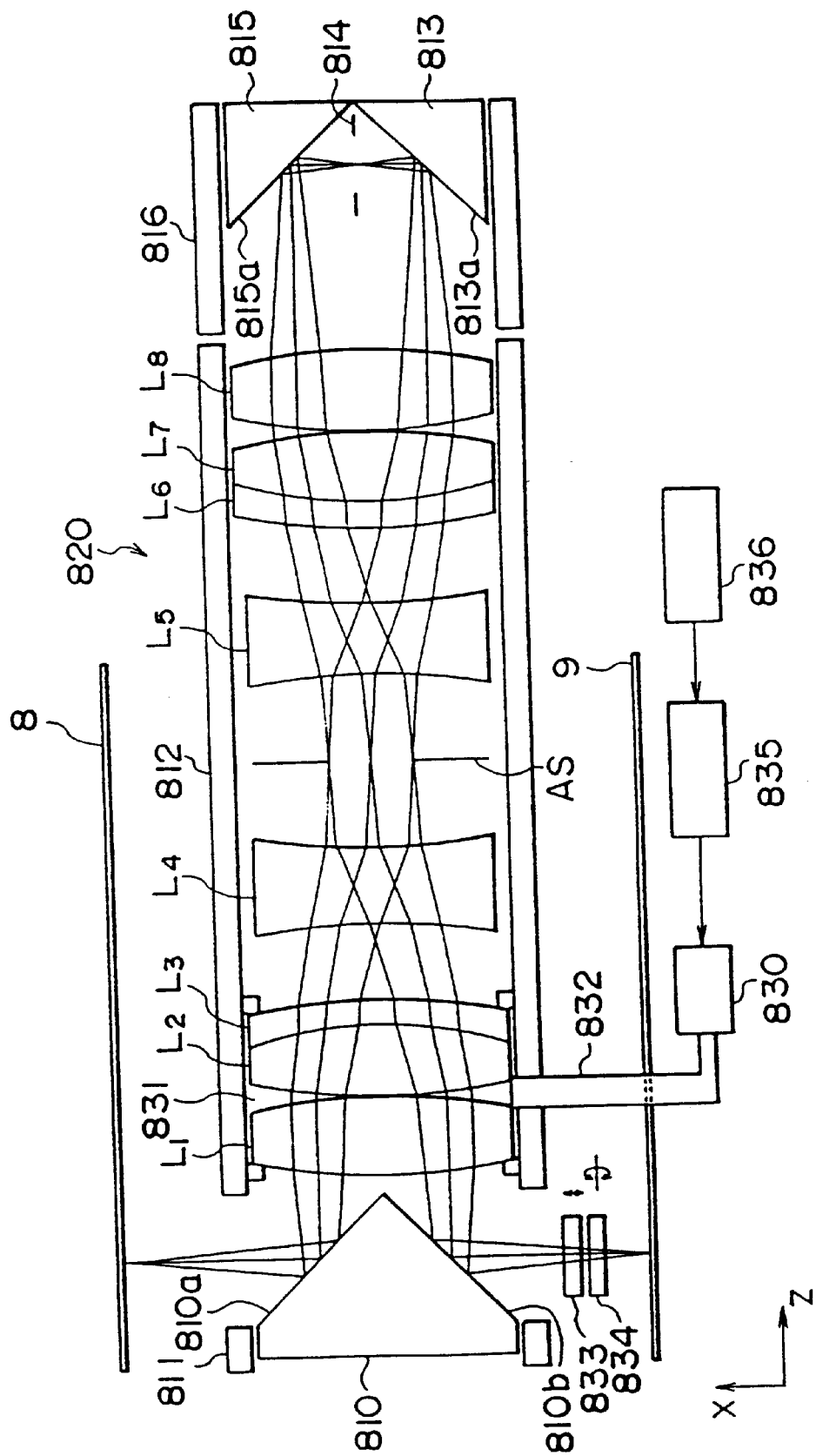
FIG. 55 is a side cross-sectional view to show the modification of the eighth embodiment of the projection optical system.

Next described referring to FIG. 55 is the ninth embodiment of the projection optical system in which an optical member for correcting errors due to environmental changes is incorporated. FIG. 55 is a drawing to show the structure of the projection optical system in the ninth embodiment, which employs the same coordinate system as in FIG. 49. In FIG. 55, members with like functions as those in the embodiment of FIG. 49 are denoted by the same reference numerals.

In FIG. 55, an arrangement different from that of the projection optical system of FIG. 49 is that the projection optical system has a pressure adjusting portion 830 .for changing the pressure of a gas confined in a specific space between the plurality of lens components L1–L8 composing the projection image-forming lens 820, and that a pair of plane-parallel plates 833, 34 disposed in the optical path between the reflective surface 810a of the reflective member 810 and the plate 9.

The pressure adjusting portion 830 shown in FIG. 55 changes, through a pipe 832, the pressure in a lens chamber 831, being a space hermetically closed between the lens component L1 and the lens component L2, to change the refractive index of the lens chamber 31, thereby changing the projection magnification or the focal point position of the projection image-forming lens 820. A specific structure of the pressure adjusting portion 830 is disclosed in Japanese Patent Application No. 58-186267 filed by the present applicant, and therefore, the description thereof is omitted herein.

The embodiment shown in FIG. 55 further has a control portion 835 for controlling the pressure adjusting portion 30, and an input portion 836, for example consisting of a keyboard etc., for inputting information concerning a desired projection magnification. The control portion 835 includes a reference table storing relations between pressures in the lens chamber 831 and projection magnifications (lateral magnifications of secondary image to the mask 8), and the control portion 835 controls the pressure adjusting portion 30 so that the pressure in the lens chamber 831 presents the desired projection magnification by reference to the information concerning the magnification from the input portion 836 and the reference table.

Next described are relations between a change amount of the focal length due to pressure change and, magnification change amount and image plane position change amount when the focal length of the front group GF charges from f to f+Δ because of a pressure change in the lens chamber 31. Actually, there exists a lens chamber strongly influencing the change of projection magnification or a lens chamber largely changing the image plane position, depending upon the refractive power of each lens component in the projection image-forming lens 820. However, in order to simplify the description, it is assumed that the focal lengths of the front group GF and the rear group GR in the projection image-forming lens 20 both are f and that these front group GF and rear group C-R are approximate to thin lenses.

When the focal length of the front group GF changes from f to f+Δ as described above, the magnification change and image plane position change at the intermediate image position are expressed as follows, applying the lens formulas for the front group GF and the rear group GR.

First, the image plane position change of the intermediate image is expressed by the following equation:

$$f\{(f+3\Delta)/(f+2\Delta)-1\} \quad (4);$$

and the magnification change of the intermediate image is given by the following equation:

$$-(f+\Delta)/(f+2\Delta) \quad (5).$$

Also, the image plane position change of the secondary image is given by the following equation:

$$f\{(f+3\Delta)(f+\Delta)\}/(f(f+3\Delta)-\Delta(f+\Delta)) \quad (6);$$

and the magnification of the secondary image at the secondary image plane position, that is, the projection magnification is given by the following equation:

$$(f+\Delta)^2/(f(f+3\Delta)-\Delta(f+\Delta)) \quad (7).$$

Accordingly, if a change amount of the focal length of the front group GF due to a change in pressure in the lens chamber 31 can be calculated, the magnification of the secondary image at the secondary image plane position can be obtained and further, a change amount of the image plane position of the secondary image can also be obtained. With a change of the image plane position of the secondary image the secondary image on the plate 9 becomes defocused; in that case, either the mask 8 or the plate 9, or the both are moved along the X direction. The projection optical system of FIG. 55 includes one lens chamber for changing the pressure, but the lens chamber for changing the pressure is not limited to one. For example, with two lens chambers, only the projection magnification can be changed while keeping the image plane position change of the secondary image expressed by the above Equation (7) at 0. The projection optical system of FIG. 55 includes the lens chamber for changing the pressure only for the front group GF, but a lens chamber for changing the pressure may be set in the rear group GR.

In the projection optical system shown in FIG. 55, a pair of plane-parallel plates 833, 834 are provided in the optical path between the reflective surface 10b of the reflective member 10 and the plate 9.

In FIG. 55, the plane-parallel plate 833 is arranged as rockable about a rotational axis along the Y direction, while the plane-parallel plate 34 as rockable about a rotational axis along the Z direction. Here, when the plane-parallel plate 833 is rocked as inclined relative to the plate 9, the position of the secondary image relative to the field of the projection optical system can be moved in the Z direction. When the plane-parallel plate 834 is rocked. as inclined relative to the plate 9, the position of the secondary image relative to the field of projection optical system can be moved in the Y direction.

Instead of the rocking of the plane-parallel plates, the position of the secondary image can be moved by setting a pair of angular deflection prisms having a wedge-shape cross section in the optical path between the reflective surface 810b and the plate 9 and changing a distance between these angular deflection prisms. Heron, the pair of angular deflection prisms are arranged to have planes making a specific apical angle and to have respective apexes directed opposite to each other.

The operation for moving the position of the secondary image as described above is not essential for cases of single scanning exposure with a projection optical system or cases of plural scanning exposures with a projection optical system as in the embodiment shown in FIG. 49 and FIG. 50. It is, however, preferred that the pair of plane-parallel plates 33, 34 be provided for cases of single scanning exposure with a plurality of projection optical systems as shown in FIG. 51.

The embodiment shown in FIG. 51 is suitable, for example, for fabrication of large-screen liquid crystal panels; in fabricating such large-screen liquid crystal panels, the plate 9 sometimes expands or contracts by a process. Thus, the size of plate 9 upon first exposure would be different from the size of plate 9 upon second exposure, for example.

In that event, the pressure adjusting portion 30 may be used to change the projection magnification upon second exposure from the projection magnification (magnification of the secondary image on the plate 9 to the mask 8) upon first exposure. However, the plurality of exposure regions do not overlap with each other on the plate 9 if the projection magnification is changed.

Figure 56:
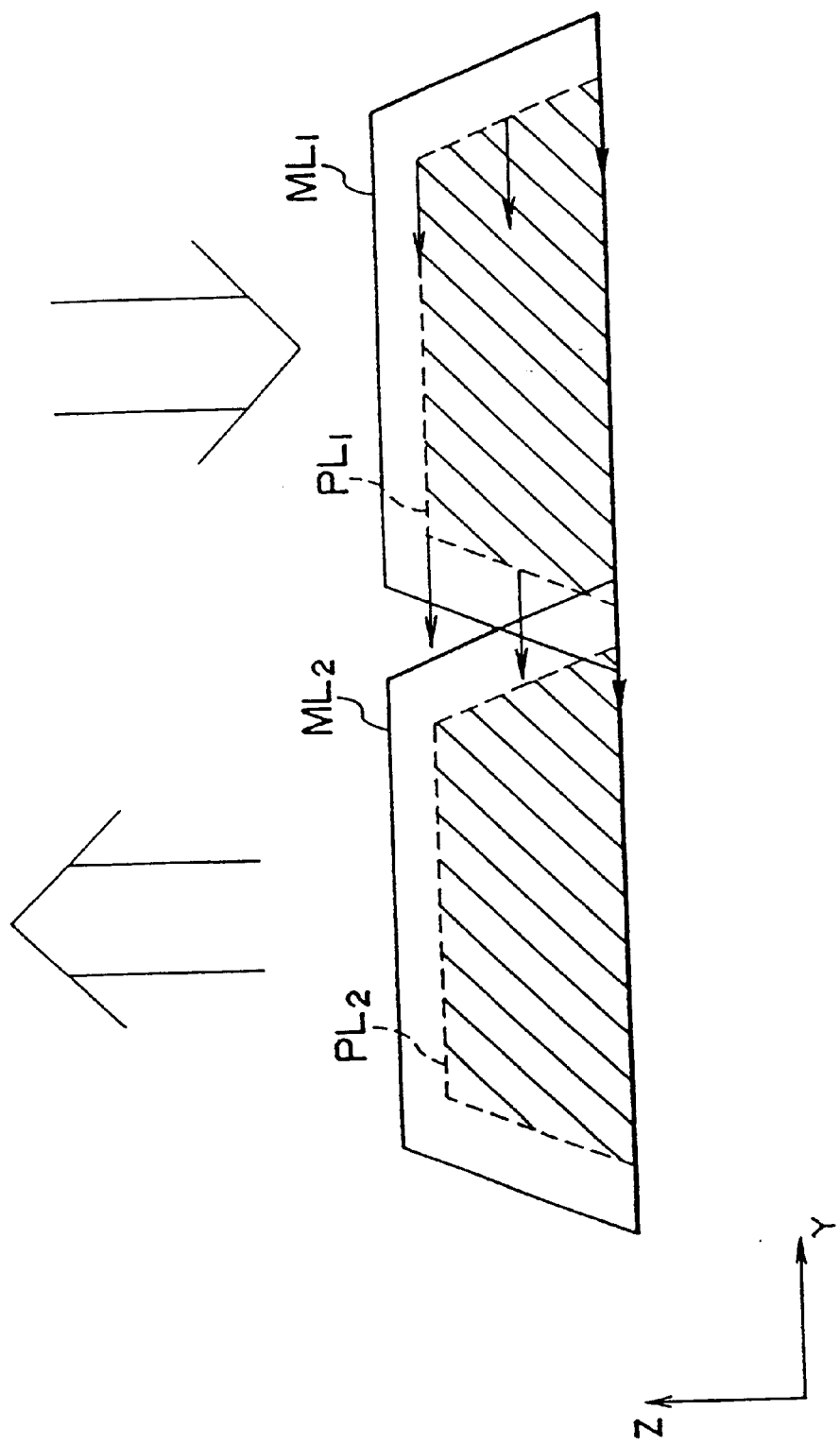
FIG. 56 is a drawing to show relationship between the magnification of the optical system and overlapping area in the eighth embodiment.

This point is described in detail referring to FIG. 56. FIG. 56 is a plan view to show a relation between the field regions on the mask 8 and the exposure regions on the plate 9 where the projection magnification of the projection optical systems 21, 22 is of reduction. FIG. 56 shows an example in which the field regions and exposure regions are trapezoid and adjacent field regions and exposure regions are trapezoid as oriented as similar to each other.

In FIG. 56, the field regions ML1, ML2 on the mask 8 form secondary images thereof on the exposure regions PL1, PL2 on the plate 9 through the projection optical systems 821, 822 not shown. Since the magnification of exposure regions PL1, PL2 is of reduction, portions of overlap regions on the mask 8 do not overlap with each other on the mask 8.

Thus, the plane-parallel plate 34 is rocked in the projection optical system shown in FIG. 55 so as to move the exposure region PL2 in the Y direction. On this occasion, a rocking angle of the plane-parallel plate 834 is so determined as to make the overlap regions between the exposure regions PL1, PL2 come to overlap with each other in the Y direction on the plate 9. The rocking angle of the plane-parallel plate can be obtained from the projection magnification of the projection optical systems 821–825, the size of the field regions ML1–ML5 of the projection optical systems 821–825, and the positions of the field regions ML1–ML5 relative to the entire field of the projection optical systems.

Figure 57:
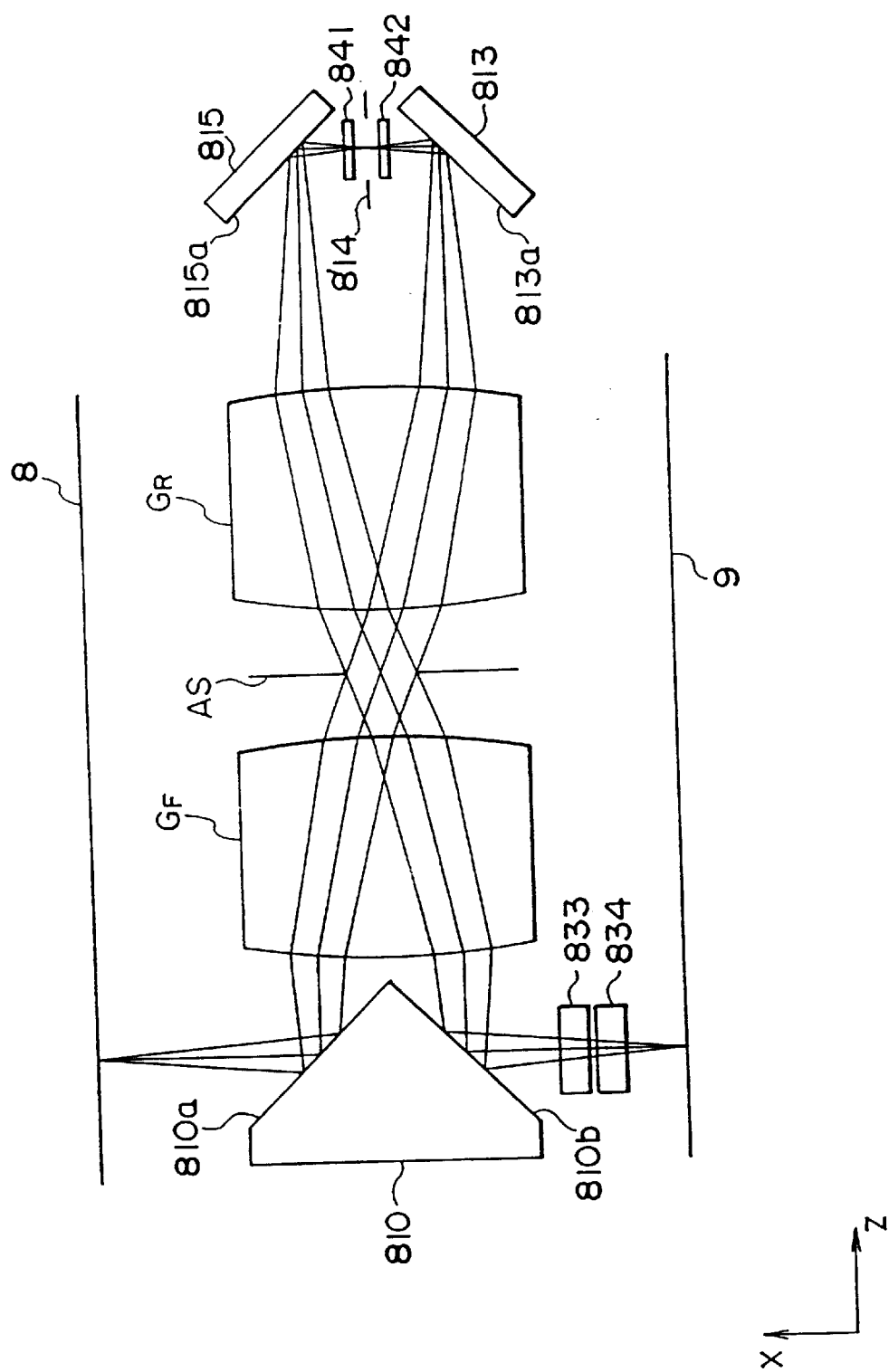
FIG. 57 is a side cross-sectional view to show the ninth embodiment of the projection optical system.

The above-described example is arranged to move only the exposure region PL2, but alternatively, the exposure region PL1 may be moved or both the exposure regions PL1, PL2 may be moved. Further, when the position of exposure region PL1, PL2 needs to be moved in the Z direction, the plane-parallel plate 33 should be rocked in the projection optical system shown in FIG. 55. The projection optical system shown in FIG. 55 is arranged to adjust the pressure in the lens chamber in the projection image-forming lens 820 so as to change the projection magnification, but the projection magnification may be changed by providing a lens of a small refractive power near the field stop 814 and moving the lens along the optical axis. Such an example is described referring to FIG. 57. FIG. 57 employs the same coordinate system as FIG. 49. To simplify the description, members with like functions as those in the projection optical systems in FIG. 49 and FIG. 55 are denoted by the same reference numerals.

In FIG. 57, lenses 841, 842 are disposed on either side of the field stop 814 in the optical path between the reflective surface 13a and the reflective surface 15a. These lenses 841, 842 are movable along the optical-axis direction. Here, moving the lenses 841, 842 along the optical-axis direction, a total focal length of the projection image-forming lens 820 and the lens. 841 or a total focal length of the projection image-forming lens 820 and the lens 842, or the both change. This can change the projection magnification of the overall. projection optical system.

Here, for changing the magnification of the field stop 814 (the magnification of an image of the field stop 814 projected on the plate 9), the above lenses 841, 842 should be disposed in the optical path on the side of the reflective surface 815a with respect to the field stop 814. For cases not to change the magnification of field stop 814, the above lenses 841, 842 should be disposed in the optical path on the side of the reflective surface 13a with respect to the field stop 814.

In the case where the projection optical systems shown in FIG. 55 or FIG. 57 are applied to the exposure apparatus shown in FIG. 51, it is preferred that inputting means for inputting information concerning an amount of expansion or contraction of plate 9 be provided and that, based on the information concerning an amount of expansion or contraction, magnification control be made for the plurality of projection optical systems 821–825. In that case it is preferred that a relation between amounts of expansion or contraction and pressures in the lens chamber (in case of FIG. 55) or moving amounts of lenses 841, 842 (in case of FIG. 57) be stored. in the form of reference table. Here, if the magnification of projection optical system is changed in order to correct expansion or contraction of plate 9, movement of the secondary image by each projection optical system 821–825 needs to be corrected; it: is thus preferred that the above reference table store a relation between expansion or contraction amounts and rocking angles of the plane-parallel plates 833, 834.

If the plate 9 is partially expanded or contracted, the magnifications of projection optical systems 821–825 and moving amounts of the respective secondary images may be controlled independently of each other.

Further, when the projection optical system of FIG. 55 is applied to the exposure apparatus shown in FIG. 51, the projection optical systems 821–825 may be controlled by a single pressure adjusting portion. In that case, lens chambers formed in the respective projection optical systems 821–825 are arranged to be one space, and the pressure adjusting portion controls the pressure in this space.

In the projection optical systems shown in FIG. 49, FIG. 55 and FIG. 57, the reflective surfaces 813a, 815a as the beam transferring member may be constructed of dichroic mirrors for reflecting the exposure light but transmitting light of wavelengths different from that of the exposure light (for example, wavelengths longer than the exposure light). When the reflective surfaces 813a, 815a are constructed of dichroic mirrors, an alignment optical system may be disposed on the transmission side of either the reflective surface 813a or the reflective surface 815a or each of the reflective surfaces 813a, 815a. This arrangement permits position detection between the mask 8 and the plate 9 through the projection optical system; so-called alignment of the TTL (Through the Lens) method.

Next described is the adjusting method of projection optical system according to the present embodiment. First, aberration, magnification, and telecentricity of the projection image-forming lens 820 are controlled to specific values. After the angle is adjusted to 90° between the reflective surface 810a and the reflective surface 810b in the reflective member 810, it is fixed to the supporting member 811. After the angle is adjusted to 90° between the reflective surface 813a of reflective member 813 and the reflective surface 815a of reflective member 815, it is fixed to the !supporting member 816. After that, the lens barrel 812 of the projection image-forming lens 820 is fixed to the main body of exposure apparatus. Next, the supporting member 816 is positioned so that the reflective surfaces 813a, 815a each make 45° relative to the optical axis of the projection image-forming lens 820, and this supporting member is fixed to the main body of exposure apparatus. Finally, the supporting member 811 is positioned so that the reflective surfaces 810a, 810b each make 45° relative to the optical axis of the projection image-forming lens, and this supporting member 811 is fixed to the main body of exposure apparatus.

By the above described adjusting method, errors due to the reflective surfaces 810a, 810b, 813a, 815a can be obtained separately from errors due to the projection image-forming lens 820; thus, it is easily recognized what part needs to be controlled, thereby presenting an advantage of easy adjustment of the entire projection optical system.

In the projection optical system in the above-described each embodiment, the reflective member 810 as the field splitting member is arranged to have the reflective surfaces 810a, 810b; but this reflective member 10 may be constructed of a prism. Further, the reflective surfaces 810a, 810b are integrally formed on the reflective member 810, but they may be divided into a member having the reflective surface 810a and a member having the reflective surface 810b. Further, if each reflective member 810, 813, 815 is arranged as rotatable about the X, Y, Z axes, there is an advantage that adjustment of the entire projection optical system becomes possible.

Further, since the exposure apparatus in the above-described eighth, tent and tenth embodiments can also obtain the erect image of mask 8 by a projection optical system, the distance between the mask 8 and the plate 9 can be shortened. This presents an advantage of easiness to enhance the stiffness of carriage C for moving the mask 8 and plate 9 together.

The above adjusting method as described above can facilitate optical adjustment such as adjustment of deviation of optical axis or adjustment of aberration. Generally, in the case where a reflective surface is present at the position of the pupil of projection optical system, there arises a problem that the image position of projection optical system moves depending upon inclination of the reflective surface; but, in the eighth and ninth embodiments, there exists no member for deflecting light at the pupil position of projection optical system, thereby enabling to stabilize the image position.

Next an another embodiments of the exposure appratus according to the present invention will be explained below.

Figure 58:
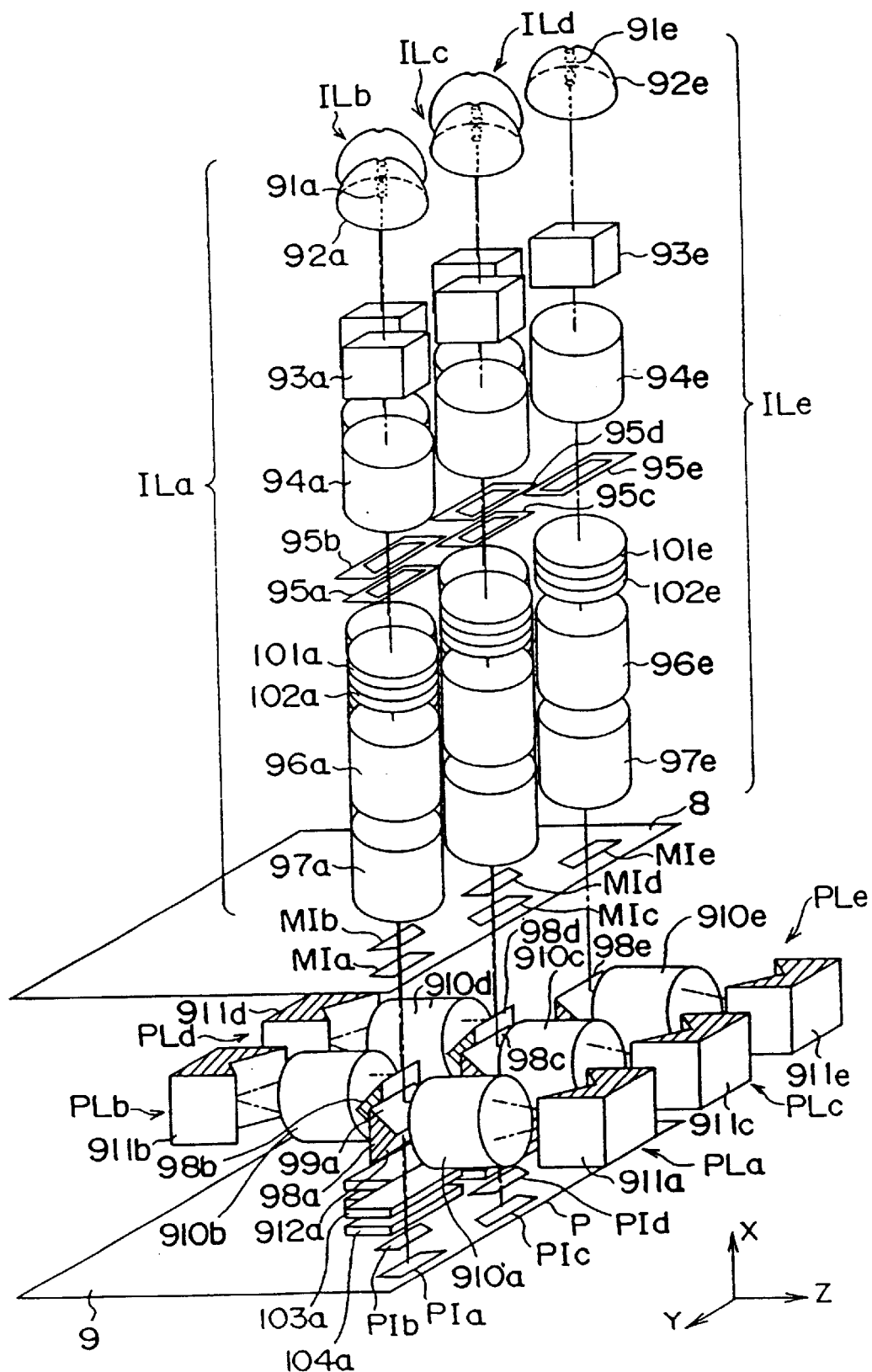
FIG. 58 is a perspective view to show an another exposure according to the present invetion.

FIG. 58 is a drawing to schematically show an embodiment of the exposure apparatus according to the present invention. In FIG. 58, the Z direction is taken along the scanning direction of the mask 8 and the plate 9, the Y direction along the direction perpendicular to the scanning direction in the plane of mask 8 or plate 9, and the X direction along the direction normal to the mask 8 and plate 9.

In FIG. 58, five illumination optical systems ILa–ILe each form five illumination regions MIa–MIe on the mask 8.

Since these illumination optical systems ILa–ILe each have the same structure, only the structure of illumination optical system ILa is described herein.

The light source 1a is, for example, a super-high pressure mercury lamp emitting exposure light of the g-line (435.8 nm) or the h-line (404.7 nm). The exposure light from the light source 1a is reflected and collected by an ellipsoidal mirror 92a and then passes through an input lens not shown to become a parallel light beam, which is incident into an optical integrator 93a. The optical integrator 93a is constructed, for example, of a fly's eye lens, which forms a plurality of secondary light sources on the exit plane thereof, based on the exposure light from the light source 1a. The light from the optical integrator 93a is condensed by a condenser lens 4a, which has the front focal point located on the plane of secondary light sources formed by the optical integrator 93a, to uniformly illuminate the field stop 95a. The light passing through an aperture portion in the field stop 95a then passes through a pair of plane-parallel plates 101a, 102a and a relay lens system 96a, 97a in this order to reach the mask 8. Here, the field stop 95a and the surface of mask 8 are kept conjugate with each other by the relay lens system 96a, 97a consisting of a lens unit 96a and a lens unit 97a, and an illumination region MIa with uniform light-quantity distribution is formed on the mask 8.

Thus, illumination regions MIa–MIe defined in a predetermined shape by the field stops 5a–5e are formed on the mask 8, thereby illuminating only pattern portions in the illumination regions MIa–MIe on the mask 8.

Next, light from the pattern portions on the mask 8 illuminated by the illumination regions MIa–MIe travels through the five projection optical systems PLa–PLe provided in optical paths between the mask 8 and the plate 9 to form erect images of the pattern portions of mask 8 in the illumination regions MIa–MIe, as exposure regions PIa–PIe on the plate 9. Since these projection optical systems PLa–PLe each have the same structure, only the structure of projection optical system PLa is described herein.

The projection optical system PLa has a triangular mirror member 98a having a reflective surface 99a inclined at 45° relative to the surface of mask 8 (YZ plane) and a reflective surface 12a inclined at 45° relative to the surface of plate 9 (YZ plane), a lens system 910a having an optical axis parallel to the surface of mask 8 and the surface of plate 9, and a roof reflective member 911a having two mutually orthogonal reflective surfaces. Here, a ridgeline between the two reflective surfaces in the roof reflective member 911a is arranged to be located at the position of the front focal point of the lens system 10a.

Such a projection optical system is disclosed, for example, in Japanese Paten Publication No. 49-35453.

Now, the light from the pattern on the mask 8 illuminated by the illumination region MIa is deflected 90° in optical path by the reflective surface 99a of the triangular mirror member 98a, then passes through the lens system 910a, thereafter is reflected by the roof reflective member 911a, and again enters the lens system 910a. The light from the roof reflective member 911a and through the lens system 910a is deflected 90° in optical path by the reflective surface 912a of the triangular reflective member 98a, and thereafter passes through the pair of plane-parallel plates 103a, 104a in the named order to reach the plate 9. Here, since in the projection optical system PLa the image-forming relation in the Y direction is inverted by the roof reflective member 911a, a real-size erect image of mask 8 is formed on the plate 9 even if the system is of a single image formation.

Although not shown in FIG. 58, the mask 8 and plate 9 are mounted on respective stages movable along the Z direction in the drawing in the exposure apparatus according to the present embodiment. Then, moving the mask 8 and plate 9 together while illuminating the mask 8 by the illumination optical systems ILa–ILe, real-size erect images of mask 8 illuminated by the illumination regions MIa–MIe are serially formed on the plate 9, whereby the pattern of mask 8 is transferred onto the plate 9.

The present embodiment includes five sets of illumination optical systems and projection optical systems, but the number of sets of illumination optical systems and projection optical systems is not limited to only five. The illumination optical systems ILa–ILe in the present embodiment have the straight optical axes, but mirrors for deflection of optical path may be provided in the respective optical paths of illumination optical systems ILa–ILe. Since the present embodiment includes the plural illumination optical systems, with mechanical assembling errors there could arise a problem that the images of field stops 5a–5e are focused off predetermined positions on the mask 8, i.e., that the illumination regions MIa–MIe deviate from the predetermined positions. Thus, in the present embodiment, there are plane-parallel plates 101a, 102a to 101e, 102e provided as illumination region moving means in the optical paths of illumination optical systems ILa–ILe. The description continues by reference to FIG. 59 and FIG. 60.

Figure 59:
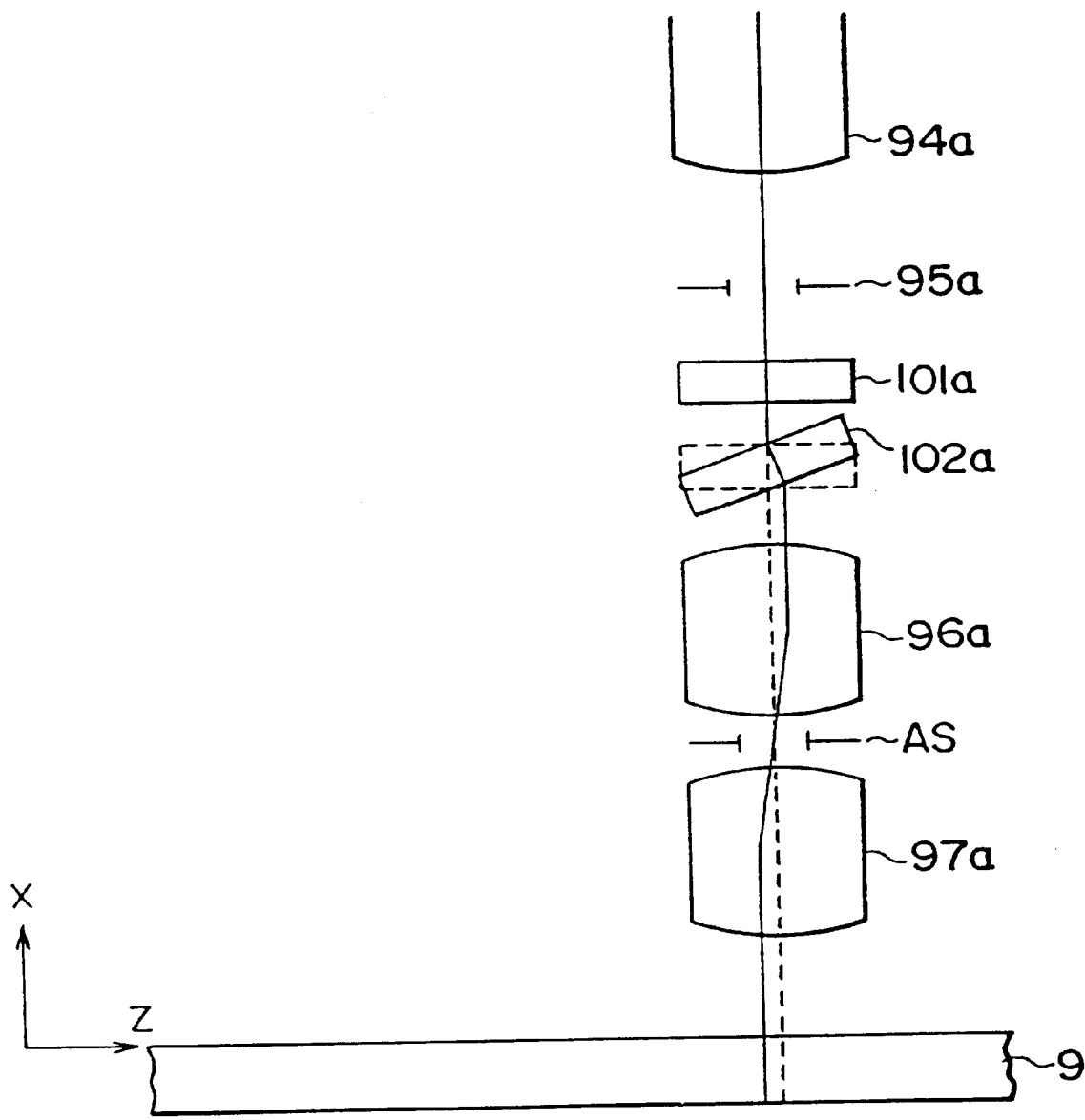
FIG. 59 is a side cross-sectional view to show a main portion of the illumination system of the anothe exposure apparatus shown in FIG. 59.
Figure 60:
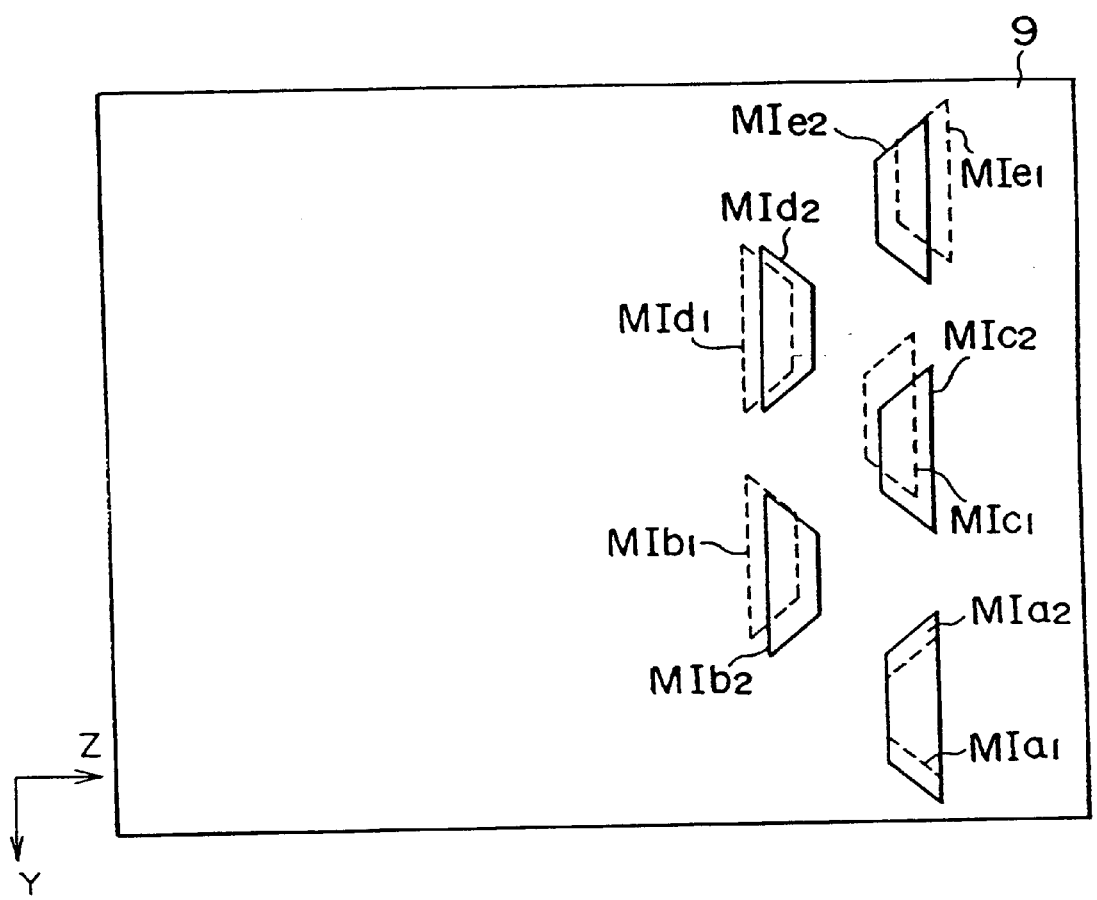
FIG. 60 is a planar view to show the arrangement of illumination regions on a mask in the anothe exposure apparatus shown in FIG. 58.

FIG. 59 is a drawing to show the XZ cross section of the illumination optical system ILa. FIG. 59 shows only the optical path from the condenser lens 94a to the mask 8. FIG. 60 is a YZ plan view to show the illumination regions being the images of field stops 95a–95e on the mask 8.

In FIG. 59, the plane-parallel plate 101a is arranged as rotatable about an axis along the Z direction in the drawing, and the plane-parallel plate 102a is arranged as rotatable about an axis along the Y direction in the drawing (the direction normal to the plane of drawing). Since the position of the rear focal point of the lens unit 96a is arranged so as to be coincident with the position of the front focal point of the lens unit 97a, the relay lens units 96a, 97a compose a both side telecentric optical system.

Now, referring to FIG. 59, when the plane-parallel plate 102a is located at the reference position represented by the dotted line in the drawing, that is, when the normal line to the plane-parallel plate 102a is coincident with the optical axis of the illumination optical system ILa, there is no change in the relation between the field stop 95a and the image of field stop 5a with respect to the optical axis of illumination optical system. Next, when the plane-parallel plate 102a is rotated about the axis along the Y direction from the reference position represented by the dotted line in the drawing to the position represented by the solid line in the drawing, a light beam from the field stop 95a is horizontally shifted in the Z direction by the plane-parallel plate 102a as shown by the solid line in the drawing, and thereafter enters the relay lens system 96a, 97a. The light beam from the plane-parallel plate 102a and through the relay lens system 96a, 97a reaches the mask 8 in the horizontally shifted state relative to the optical axis of illumination optical system ILa (the optical axis of the relay lens system 96a, 97a). On this occasion, the image (illumination region MIa) of the field stop 95a formed on the mask 8 moves in the Z direction in the drawing. When the plane-parallel plate 101a is rotated about the axis along the Z direction in the drawing, the image (illumination region MIa) of the field stop 95a formed on the mask 8 moves in the Y direction in the drawing.

In the another embodiment, as described, the illumination region MIa on the mask 8 can be moved within the YZ plane through rotations of the pair of plane-parallel plates 101a, 102a. Since the illumination optical systems ILb–ILe have the same structure as the illumination optical system ILa, the description herein concerned only the structure of one illumination optical system ILa.

Next described referring to FIG. 60 is an adjusting method where the illumination regions MIa–MIe by these illumination optical systems ILa–ILe deviate from the predetermined relation in the Plurality of illumination optical systems ILa–ILe because of errors upon assembling. In FIG. 60, in case of assembling errors existing in the plurality of illumination optical systems ILa–ILe, the field stops 5a–5e are focused, as the illumination regions MIa1–MIe1 as shown by the dashed lines in the drawing, on the surface of mask 8. When scanning exposure is made in such a state by moving the mask 8 and plate 9 along the Z direction in the drawing, an illuminance distribution on the surface of mask 8 cannot be uniform in the Y direction (the direction perpendicular to the scanning direction), causing variations in exposure amount on the plate 9. This will result in causing a problem that the linewidth of pattern transferred onto the Plate 9 is partially different.

Thus, in the method embodiment, the images of field stops 95a–95e are moved from the illumination regions MIa1–MIe1 before adjustment to the illumination regions MIa2–MIe2 indicated by the solid lines in FIG. by rotating the plane-parallel plates 101a, 102a–101e, 102e in the illumination optical systems ILa–ILe about the axes along the Y direction or the Z direction. On this occasion, the illumination regions MIa2–MIe2 after adjustment keep a sum of lengths of illumination regions in the Z direction (scanning direction) always constant at any position in the Y direction. This can realize a uniform illuminance distribution in the Y direction on the mask 8, which can in turn make exposure amounts uniform on the plate 9.

Although the method embodiment is so arranged that the illumination regions on the mask 8 are movable in two directions in the YZ plane, it is sufficient in order to obtain a uniform illuminance distribution on the mask 8 that the illumination regions are arranged as movable at least in the Y direction. Namely, a uniform illuminance distribution can be achieved on the mask 8 as long as each illumination optical system ILa–ILe includes the plane-parallel plate 101a–101e rotatable about the axis along the Z direction.

Since the another embodiment of the exposure apparatus has the plural projection optical systems PLa–PLe, the problem that the illumination regions MIa–MIe are focused away from the predetermined positions on the plate 9 will arise if there exist mechanical assembling errors between the projection optical systems. In that event, the problem of deviation of the exposure regions PIa–PIe from the predetermined positions will arise even if the illumination regions MIa–MIe are set to the predetermined positions by the illumination region moving means in the illumination optical systems ILa–ILe.

Thus, the another embodiment of the exposure apparatus is provided with the pair of plane-parallel plates 103a, 104a–103e, 104e as exposure region moving means in the optical path of each projection optical system PLa–PLe. This is next described referring to FIG. 61 and FIG. 58.

Figure 61:
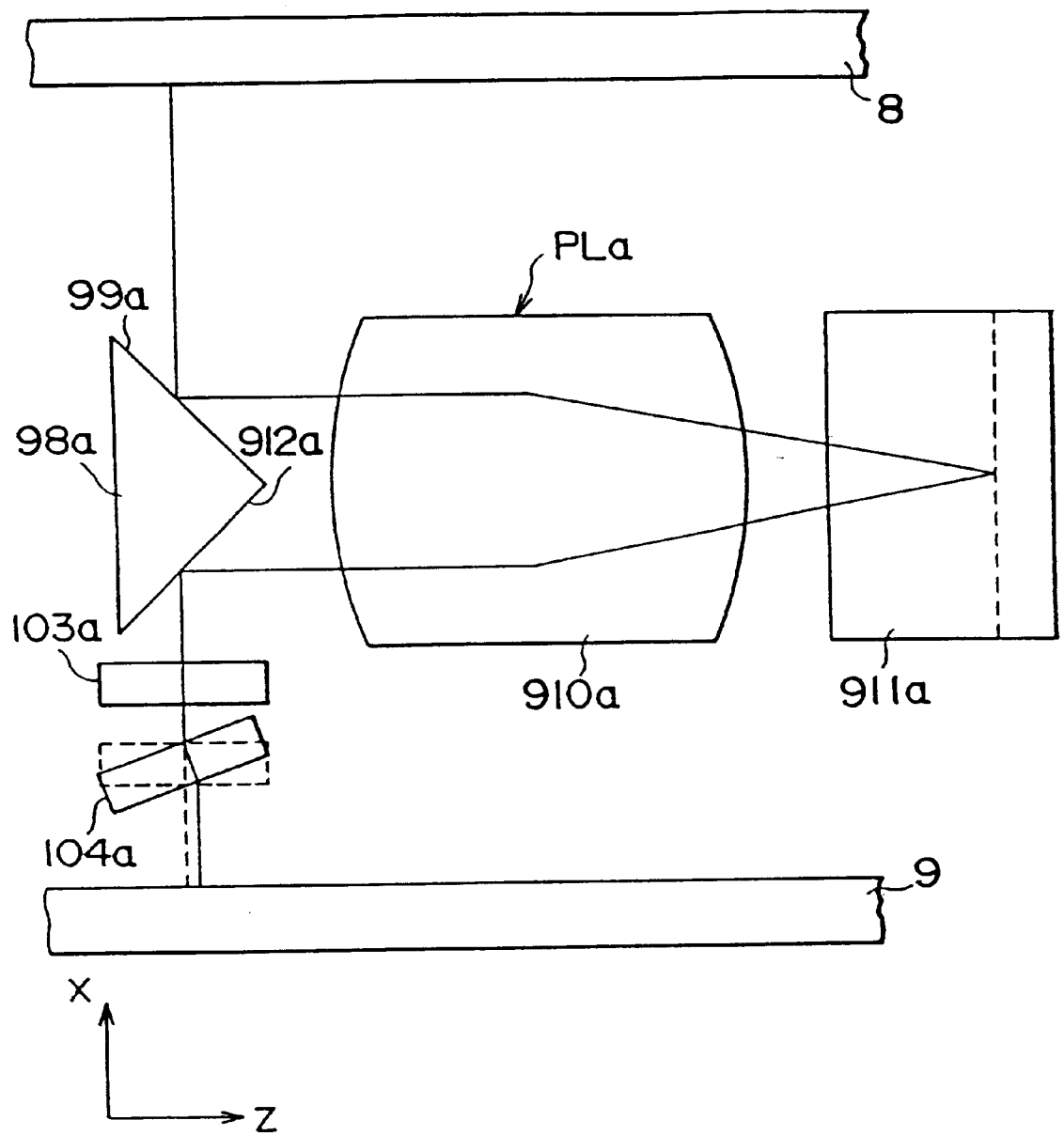
FIG. 61 is a side cross-sectional view to show the projection optical system of the exposure apparatus shown in FIG. 58.
Figure 62:
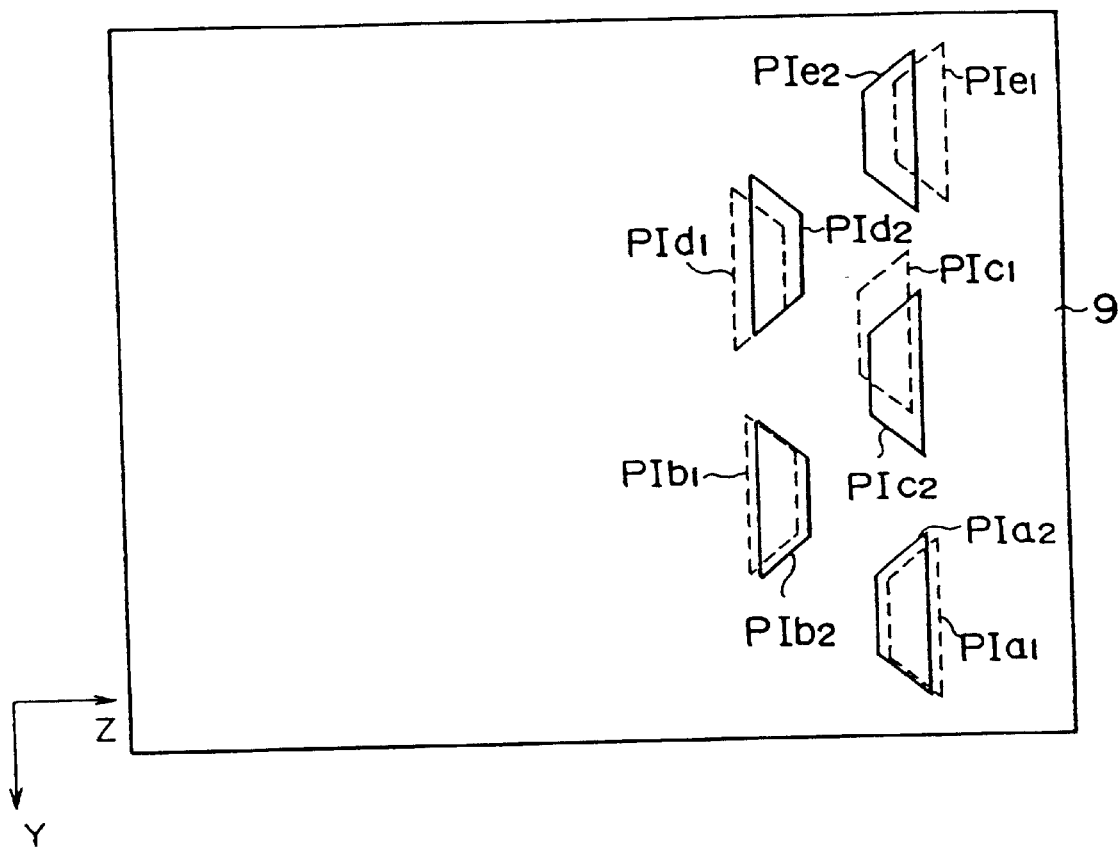
FIG. 62 is a drawing to show the arrangement of exposure regions on a plate of the exposure apparatus shown in FIG. 58.

FIG. 61 is a drawing to show an XZ cross section of the projection optical system PLa, and FIG. 62 is a YZ plan view to show exposure regions being images of illumination regions MIa–MIe on the plate 9.

In FIG. 61, the plane-parallel plate 103a rotatable about the axis along the Z direction in the drawing and the plane-parallel plate 104a rotatable about the axis along the Y direction (the direction normal to the plane of drawing) in the drawing are disposed in the optical path between the triangular mirror member 8a in the projection optical system PLa and the plate 9.

Now, in FIG. 61, when the plane-parallel plate 104a is located at the reference position represented by the dashed line in the drawing, that is, when the normal line to the plane-parallel plate 104a is parallel to the optical axis of projection optical system PLa, the relation between the illumination region MIa (not shown) and the exposure region PIa (not shown) does not change relative to the optical axis of projection optical system PLa.

Next, when the plane-parallel plate 104a is rotated about the axis along the Y direction from the reference position shown by the dashed line in the drawing to the position indicated by the solid line in the drawing, a light beam from the illumination region MIa is horizontally shifted in the Z direction as shown by the solid line in the drawing by the plane-parallel plate 104a, and thereafter reaches the plate 9. This moves the exposure region PIa (an image of illumination region MIa) formed on the plate 9 in the Z direction in the drawing. When the plane-parallel plate 103a is rotated about the axis along the Z direction in the drawing, the exposure region formed on the plate 9 moves in the Y direction in the drawing.

In the method embodiment, as described, the exposure region PIa on the plate 9 can be moved within the YZ plane by the operation of rotating the pair of plane-parallel plates 103a, 104a. Since the other projection optical systems PLb–PLe have the same structure as the above-described projection optical system PLa, only the structure of one projection optical system PLa is described herein.

Next, in FIG. 62, if there are errors in assembling for the plurality of projection optical systems PLa–PLe, the illumination regions MIa–MIe on the mask 8 are focused as exposure regions PIa1–PIe1, as shown by dashed lines in the drawing, on the plate 9. Supposing scanning exposure is made by moving the mask 8 and plate 9 along the Z direction in the drawing, the illuminance distribution on the plate 9 is not uniform in the Y direction (the direction perpendicular to the scanning direction), thus causing variations in exposure amounts on the plate 9. This will cause a problem that the linewidth of pattern of mask 8 transferred onto the plate 9 is partially different.

Thus, in the method embodiment, the images of illumination regions MIa–MIe are moved from the exposure regions PIa1–PIe1 before adjustment to exposure regions PIa2–PIe2 shown by the solid lines in FIG. 62 by rotating the plane-parallel plates 103a, 104a–103e, 104e in the Projection optical systems PLa–PLe about the axes along the Y direction or the Z direction, as described above. On this occasion, the exposure regions PIa2–PIe2 after adjustment keep a sum of lengths of the illumination regions in the Z direction (scanning direction) always constant at any position in the Y direction. This can achieve a uniform illuminance distribution in the Y direction on the plate 9, which can in turn make exposure amounts uniform on the plate 9.

Although the another embodiment is so arranged that the exposure regions on the plate 9 are movable in the two directions in the YZ plane, it is sufficient in order to obtain a uniform exposure distribution on the plate 9 that the exposure regions can be moved at least in the Y direction. Namely, a uniform exposure distribution can be achieved on the plate 9 as long as only the plane-parallel plates 103a–103e rotatable about the axis along the Z direction are provided in each projection optical system PLa–PLe.

Figure 63B:
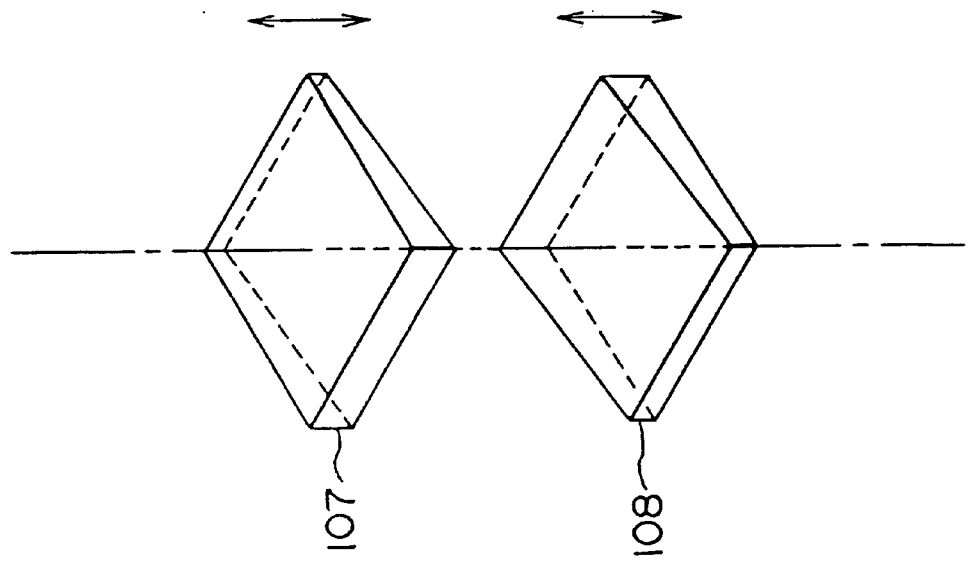
FIGS. 63A and 63B are drawings to show the modifications of illumination-region transfer means and exposure-region transfer means usable in the exposure apparatus shown in FIG. 58.
Figure 63A:
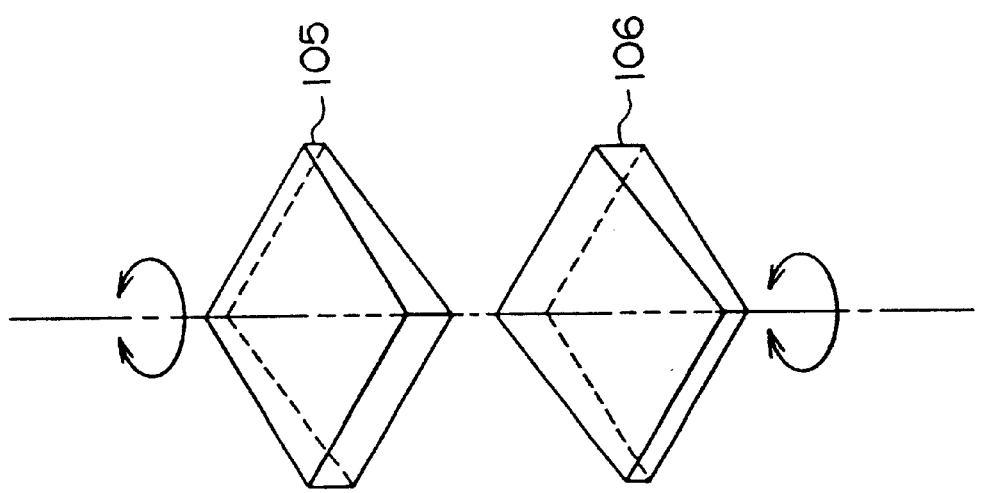

The another embodiment as described above includes the pair of plane-parallel plates as the illumination region moving means or as the exposure region moving means, but instead thereof, a pair of angular deflection prisms 105, 106 rotatable about the optical axis or illumination optical system or projection optical system may be provided, for example as shown in FIG. 63A. Also, for example as shown in FIG. 63B, a pair of angular deflection prisms 107, 108 movable in the directions along the optical axis of illumination optical system or projection optical system may be provided instead of the pair of plane-parallel plates.

The present another may be so arranged that the field stop 95a–95e in each illumination optical system is position-adjustable. In that case, for example by arranging the field stops 95a–95e as movable in the Y direction and the Z direction, the illumination regions MIa–MIe formed on the mask can be moved along the two directions in the YZ plane. Also, the illumination regions MIa–MIe formed on the mask can be rotated within the YZ plane, for example, if the field stops 5a–5e are arranged as rotatable about the optical axes of illumination optical systems ILa–ILe.

Figure 64:
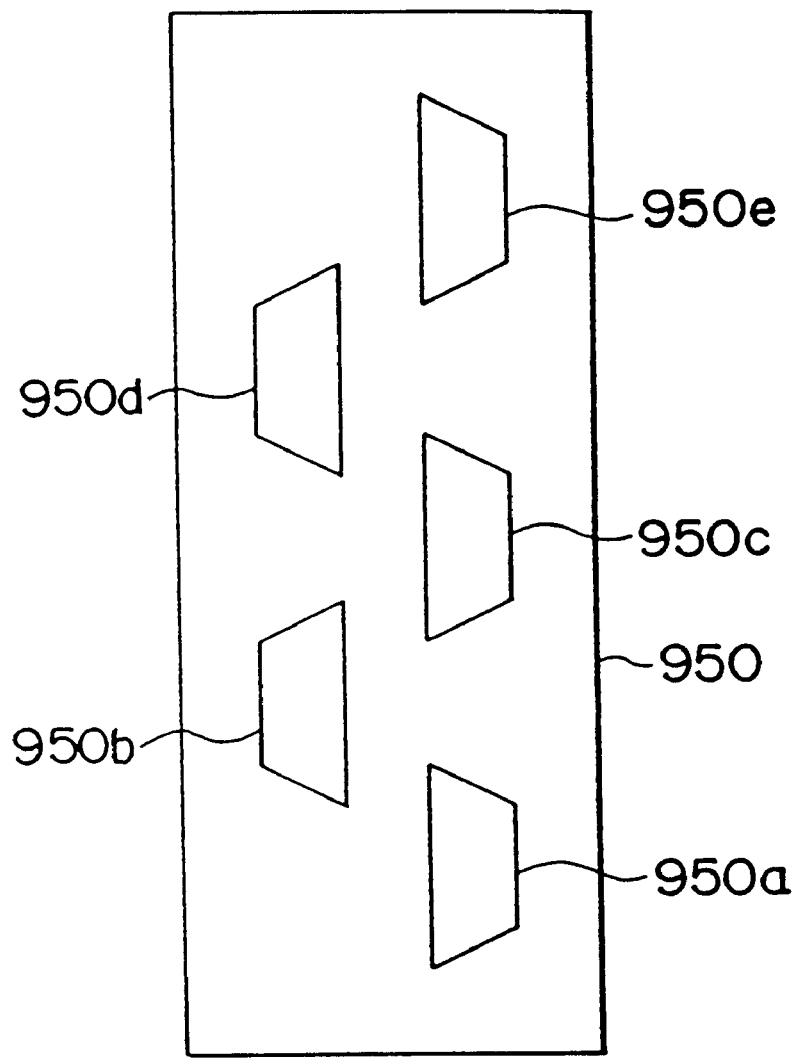
FIG. 64 is a drawing to show the modification of the field stop usable in the exposure apparatus shown in FIG. 58.

The embodiment shown in FIG. 59 has the field stops 95a–95e provided for the respective illumination optical systems ILa–ILe, but another arrangement may be employed, for example as shown in FIG. 64, with a single field stop 950 provided with aperture portions 950a–950e corresponding to the illumination optical systems ILa–ILe.

Meanwhile, the another embodiments are arranged under the assumption that illumination variations caused by the illumination optical systems and exposure variations caused by the projection optical systems are perfectly corrected. However, if there are, for example, fabrication errors etc. in the illumination optical systems, illumination variations appear on the mask 8, which could in turn cause exposure variations on the plate 9. Even if the illuminance distribution is perfectly uniform on the mask 8, but if there are, for example, fabrication errors etc. in the projection optical systems, exposure variations would occur on the plate 9.

Figure 65A:
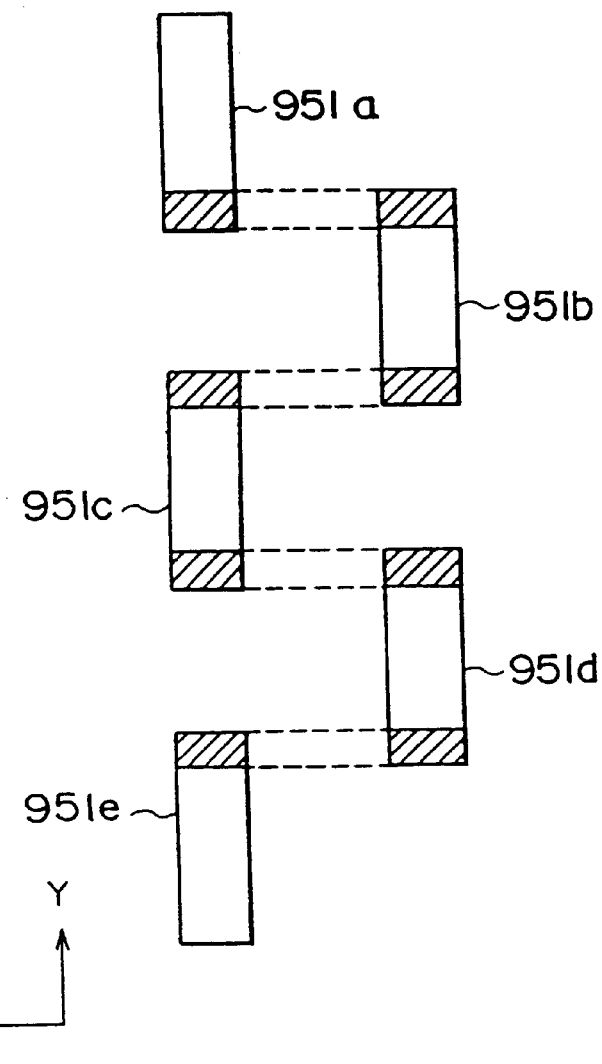
FIGS. 65A and 65B are drawings to show the modification of the field stop usable in the exposure apparatus shown in FIG. 58.
Figure 65B:
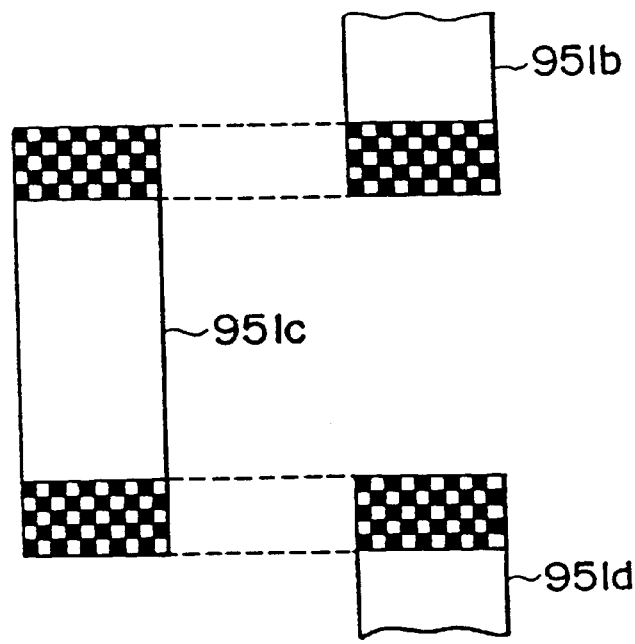

Next described referring to FIG. 65A and FIG. 65B is a technique for correcting the illumination variations or exposure variations. FIG. 65A is a plan view to show a field stop in illumination optical systems, and FIG. 65B is an enlarged drawing of the major part of FIG. 65A.

In FIG. 65A, the field stop has rectangular aperture portions 51a–51e the longitudinal direction of which is the direction perpendicular to the scanning direction (i.e., the Y direction), and checkered patterns, as shown in FIG. 65B, are given in overlapping regions in the Y direction between the aperture portions 951a–951e (overlap regions). Here, the field stop has, for example, such a structure that chromium patterns are vapor-deposited on a plane-parallel plate and the checkered patterns are also formed by vapor deposition of chromium patterns. The aperture portions 951a–951e are transparent portions.

For example, if there is a difference to illuminance on the mask 8 between the illumination optical system ILa having the aperture portion 951a in the field stop and the illumination optical system ILb having the aperture portion 951b in the field stop, the pitch of the checkered pattern in the overlap region of the aperture portion 951a may be changed from that in the overlap region of the aperture portion 951b so as to make the illuminance distribution continuous on the mask 8. By this, the exposure distribution can be made continuous on the plate 9.

If there is a difference in quantity of transmitted light between the projection optical system PLa and the projection optical system PLb, the pitch of the checkered pattern in the overlap region of the aperture portion 951a may be changed from the pitch of the checkered pattern in the overlap region of the aperture portion 951b so as to make the exposure distribution continuous on the plate 9. The checkered patterns do not have to be limited to only in the overlap regions, but such checkered patterns may be formed in regions other than the overlap regions so as to make the illuminance distribution on the mask 8 or the exposure distribution on the plate 9 continuously uniform.

Figure 66A:
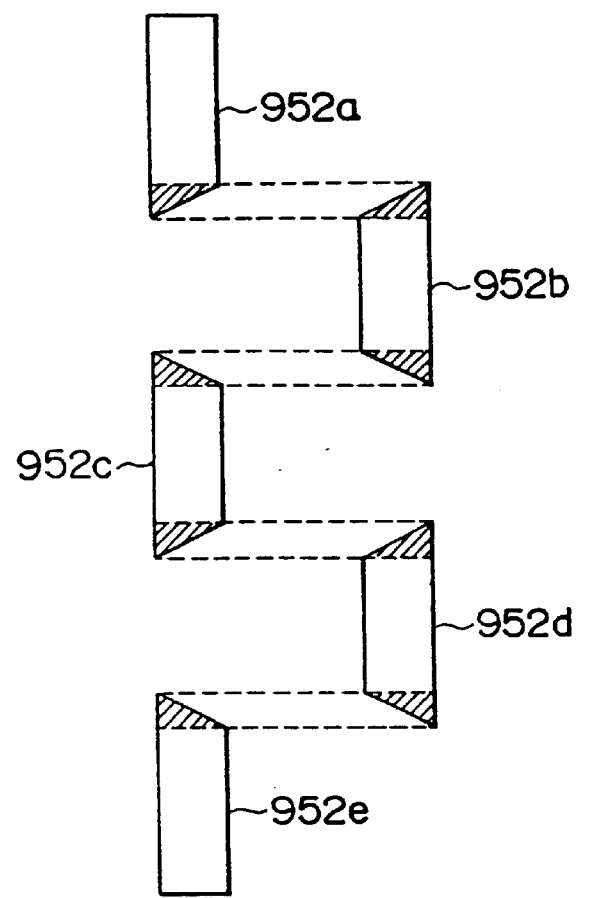
FIGS. 66A and 66B are drawings to show the modification of the field stop usable in the exposure apparatus shown in FIG. 58.
Figure 66B:
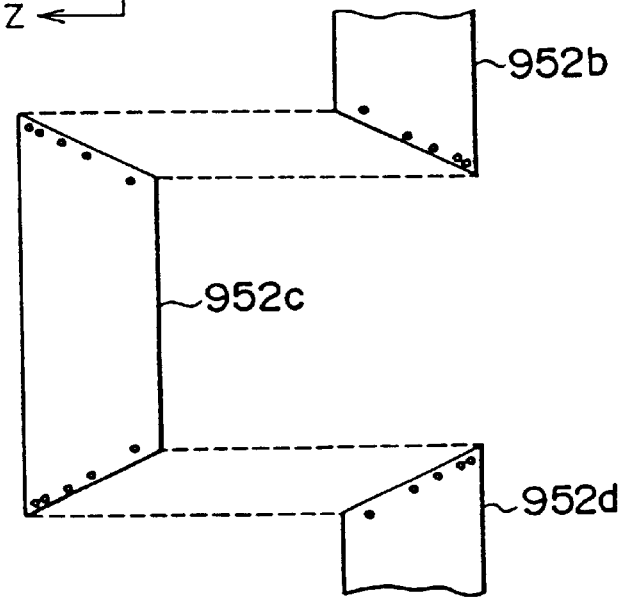

The checkered patterns as shown in FIGS. 65A and 65B may be replaced by dot patterns, for example as shown in FIGS. 66A and 66B. FIG. 66A shows a field stop having trapezoid aperture portions 952a–952e, and FIG. 66B is an enlarged drawing of the major part of the aperture portions. As shown in FIG. 66B, dot patterns of chromium are provided in the overlap regions in the trapezoid aperture portions 952a–952e. Here, the pitch, size, and location of each dot pattern are determined so as to make the illuminance distribution on the mask 8 or the exposure distribution on the plate 9 uniform and continuous.

By this, the exposure amount can be always kept constant on the plate 9 upon scanning exposure.

Instead of moving each illumination region by the illumination region moving means, an arrangement for attenuating a quantity of transmitted light may be employed for portions in the field stop corresponding to the overlap regions. In an example, the field stop is constructed by vapor-depositing chromium patterns on a plane-parallel plate, and dot chromium patterns are provided in the regions corresponding to the overlap regions.

The above-described embodiments employed the lens system having the front focal point at the ridgeline of the roof reflective member, as the projection optical system, but any optical system may be employed as long as it can obtain an erect image; for example, two Offner optical systems, two Dyson optical systems, or two refractive lens systems arranged in series.

Further, the relay lens system in the illumination optical system may be a combinational optical system of a lens system having a plane mirror at the front focal point thereof with a triangular mirror member, or a combinational optical system of an Offner or Dyson optical system with a trapezoid mirror member or right-angle prism.

Further, the another embodiment is provided with a plurality of illumination optical systems corresponding to the individual illumination regions MIa–MIe, but instead thereof, another arrangement may be such that for example, an optical fiber or half mirror is used to guide light from a light source or plural light sources to a plurality of illumination regions.

As described above, the another embodiment can provide the exposure apparatus that can well transfer the pattern of mask onto the substrate without causing a reduction of throughput and without causing exposure variations.

Since in the another embodiment first and second illumination regions can be moved on the mask by illumination region moving means, exposure energy onto the plate can be always kept constant, for example, even if there are assembling errors for a plurality of illumination optical systems.

It is preferred in the another embodiment that at least one of the first and second projection optical systems have the optical axis arranged as movable relative to the optical axis of the other projection optical system. This arrangement enables the pattern of mask always to be accurately transferred to a desired position on the substrate. Supposing the relation of optical axes on the mask side is not equal to the relation of optical axes on the substrate side in the first and second projection optical systems and even if the first and second illumination regions are adjusted by the illumination region moving means so that the widths in the scanning direction, of the illumination regions become always constant, positional relations in in-plane directions of mask would be disturbed for an image (first exposure region) of the first illumination region and an image (second exposure region) of the second illumination region formed on the substrate with respect to the first and second illumination regions, whereby the widths in the scanning direction, of the respective exposure regions are not always constant. In this case, exposure amounts are not constant on the substrate, and the linewidth of pattern transferred onto the substrate partially varies, which is not preferred.

Since the exposure apparatus according to the another embodiment can realize a large exposure area without increasing the exposure regions of individual projection optical systems, there is an advantage that the projection optical systems can be constructed in a small size, and the projection optical systems themselves can be easy to achieve high accuracy. Further, because the optical members composing the projection optical system are compact in the exposure apparatus according to the present invention, generation of absolute aberration amounts can be decreased, thus presenting an advantage that scanning exposure is realized under excellent optical performance.

In the above-mentioned embodiments, the deflection of the mask 8 and the plate 9 caused by the gravity becomes small by setting the Y direction in the vertical direction.

As described above, embodiments according to the present invention are advantageous in that a large screen can be exposed by single exposure without stitches in the screen and that a large exposure area can be scan-exposed by one operation without lowering the throughput and with excellent imaging performance. Also, the projection optical systems can be made compact in scale, so that high-accuracy projection optical systems can be readily fabricated.

Any embodiment as described above can be applied to any exposure apparatus described above. Further, the above described modification adjusting member such as prism 105, plane plate 102 etc. can be also applied to any embodiment of the projection optical system and the above-described illumination apparatus can be also applied to the exposure apparatus described above.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application Nos. 161588/1993 filed on Jun. 30, 1993; 345619/1993 filed on Dec. 22, 1993; 116800/1994 filed on May 30, 1994; 3123762/1994 filed on Jun. 6, 1994; 141326/1994 filed on Jun. 23, 1994; 177898/1994 filed on Jul. 29, 1994; and 200494/1994 filed on Aug. 25, 1994 are hereby incorporated by reference.

What is claimed is:

1. An illumination optical apparatus adapted to be used in an exposure apparatus for transferring a pattern on a first object onto a second object, comprising:
   at least one light source; and
   an illumination optical system arranged in an optical path between said at least one light source and said first-object, which guides a light from said at least one light source onto said first object, said illumination optical system forming a plurality of illumination regions on said first object, and positional relationships between said plurality of illumination regions being adjustable.

2. The illumination optical apparatus according to claim 1, further comprising a field stop defining said illumination regions.

3. The illumination optical apparatus according to claim 2, wherein positions of said illumination regions are changed by changing a position of image of said field stop.

4. The illumination optical apparatus according to claim 2, wherein positions of said illumination regions are changed by changing a position of said field stop.

5. An exposure apparatus which transfer a pattern on a first object onto a second object, comprising the illumination optical apparatus according to claim 1.

6. The exposure apparatus according to claim 5, wherein said pattern on said first object is transferred onto said second object during movement of said first and second objects.

7. The exposure apparatus according to claim 5, further comprising a plurality of projection optical systems arranged in an optical path between said first and second objects, which form an image of said first object onto said second object.

8. The exposure apparatus according to claim 7, wherein positions of said plurality of illumination regions are adjusted according to respective positions of fields of said plurality of projection optical systems.

9. A method of manufacturing an illumination optical apparatus adapted to be used in an exposure apparatus which transfers a pattern on a first object onto a second object, comprising:
   preparing at least one light source;
   preparing an illumination optical system which guides light from said at least one light source onto said first object in an optical path between said at least one light source and said first object, said illumination optical system forming a plurality of illumination regions on said first object; and
   adjusting positional relationships between said plurality of illumination regions.

10. An illumination optical apparatus manufactured by the method according to claim 9.

11. A method of manufacturing an exposure apparatus which transfers a pattern on a first object onto a second object, comprising preparing the illumination optical apparatus manufactured by a method according to claim 9.

12. The method according to claim 11, wherein in the adjusting of the positional relationships between said plurality of illumination regions, said illumination regions are adjusted so that an amount of exposure light onto said second object becomes even.

13. An exposure apparatus manufactured by the method according to claim 11.

14. A method of illuminating a mask on which a predetermined pattern is formed, comprising:
   preparing at least one light source;
   preparing an illumination optical system which guides light from said at least one light source onto said mask in an optical path between said at least one light source and said mask, said illumination optical system forming a plurality of illumination regions on said mask; and
   adjusting positional relationships between said plurality of illumination regions.

15. An exposure method of transferring a predetermined pattern on a mask onto a substrate, comprising:
   illuminating said mask by an illuminating method according to claim 14, and
   transferring the predetermined pattern on said mask onto said substrate.

16. The exposure method according to claim 15, wherein in the transferring step, said pattern on said mask is transferred onto said substrate while moving said mask and said substrate.

17. A device on which said pattern is transferred by the exposure method according to claim 15.

18. A field stop adapted to be used in an exposure apparatus which transfers a predetermined pattern on a mask on first and second transfer regions which are overlapped with each other at an overlap region, comprising:
   an aperture portion having first and second regions, said second region corresponding to said overlap region, transmittancy of said second region in said aperture portion being smaller than transmittancy of said first region.

19. The field stop according to claim 18, arranged in an illumination optical system of said exposure apparatus.

20. An exposure apparatus which transfers a predetermined pattern on a mask onto a substrate, comprising the field stop according to claim 18.

21. An exposure method of transferring a predetermined pattern on first and second transfer regions which are overlapped with each other at an overlap region of a mask onto a substrate, comprising:
   guiding light from a light source to a field stop that includes an aperture portion having first and second regions, said second region corresponding to said overlap region, transmittancy of said second region in said aperture portion being smaller than transmittancy of said first region.

22. A device on which a pattern is transferred by the exposure method according to claim 21.

23. An illumination optical apparatus adapted to be used in an exposure apparatus which transfers a pattern on a first object onto a second object, comprising:
   at least one light source; and
   an illumination optical system arranged in an optical path between said at least one light source and said first object, which guides light from said at least one light source on said first object, said illumination optical system forming a plurality of illumination regions on said first object, said plurality of illumination regions having polygon shapes with a longitudinal direction, and the plurality of illumination regions arranged in a direction that crosses a direction perpendicular to the longitudinal direction.

24. The illumination optical apparatus according to claim 23, wherein said illumination regions have rectangular shapes.

25. The illumination optical apparatus according to claim 23, wherein said illumination regions have trapezoidal shapes.

26. An exposure apparatus which transfers a pattern on a first object onto a second object, comprising:
   at least one light source; and
   an illumination optical system arranged in an optical path between the at least one light source and the first object, which guides light from the at least one light source on the first object, the illumination optical system forming a plurality of illumination regions on the first object, and the plurality of illumination regions having polygonal shapes wherein:
      the pattern on the first object is transferred onto the second object while moving the first and second objects along a scan direction, and
      the plurality of illumination regions are arranged in a direction that crosses the scan direction.

27. The exposure apparatus according to claim 26, wherein the illumination regions have a longitudinal direction that crosses the scan direction.

28. A method of illuminating a mask on which a predetermined pattern is formed, comprising:
   preparing at least one light source; and
   preparing an illumination optical system arranged in an optical path between said at least one light source and said mask, which guides light from said at least one light source on said mask, said illumination optical system forming a plurality of illumination regions on said mask, said plurality of illumination regions having polygon shapes with a longitudinal direction, and the plurality of illumination regions arranged in a direction that crosses a direction perpendicular to the longitudinal direction.

29. The illumination method according to claim 28, wherein said illumination regions have rectangular shapes.

30. The illumination method according to claim 28, wherein said illumination regions have trapezoidal shapes.

31. An exposure method of transferring a predetermined pattern on a mask onto a substrate, comprising:
   preparing at least one light source;
   preparing an illumination optical system arranged in an optical path between the at least one light source and the mask;
   illuminating said mask with the illumination optical system; and
   transferring a predetermined pattern on the mask onto the substrate while moving the mask and the substrate along a scan direction, wherein:
      the illumination optical system forms a plurality of illumination regions on the mask, and
      the plurality of illumination regions are arranged in a direction that crosses the scan direction.

32. The exposure method according to claim 31, wherein the illumination regions have a longitudinal direction that crosses the scan direction.

33. A device on which a pattern is transferred by the exposure method according to claim 31.

34. A projection exposure apparatus which transfers a pattern on a mask onto a substrate, comprising:
   an illumination optical system which is arranged in an optical path between a light source and the mask and which illuminates a rectangular illumination area on the mask;
   a projection optical system which is arranged in an optical path between the mask and the substrate and which forms an image of the pattern onto the substrate;
   a first stage which holds the mask; and
   a second stage which holds the substrate; wherein:
      the projection optical system has an optical axis,
      the illumination optical system forms the rectangular illumination area off the optical axis of the projection optical system,
      the pattern on the mask is transferred onto the substrate while moving the mask and the substrate along a moving direction, and
      a longitudinal direction of the rectangular illumination area intersects the moving direction.

35. A projection exposure apparatus according to claim 34, wherein the illumination optical system has an illumination field stop with a rectangular shaped aperture.

36. A projection exposure apparatus according to claim 35, wherein the illumination optical system further comprises a relay optical system arranged in an optical path between the illumination field stop and the mask, and wherein the illumination field stop and the mask are conjugate with regard to the relay optical system.

37. A projection exposure apparatus according to claim 35, wherein the illumination optical system has a deflecting mirror arranged in an optical path between the illumination field stop and the mask.

38. A projection exposure apparatus according to claim 37, wherein the projection optical system has a concave mirror, a lens and a deflecting mirror.

39. A projection exposure apparatus according to claim 35, wherein the projection optical system has a concave mirror, a lens and a deflecting mirror.

40. A projection exposure apparatus according to claim 34, wherein the projection optical system has a field area within a part of a circle.

41. A projection exposure apparatus according to claim 34, wherein the projection optical system has a concave mirror, a lens and a deflecting mirror.

42. A projection exposure apparatus according to claim 34, wherein the projection optical system has a unit magnification.

43. A method of transferring a pattern on a mask onto a substrate, comprising the steps of:
providing an illumination optical system in an optical path between a light source and the mask;
providing a projection optical system in an optical path between the mask and the substrate;
illuminating a rectangular illumination area on the mask; and
projecting an image of the pattern onto the substrate, wherein:
the projection optical system has an optical axis,
the illumination optical system forms the rectangular illumination area off the optical axis of the projection optical system,
the pattern on the mask is transferred onto the substrate while moving the mask and the substrate along a moving direction, and
a longitudinal direction of the rectangular illumination area intersects the moving direction.

44. A method according to claim 43, wherein the illumination optical system has an illumination field stop with a rectangular shaped aperture.

45. A method according to claim 44, wherein the illumination optical system further comprises a relay optical system arranged in an optical path between the illumination field stop and the mask, and wherein the illumination field stop and the mask are conjugate with regard to the realy optical system.

46. A method according to claim 44, wherein the illumination optical system has a deflecting mirror arranged in an optical path between the illumination field stop and the mask.

47. A method according to claim 46, wherein the projection optical system has a concave mirror, a lens and a deflecting mirror.

48. A method according to claim 44, wherein the projection optical system has a concave mirror, a lens and a deflecting mirror.

49. A method according to claim 43, wherein the projection optical system has a concave mirror, a lens and a deflecting mirror.

50. A method according to claim 49, wherein the projection optical system has a field area within a part of a circle.

51. A method according to claim 43, wherein the projection optical system has a unit magnification.

52. A projection exposure apparatus which transfers a pattern on a mask onto a substrate, comprising:
an illumination optical system which is arranged in an optical path between a light source and the mask and which illuminates a rectangular illumination area on the mask;
a projection optical system which is arranged in an optical path between the mask and the substrate and which forms an image of the pattern onto the substrate;
a first stage which holds the mask; and
a second stage which holds the substrate; wherein:
the illumination optical system forms the rectangular illumination are on the mask;
the pattern on the mask is transferred onto the substrate while moving the mask and the substrate along a moving direction, and
a longitudinal direction of the rectangular illumination area intersects the moving direction,
the illumination optical system including an optical member having a transmittancy distribution which changes along at least one of a direction intersecting the moving direction and a direction corresponding to the longitudinal direction.

53. The projection exposure apparatus according to claim 52, wherein the optical member includes a pattern on a plane-parallel plate.

54. The projection exposure apparatus according to claim 53, wherien the pattern on the plane-parallel plate is a checkered pattern.

55. The projection exposure apparatus according to claim 53, wherein the pattern on the plane-parallel plate includes a dot.

56. The projection exposure apparatus according to claim 52, wherein the optical member is movable in a direction that crosses an optical axis of the illumination optical system.

57. The projection exposure apparatus according to claim 56, wherein the optical member is rotatable about the optical axis of the illumination optical system.

58. The exposure apparatus according to claim 57, wherein the optical member includes a pattern on a plane-parallel plate.

59. The projection exposure apparatus according to claim 52, wherein the optical member is rotatable about an optical axis of the illumination optical system.

60. A method of transferring a pattern on a mask onto a substrate, comprising the steps of:
providing an illumination optical system in an optical path between a light source and the mask;
providing a projection optical system in an optical path between the mask and the substrate;
illuminating a rectangular illumination area on the mask; and
projecting an image of the pattern onto the substrate, wherein:
the illumination optical system forms the rectangular illumination area on the mask,
the pattern on the mask is transferred onto the substrate while moving the mask and the substrate along a moving direction, and
a longitudinal direction of the rectangular illumination area intersects the moving direction,
the illumination optical system including an optical member having a transmittancy distribution which changes along at least one of a direction intersecting the moving direction and a direction corresponding to the longitudinal direction.

61. The exposure method according to claim 60, wherein the optical member includes a pattern on a plane-parallel plate.

62. The exposure method according to claim 61, wherein the pattern on the plane-parallel plate is a checkered pattern.

63. The exposure method according to claim 61, wherein the pattern on the plane-parallel plate includes a dot.

64. The exposure method according to claim 60, wherein the optical member is movable in a direction that crosses an optical axis of the illumination optical system.

65. The exposure method according to claim 64, wherein the optical member is rotatable about the optical axis of the illumination optical system.

66. The exposure method according to claim 65, wherein the optical member includes a pattern on a plane-parallel plate.

67. The exposure method according to claim 60, wherein the optical member is rotatable about an optical axis of the illumination optical system.

* * * * *